(12) United States Patent
Kira et al.

(10) Patent No.: US 6,885,522 B1
(45) Date of Patent: Apr. 26, 2005

(54) HEAD ASSEMBLY HAVING INTEGRATED CIRCUIT CHIP COVERED BY LAYER WHICH PREVENTS FOREIGN PARTICLE GENERATION

(75) Inventors: Hidehiko Kira, Kawasaki (JP); Shunji Baba, Kawasaki (JP); Norio Kainuma, Kawasaki (JP); Toru Okada, Kawasaki (JP); Takatoyo Yamakami, Kawasaki (JP); Yasunori Sasaki, Kawasaki (JP); Takeshi Komiyama, Kawasaki (JP); Kenji Kobae, Kawasaki (JP); Hiroshi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/548,313

(22) Filed: Apr. 12, 2000

(30) Foreign Application Priority Data

May 28, 1999 (JP) .......................................... 11-150599
Oct. 26, 1999 (JP) .......................................... 11-304629
Dec. 22, 1999 (JP) .......................................... 11-365546

(51) Int. Cl.$^7$ ................................................ G11B 5/48
(52) U.S. Cl. ................................................ 360/244.1
(58) Field of Search .......................... 360/244.1, 244.3, 360/245.8, 245.9

(56) References Cited

U.S. PATENT DOCUMENTS 4,172,907 A * 10/1979 Mones et al. ............... 438/759
5,274,913 A * 1/1994 Grebe et al.
5,936,304 A * 8/1999 Lii et al.
6,084,746 A * 7/2000 Shiraishi et al.
6,282,062 B1 * 8/2001 Shiraishi .................. 360/244.1
6,437,944 B1 * 8/2002 Ohwe et al. ............. 360/244.1

FOREIGN PATENT DOCUMENTS

| JP | 57-57556 | | 4/1982 |
| JP | 59-208844 | | 11/1984 |
| JP | 61-104313 | * | 5/1986 |
| JP | 61-216436 | | 9/1986 |
| JP | 63-173092 | | 7/1988 |
| JP | 02-105405 | | 4/1990 |
| JP | 02-105446 | | 4/1990 |
| JP | 03-187242 | | 8/1991 |
| JP | 04-024950 | | 1/1992 |
| JP | 04-047511 | * | 2/1992 |
| JP | 04-260358 | | 9/1992 |
| JP | 10-293915 | * | 11/1998 |

* cited by examiner

Primary Examiner—Craig A. Renner
(74) Attorney, Agent, or Firm—Armstrong, Kratz, Quintos, Hanson & Brooks, LLP

(57) ABSTRACT

A head assembly is provided with a mounting surface, and an integrated circuit chip which is mounted on the mounting surface and processes signals. The integrated circuit chip is covered by a layer which prevents generation of foreign particles from the integrated circuit chip by the provision of the layer.

12 Claims, 58 Drawing Sheets

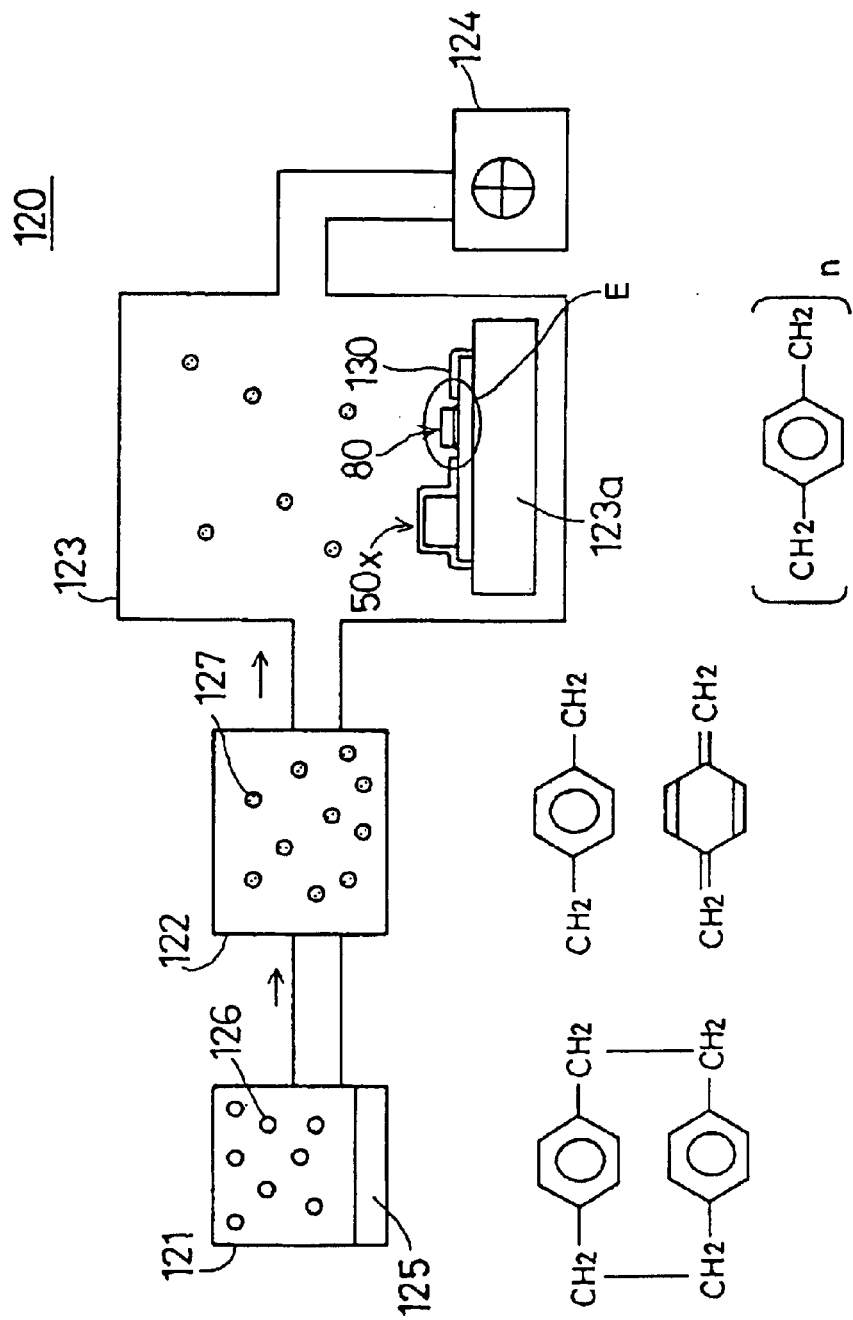

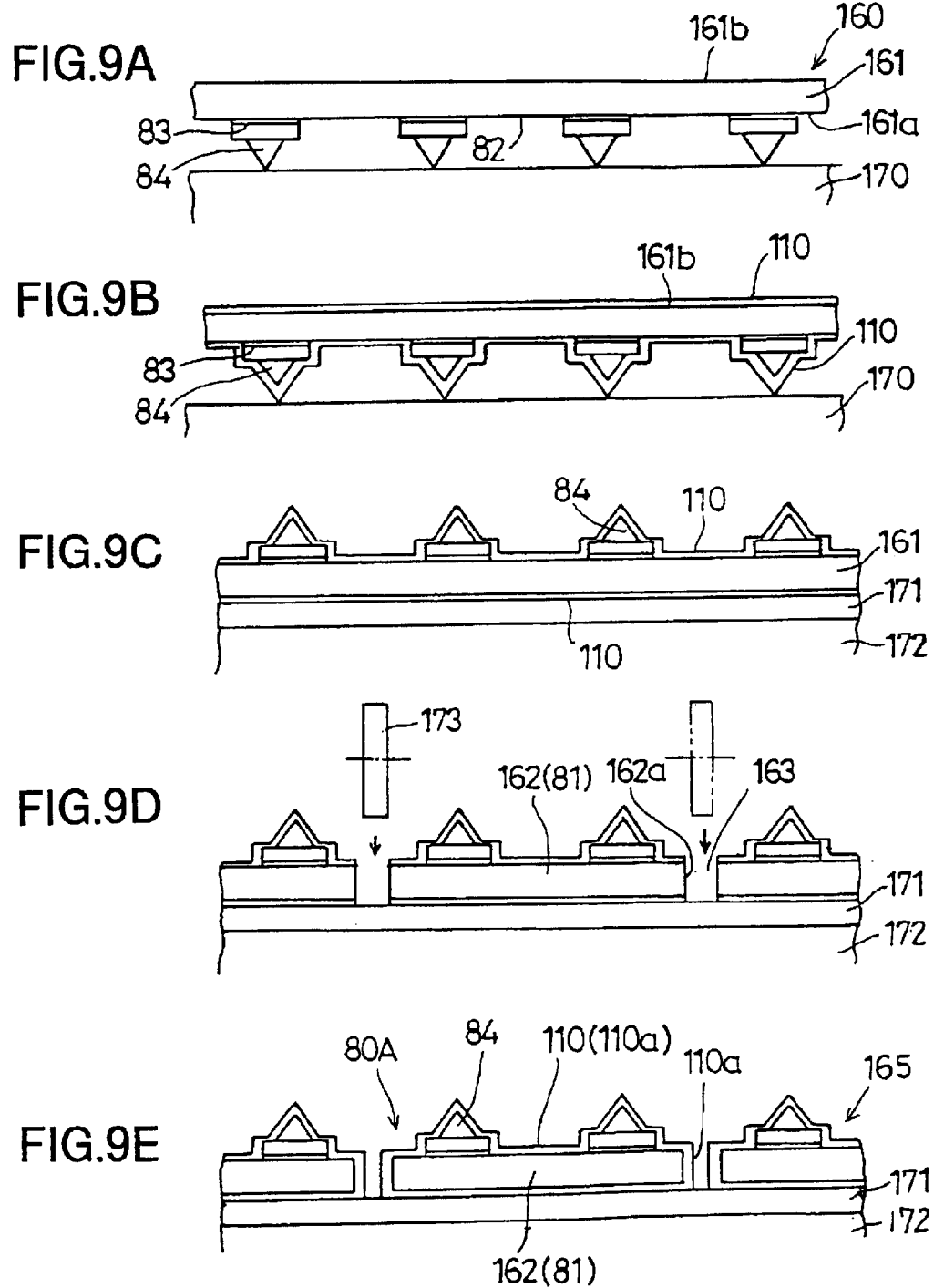

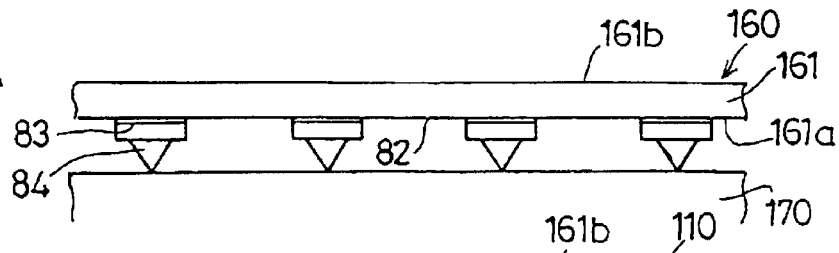
FIG.10A
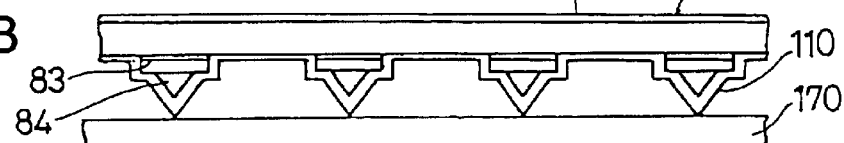
FIG.10B
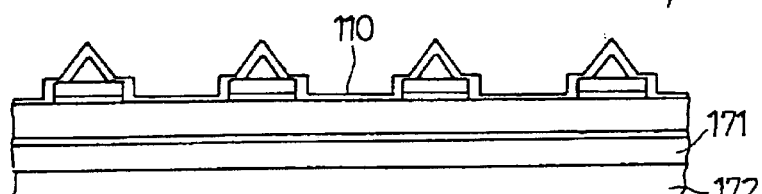
FIG.10C
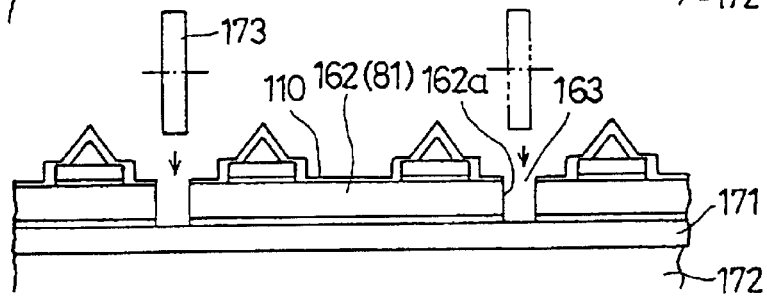
FIG.10D
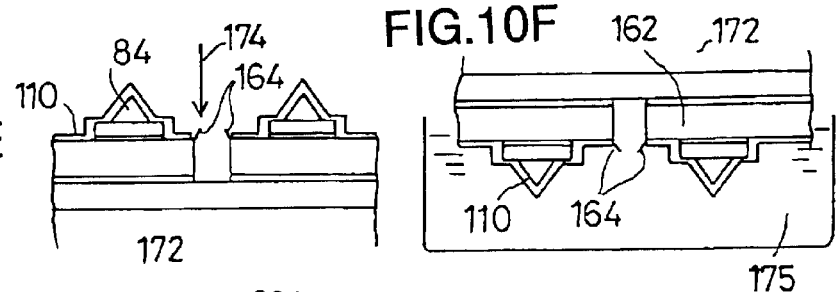
FIG.10E
FIG.10F
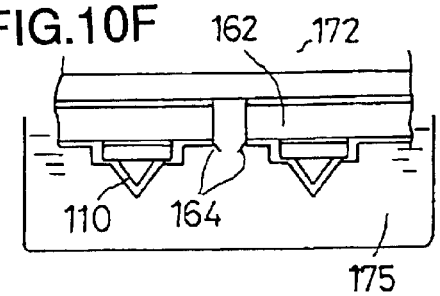
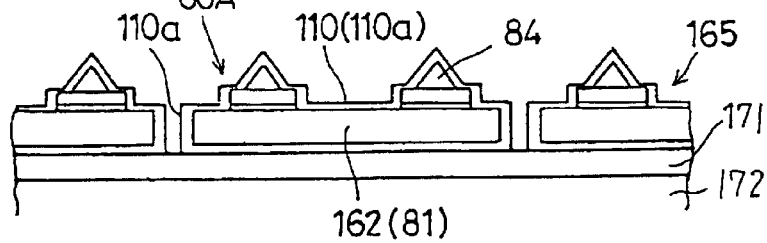
FIG.10G FIG.11A
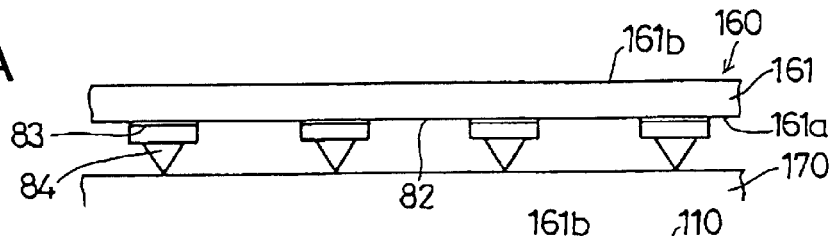
FIG.11B
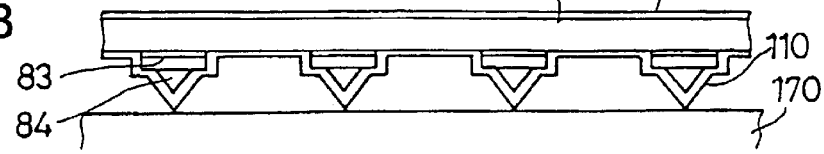
FIG.11C
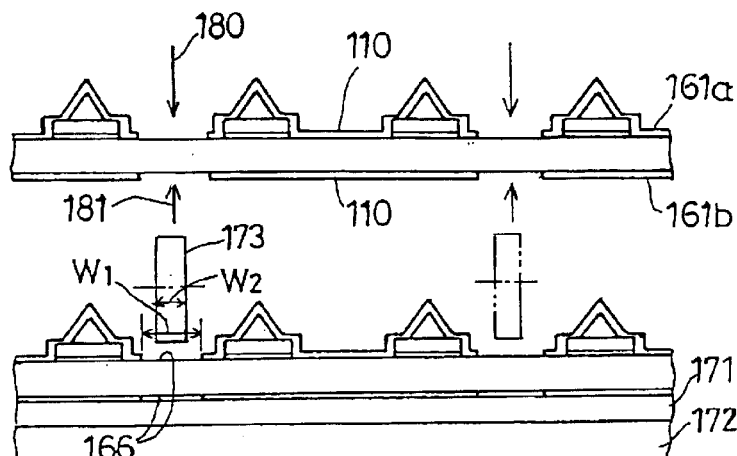
FIG.11D
FIG.11E
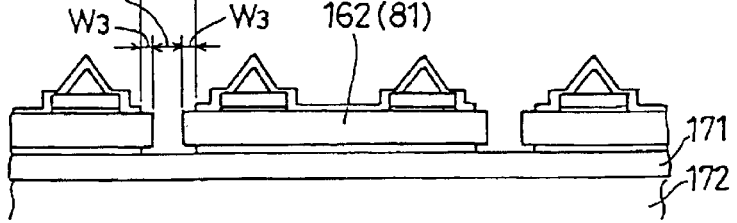
FIG.11F
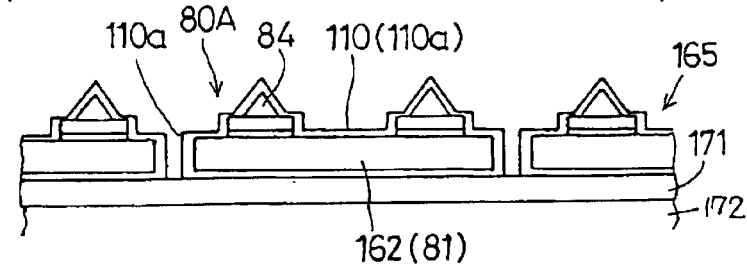

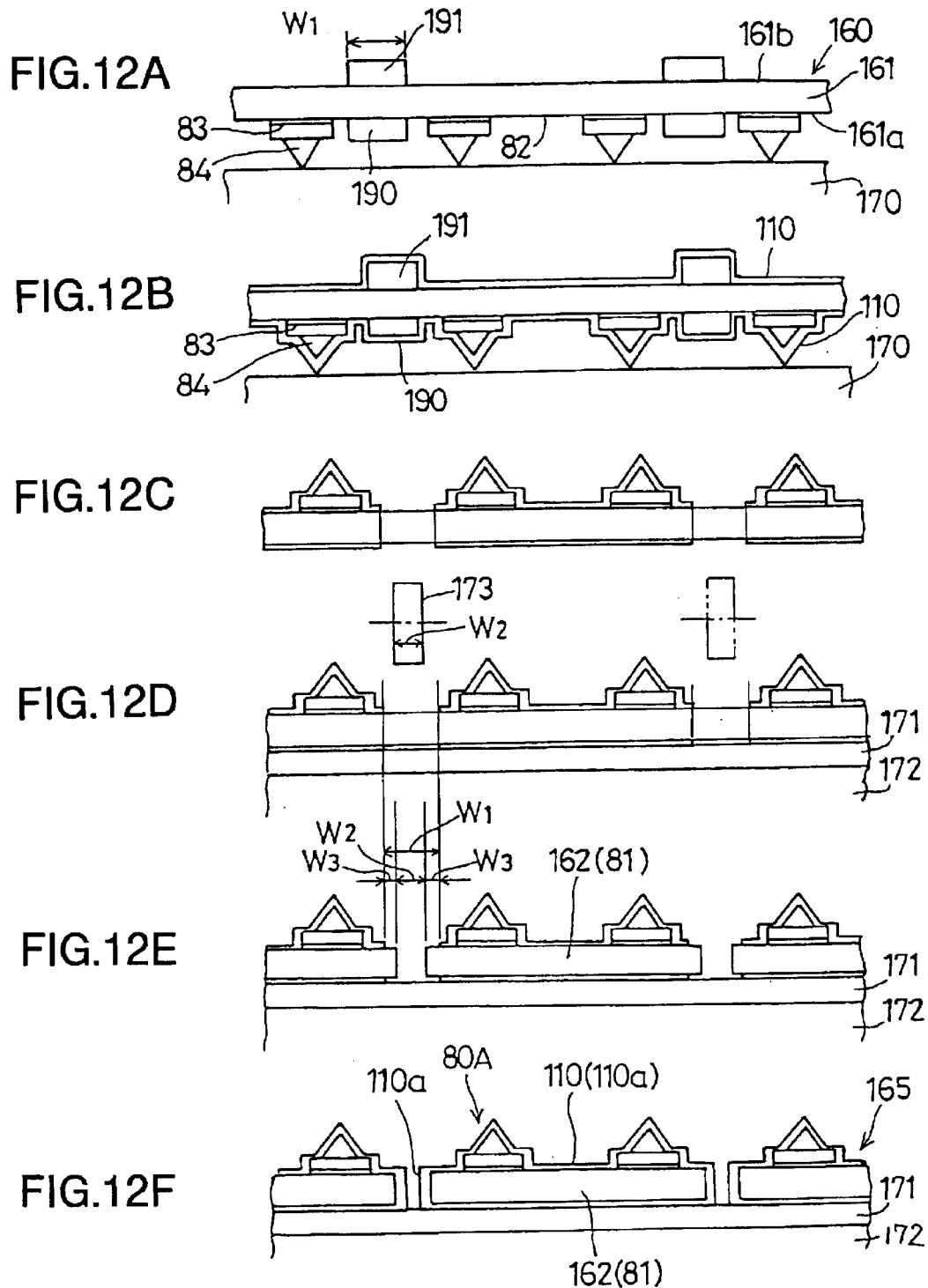

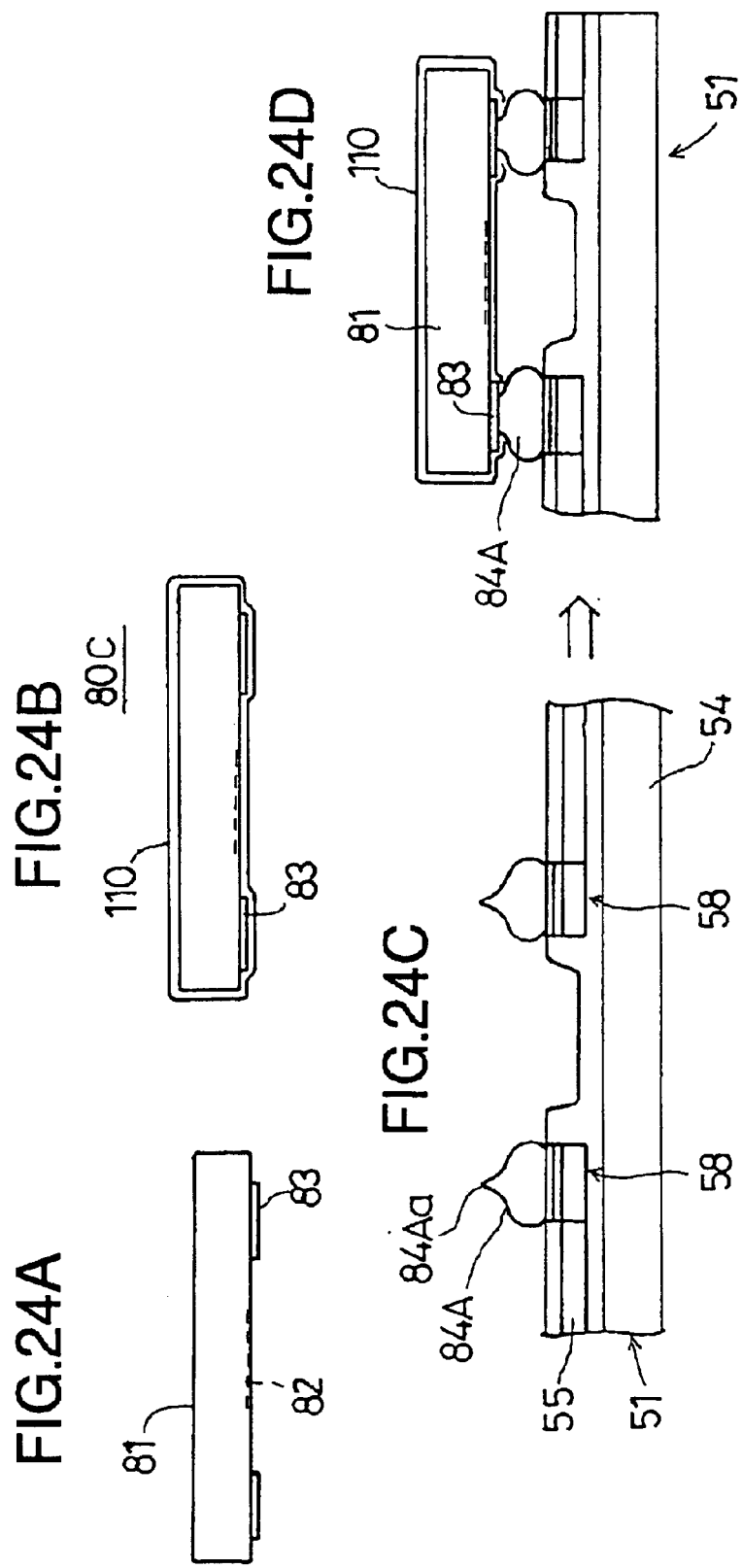

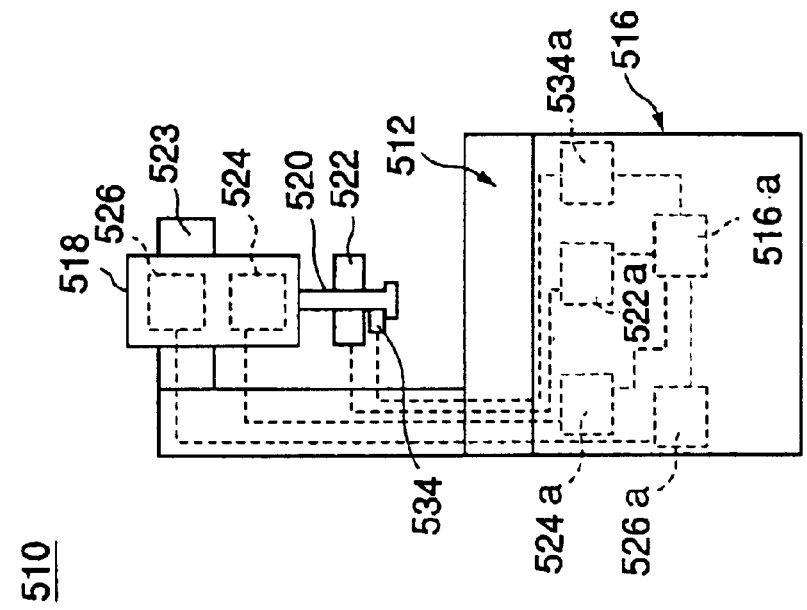
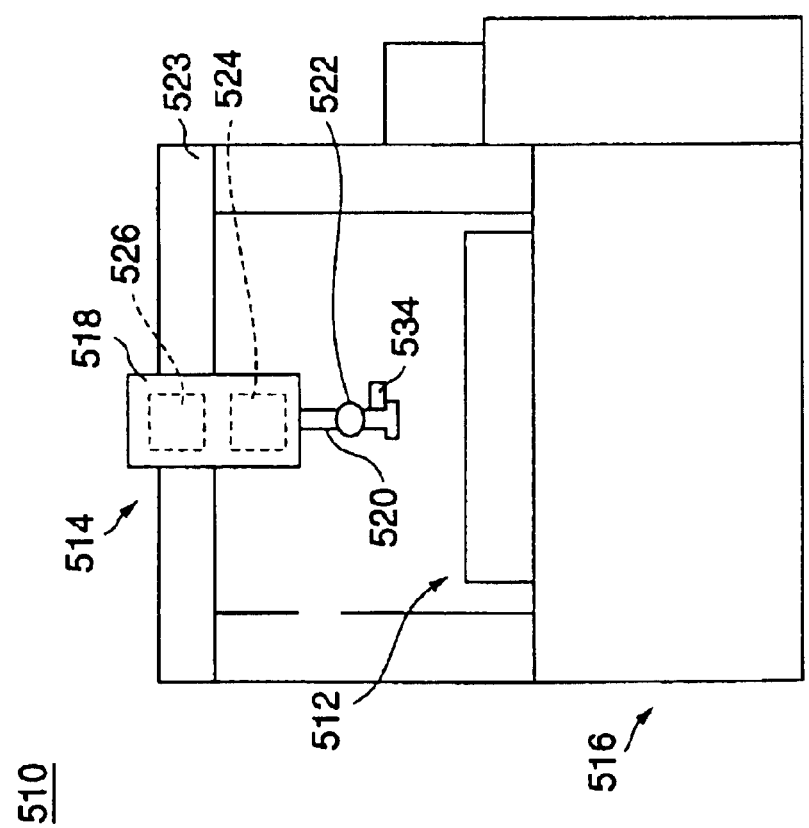

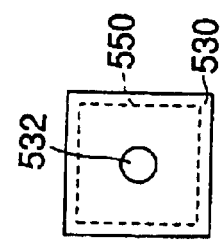
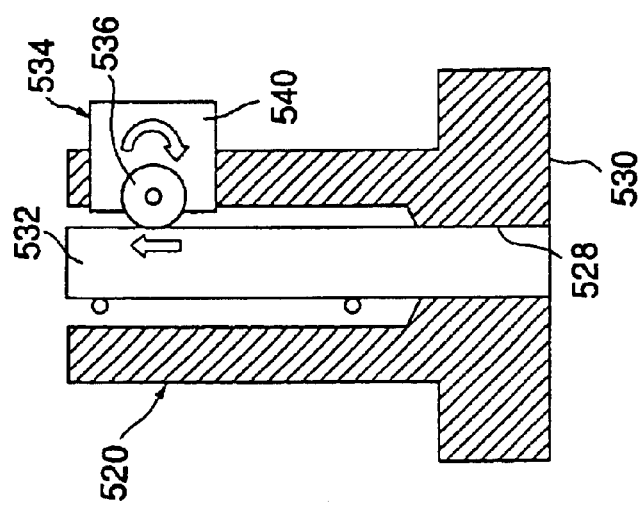
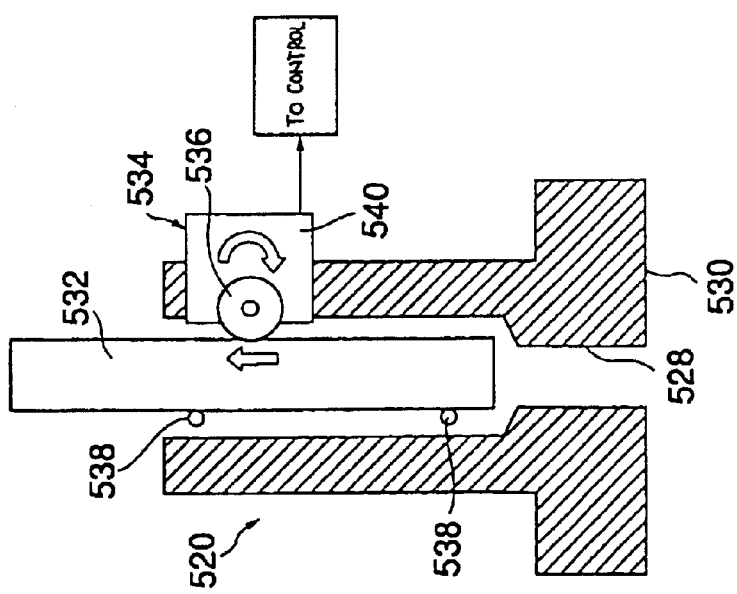

HEAD ASSEMBLY HAVING INTEGRATED CIRCUIT CHIP COVERED BY LAYER WHICH PREVENTS FOREIGN PARTICLE GENERATION

BACKGROUND OF THE INVENTION

1. Field of the Invention

The present invention generally relates to head assemblies, disk units, and bonding methods and apparatuses, and more particularly to a head assembly which is provided with a so-called head IC (Integrated Circuit) chip, a disk unit which uses such a head assembly, and a bonding method and a bonding apparatus which are suited for producing the head assembly and the disk unit. The present invention also relates to semiconductor parts suited for use in head assemblies, and methods of producing such semiconductor parts.

A hard disk unit is made up of a housing which has a sealed structure. The inside of the housing generally includes a hard disk which rotates at a high speed, and a head assembly which is provided on a tip end of an arm which is driven by an actuator. The head assembly has a head slider and a head IC chip which are mounted on a suspension. The head slider includes a magnetic head which is formed by the thin film technology. The magnetic head includes an inductive head and a magneto-resistive head. The head slider floats from the hard disk which rotates at the high speed, by a distance of the sub-$\mu$m order. The inductive head is used to write information on the hard disk, and the magneto-resistive head is used to read the information recorded on the hard disk. The head IC chip has functions of processing inputs and/or outputs of the magnetic head, such as amplifying a weak signal which is read by the magneto-resistive head.

Because the head slider floats from the hard disk which rotates at the high speed by a distance of the sub-$\mu$m order, it is desirable to prevent foreign particles such as dust particles and the like from adhering to the hard disk and the head slider, since the foreign particles will cause the so-called head crash.

Therefore, there are demands to make the head assembly have a structure that will not easily generate foreign particles.

2. Description of the Related Art

FIG. 1A is a perspective view showing a conventional head assembly, and FIG. 1B is a cross sectional view showing an encircled part A of the head assembly shown in FIG. 1A.

In a head assembly 10 shown in FIG. 1A, a head slider 20 is mounted on a gimbal part 12 which is provided on a tip end of a suspension 11. As shown in FIG. 1B, a head IC chip 30 is mounted face-dawn in a head IC chip mounting part 15 which is located at a central part of the suspension 11. The head IC chip 30 is a bare chip, such that a main chip body 31 which is made of silicon is exposed.

Materials such as silicon and GaAs which are generally used for a base substrate of the head IC chip 30 are fragile and easily crack or chip, because such materials have crystal orientation and have a high elasticity modulus which makes such materials hard. Accordingly, the chip generates the foreign particles (or powder) when an external force is applied thereon, such as when dicing the wafer to the chip size, when handling the chip to mount the chip, and due to ultrasonic bonding stress generated when mounting the chip.

Even if the head IC 30 is cleaned at a latter process, it is still impossible to remove extremely small foreign particles on the order of 1 $\mu$m or less, for example. In addition, additional foreign particles may be generated during the cleaning process.

Therefore, when the residual foreign particles scatter from the head IC chip 30 due to vibration or air flow caused by the operation of the disk unit, the foreign particles may cause the head crash, thereby deteriorating the reliability of the disk unit.

SUMMARY OF THE INVENTION

Accordingly, it is a general object of the present invention to provide a novel and useful head assembly, disk unit, and bonding method and apparatus, in which the problems described above are eliminated.

Another and more specific object of the present invention is to provide a head assembly comprising a mounting surface, and an integrated circuit chip which is mounted on the mounting surface and processes signals, where the integrated circuit chip is covered by a layer. According to the head assembly of the present invention, it is possible to prevent generation of foreign particles from the integrated circuit chip by the provision of the layer.

Still another object of the present invention is to provide a disk unit for reading information from and writing information to a disk, comprising a head assembly having a mounting surface, a head mounted on the mounting surface, and an integrated circuit chip which is mounted on the mounting surface and processes information read from and/or written to the disk via the head, where the integrated circuit chip is covered by a layer. According to the disk unit of the present invention, it is possible to prevent the so-called head crash, because the layer prevents generation of foreign particles from the integrated circuit chip.

A further object of the present invention is to provide a semiconductor part comprising a main chip body, and a covering layer formed by evaporation and covering the main chip body. According to the semiconductor part of the present invention, it is possible to prevent generation of foreign particles from the integrated circuit chip by the provision of the covering layer.

Another object of the present invention is to provide a method of producing an integrated circuit chip which is mounted on and forms a part of a head assembly, comprising the steps of (a) forming a first layer on first and second surfaces of a wafer which has conductor bumps formed on one of the first and second surfaces located at opposite sides of the wafer, (b) dicing the wafer having the first layer into a plurality of chips, and (c) forming a second layer on peripheral side surfaces of each of the diced chips. According to the method of the present invention, it is possible to produce the semiconductor part having the first and second layers with a good productivity.

Still another object of the present invention is to provide a method of producing an integrated circuit chip which is mounted on and forms a part of a head assembly, comprising the steps of (a) forming a first layer on a first surface of a wafer which has conductor bumps formed on a second surface of the wafer located at an opposite side from the first surface, (b) dicing the wafer having the first layer into a plurality of chips in a state where the wafer is adhered on a film, without cutting the film, (c) separating the film from only peripheral portions of each of the diced chips, and (d) forming a second layer on each of the chips in a state where the peripheral portions of the diced chips are separated from the film. According to the method of the present invention, it is possible to produce the semiconductor part having no second layer formed on the central portion of the chip with a good productivity.

A further object of the present invention is to provide a method of producing an integrated circuit chip which is mounted on and forms a part of a head assembly, comprising the steps of (a) adhering a film on a surface of a wafer which has conductor bumps formed thereon, so as to surround portions on the surface of the wafer, including the conductor bumps, which later become chips by a waved shape of the film, (b) dicing the wafer having the film into a plurality of chips, and (c) forming a layer on each of the diced chips. According to the method of the present invention, it is possible to produce the chip having the layer formed on the upper and peripheral side surfaces thereof.

Another object of the present invention is to provide a method of producing an integrated circuit chip which is mounted on and forms a part of a head assembly, the integrated circuit chip having a main chip body and a layer covering the main chip body, the method comprising the steps of (a) supplying a predetermined amount of resin which has a surface tension smaller than a wetting with respect to the main chip body from a nozzle onto an upper surface of the main chip body, the predetermined amount being larger than an amount of the resin required to form the layer, (b) moving the nozzle near the upper surface of the main chip body to a height corresponding to a thickness of the layer which is to be formed, and (c) sucking resin by a suction force smaller than the wetting with respect to the main chip body, so as to remove excess resin, to thereby form the layer which covers the main chip body. According to the method of the present invention, it is possible to efficiently produce the chip which is covered by the layer having a desired thickness.

Still another object of the present invention is to provide a method of producing an integrated circuit chip which is mounted on and forms a part of a head assembly, the integrated circuit chip having a main chip body, conductor bumps and a layer covering the main chip body, the method comprising the steps of (a) forming the layer on the main chip body and the conductor bumps by evaporation, in a state before crushing pointed tip ends of the conductor bumps, (b) pushing the conductor bumps against a surface to simultaneously crush the pointed tip ends of the conductor bumps and make the layer covering the pointed tip ends to recede, to thereby expose surfaces at the crushed portions of the conductor bumps. According to the method of the present invention, it is possible to produce the chip having bumps with exposed tip ends not covered by the layer which covers the chip.

A further object of the present invention is to provide a method of producing an integrated circuit chip which is mounted on and forms a part of a head assembly, the integrated circuit chip having a main chip body, conductor bumps and a layer covering the main chip body, the method comprising the steps of (a) adhering a mold release agent on tip ends of the conductor bumps, (b) forming the layer on the entire main chip body including the conductor bumps by evaporation, and (c) removing portions of the layer on the tip ends of the conductor bumps having the mold release agent interposed therebetween, to thereby expose surfaces of the tip ends of the conductor bumps. According to the method of the present invention, it is possible to produce the chip having bumps with exposed tip ends not covered by the layer which covers the chip.

Another object of the present invention is to provide a bonding apparatus for bonding conductor bumps on a semiconductor chip onto corresponding pads on a substrate by ultrasonic vibration, comprising a stage having a receiving surface for receiving a first surface of the substrate opposite to a second surface of the substrate provided with the pads, and a bonding unit having an end surface for holding a first surface of the semiconductor chip opposite to a second surface of the semiconductor chip provided with the conductor bumps, and a closing member having a closing surface, where the end surface adheres the first surface of the semiconductor chip by suction via a suction hole which opens at the end surface, and the closing member is movable to close the suction hole at the end surface, so that the closing surface and the end surface form a single flat surface. According to the bonding apparatus of the present invention, it is possible to positively prevent a damage to the first surface of the semiconductor chip when the semiconductor chip is handled.

Still another object of the present invention is to provide a bonding method for bonding conductor bumps on a semiconductor chip onto corresponding pads on a substrate by ultrasonic vibration, comprising the steps of (a) placing the substrate on a stage having a receiving surface for receiving a first surface of the substrate opposite to a second surface of the substrate provided with the pads, (b) holding and transporting the semiconductor chip to a bonding position above the stage by a bonding unit, the bonding unit having an end surface for holding a first surface of the semiconductor chip opposite to a second surface of the semiconductor chip provided with the conductor bumps by suction via a suction hole which opens at the end surface, and having a movable closing member having a closing surface which forms a single flat surface together with the end surface when the closing member is moved to close the suction hole at the end surface, (c) pressing the semiconductor chip against the substrate by the end surface in a state where the suction hole at the end surface is closed by the closing member, and (d) bonding the conductor pads to the corresponding pads by ultrasonic vibration. According to the bonding method of the present invention, it is possible to positively prevent a damage to the first surface of the semiconductor chip when the semiconductor chip is handled.

Other objects and further features of the present invention will be apparent from the following detailed description when read in conjunction with the accompanying drawings.

BRIEF DESCRIPTION OF THE DRAWINGS

FIG. 6A is a diagram showing an apparatus for forming a poly(p-xylylene) layer;

FIGS. 9A through 9E are cross sectional views for explaining a first method of producing the head IC chip of the second embodiment;

FIGS. 10A through 10G are cross sectional views for explaining a second method of producing the head IC chip of the second embodiment;

FIGS. 11A through 11F are cross sectional views for explaining a third method of producing the head IC chip of the second embodiment;

FIGS. 12A through 12F are cross sectional views for explaining a fourth method of producing the head IC chip of the second embodiment;

FIGS. 24A through 24D are cross sectional view for explaining another method of producing a head assembly shown in FIG. 7A;

FIGS. 39A and 39B respectively are a front view and a side view showing a first embodiment of a bonding apparatus according to the present invention;

FIGS. 40A, 40B and 40C respectively are diagrams for explaining the operation of a closing member of the first embodiment of the bonding apparatus;

DESCRIPTION OF THE PREFERRED EMBODIMENTS

[First Embodiment]

Figure 2A:
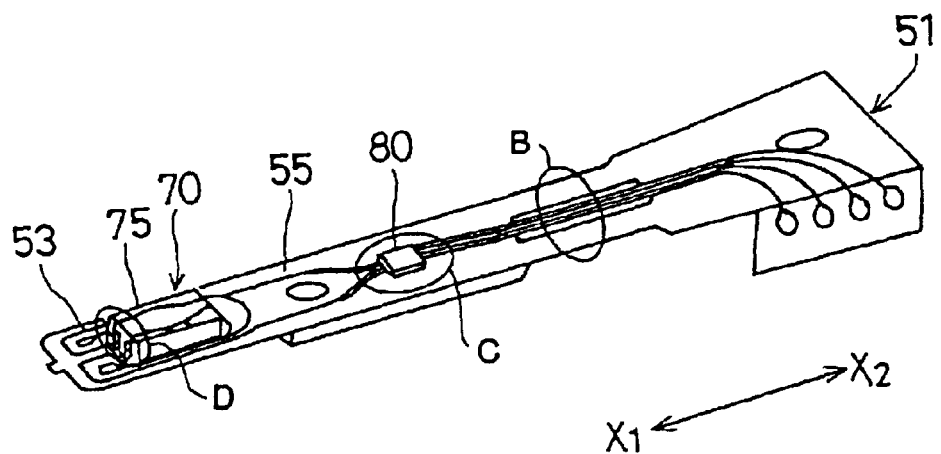
FIG. 2A is a perspective view showing a first embodiment of a head assembly according to the present invention.
Figure 2B:
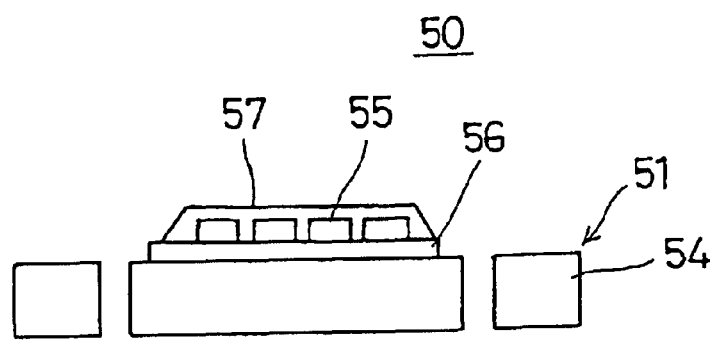
FIG. 2B is a cross sectional view showing an encircled part B of the head assembly shown in FIG. 2A.

FIG. 2A is a perspective view showing a first embodiment of a head assembly according to the present invention. FIGS. 2B is a cross sectional view showing an encircled part B of the head assembly shown in FIG. 2A, FIG. 2C is a perspective view showing an encircled part C of the head assembly shown in FIG. 2A, and FIG. 2D is a cross sectional view showing an encircled part D of the head assembly shown in FIG. 2A.

As shown in FIGS. 2A through 2D, a head assembly 50 includes a head slider 70 which is mounted on a gimbal 52. This gimbal 52 is provided on a tip end of a suspension 51 along a direction X1. A head IC chip mounting part 53 is provided at a central part of the suspension 51, and a bear head IC chip 80 is mounted face-down in the head IC chip mounting part 53. In addition, the bear head IC chip 80 is covered by a polymer poly(p-xylylene) evaporated layer 110 which is formed by evaporation. The head IC chip 80 is bear because there is a limit to a projecting height from the suspension 51.

As shown in FIG. 2B, the suspension 51 has a plurality of Cu wiring patterns 55 formed on a top surface of an extremely thin stainless steel plate 54. The wiring patterns 55 are formed on a polyimide layer 56 which is provided as an insulator layer covering the stainless steel plate 54. The wiring patterns 55 are covered and protected by a polyimide layer 57 which is provided as an insulator layer.

Figure 2C:
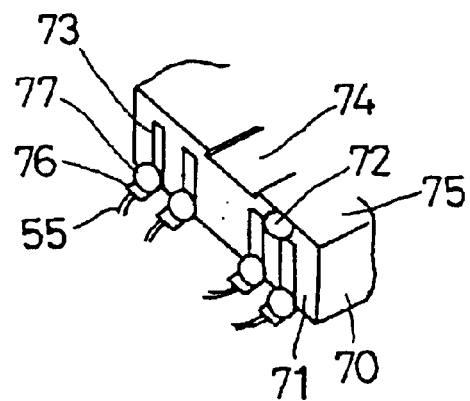
FIG. 2C is a perspective view showing an encircled part C of the head assembly shown in FIG. 2A.
Figure 2D:
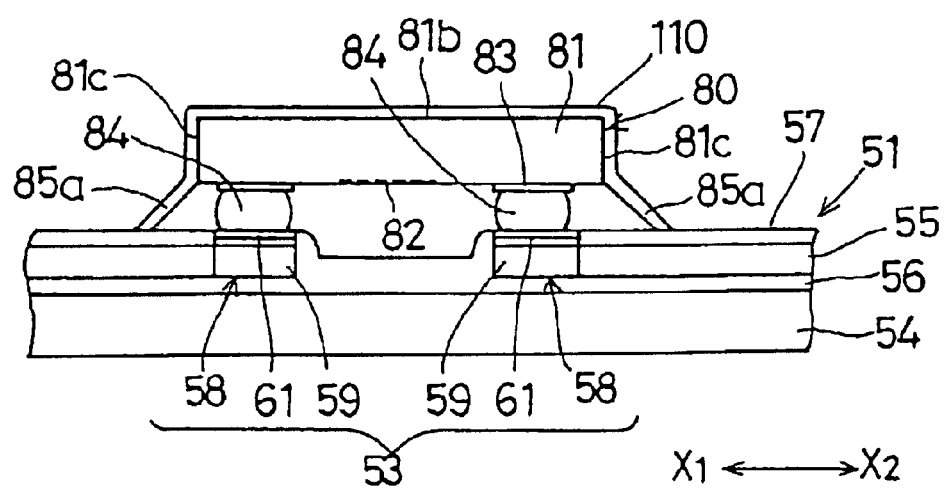
FIG. 2D is a cross sectional view showing an encircled part D of the head assembly shown in FIG. 2A.

As shown in FIG. 2C, the head slider 70 has a side end surface 71 which is provided with a magnetic head 72, wiring patterns (not shown) and four electrodes 73. A rail 75 is formed on a top surface 74. The magnetic head 72 is formed by the thin film technology, and has a structure including overlapping inductive head and magneto-resistive head (both not shown). The head slider 70 is bonded on the gimbal part 52. The electrodes 73 and electrodes 76 at ends of the wiring patterns 55 are connected by thermocompression bonding of Au balls 77.

Figure 3A:
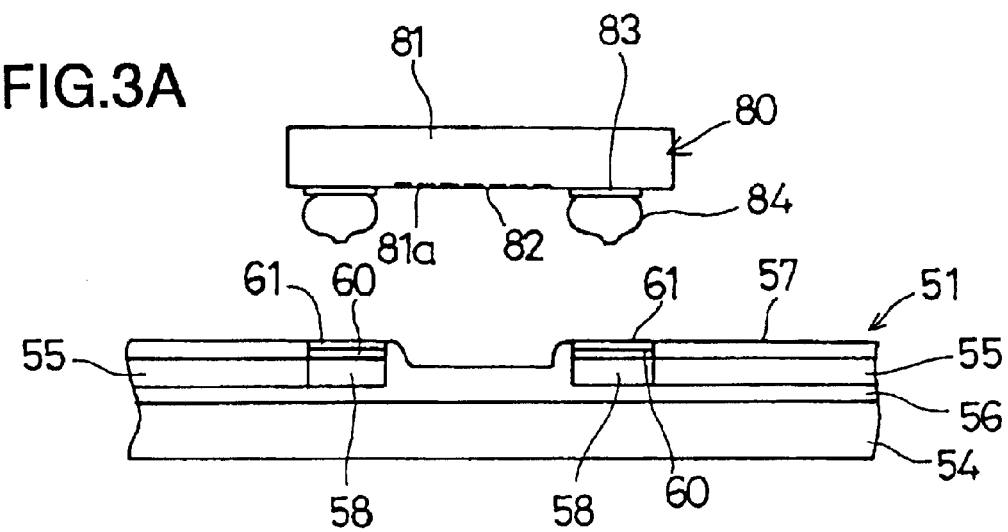
FIGS. 3A and 3B are cross sectional views for explaining the mounting of a head IC chip in the first embodiment.
Figure 3B:
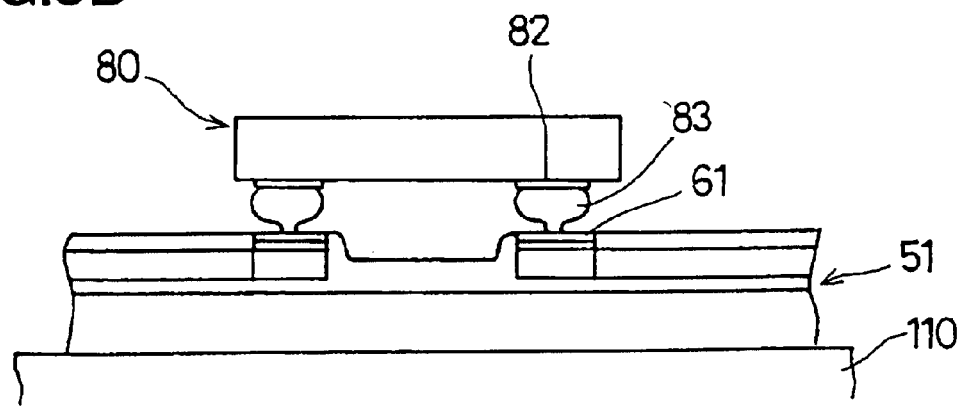

FIGS. 3A and 3B are cross sectional views for explaining the mounting of the head IC chip 80 in the first embodiment.

As shown in FIG. 2D, in the head IC chip mounting part 53, electrodes 58 are provided at the ends of the wiring patterns 55. As shown in FIG. 3A, each electrode 58 has a Ni layer 60 and a Au layer 61 which overlap on a Cu base part 59, and the Au layer 61 is exposed at the surface.

The head IC chip 80 has an integrated circuit 82 formed on a lower surface 81a of a silicon (Si) main chip body 81 in FIG. 3A. In addition, the head IC chip 80 has Au bumps 84 formed on Al electrodes 83 which are also formed on the lower surface 81a.

The head IC chip 80 is mounted as shown in FIG. 3B. In other words, the suspension 51 is fixed on a table 110, and in a state where the head IC chip 80 is oriented face-down, each Au bump 84 is positioned to match the corresponding of a corresponding electrode 58. The head IC chip 80 in this position is pressed under room temperature, and ultrasonic waves are applied for several seconds, so that ultrasonic bonding of each Au bump 84 and the Au layer 61 of the corresponding electrode 58 is achieved. The Au bump 84 and the Au layer 61 of the corresponding electrode 58 rub against each other at the interface, and are finally bonded together by this ultrasonic bonding.

As shown in FIG. 2D, the reliability of the bonding of the head IC chip 80 to the suspension 51 is improved by an under-filling 85 which fills the lower surface side of the head IC chip 80 and gaps between the head IC chip 80 and the suspension 51. Furthermore, the integrated circuit 82 is protected by this under-filling 85.

A poly(p-xylylene) layer 110 is formed by evaporation, and covers an upper surface 81b of the main chip body 81, the entirety of side surfaces 81c, and peripheral side surfaces 85a of the under-filling 85. As will be described later, this poly(p-xylylene) layer 110 is formed by chemical vapor deposition (CVD), and is extremely thin. Hence, the increase in the height of the head IC chip 80 by the provision of this poly(p-xylylene) layer 110 is extremely small, and the height of the head IC chip 80 will not exceed the height of the upper surface of the head slider 70 by the provision of this poly(p-xylylene) layer 110. In addition, the increase in the weight of the head IC chip 80 due to the provision of this poly(p-xylylene) layer 110 is negligible, since the poly(p-xylylene) layer 110 is extremely thin. Furthermore, because the poly(p-xylylene) layer 110 is extremely thin, a spring characteristic of the suspension 51 will be unaffected by the provision of the poly(p-xylylene) layer 110, even if the poly(p-xylylene) layer 110 is formed up to the peripheral part of the head IC chip 80.

A method of forming the poly(p-xylylene) layer 110 will be described later.

The poly(p-xylylene) layer 110 has the following characteristics. That is, the impurity content of the poly(p-xylylene) layer 110 is small, thereby generating little gas. In addition, the poly(p-xylylene) layer 110 has a good bonding characteristic with respect to silicon, and the strength of the poly(p-xylylene) layer 110 can withstand cleaning.

Figure 4A:
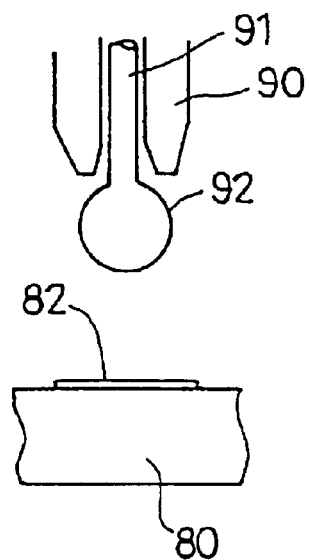
FIGS. 4A through 4D are diagrams for explaining the forming of Au bumps.
Figure 4B:
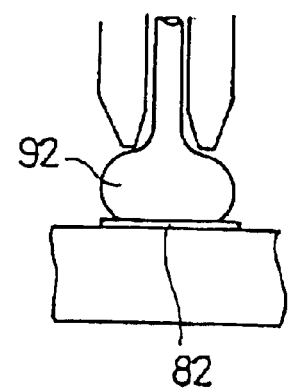
Figure 4C:
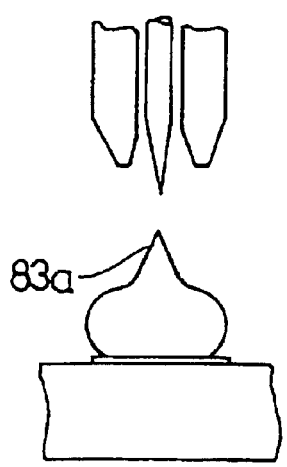
Figure 4D:
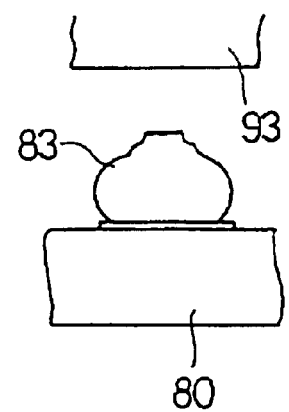

FIGS. 4A through 4D are diagrams for explaining the forming of Au bumps. The Au bump 84 is formed in the following manner as shown in FIGS. 4A through 4D, similarly as in the case of a wire bonding. An end of a AU wire 91 is made to project from a tip end of a capillary 90 of a bonder, so as to form a Au ball 92 as shown in FIG. 4A. Then, the capillary 90 is lowered to push the Au ball 92 against the electrode 82 of the head IC chip 80 as shown in FIG. 4B, and ultrasonic waves and heat are applied so as to bond the Au ball 92 on the electrode 82. A wire clamper (not shown) clamps the upper end portion of the Au wire 91 which is exposed from the capillary 90, and the capillary 90 is pulled upwards, so as to pull and cut the Au wire 91 as shown in FIG. 4C. Thereafter, a pointed portion 84a of the Au bump 84 is squashed and leveled by a glass plate 93 as shown in FIG. 4D.

Figure 5A:
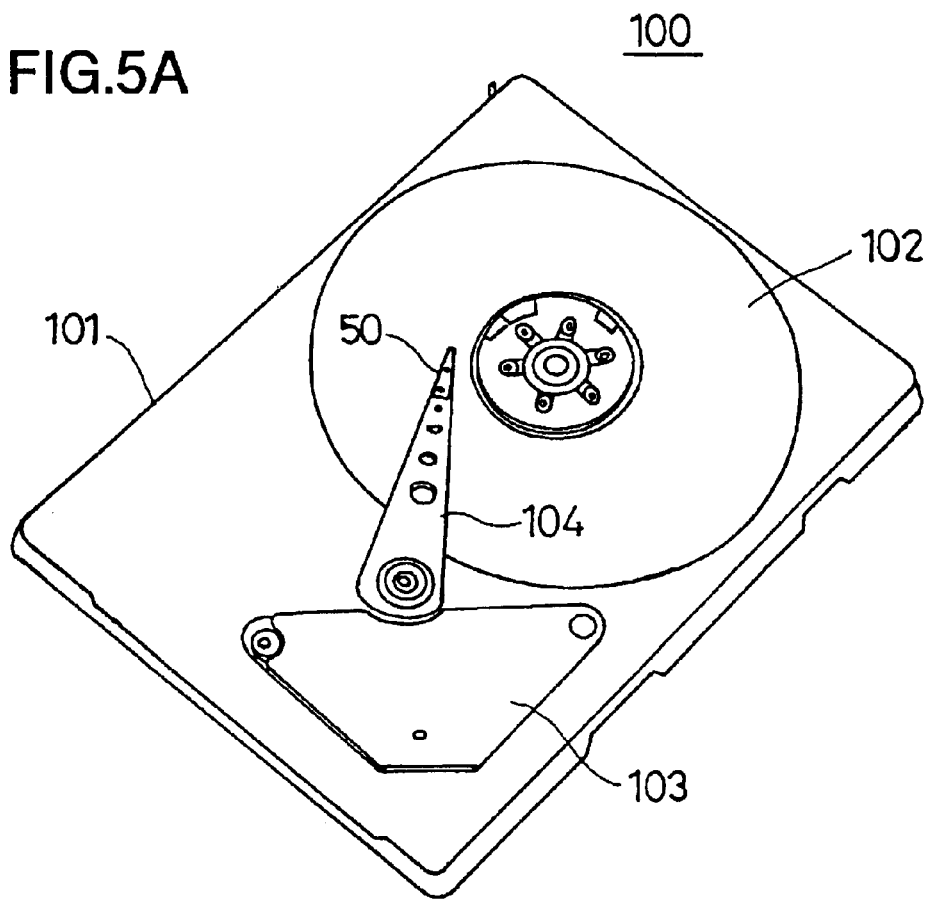
FIG. 5A is a perspective view showing a first embodiment of a disk unit according to the present invention.
Figure 5B:
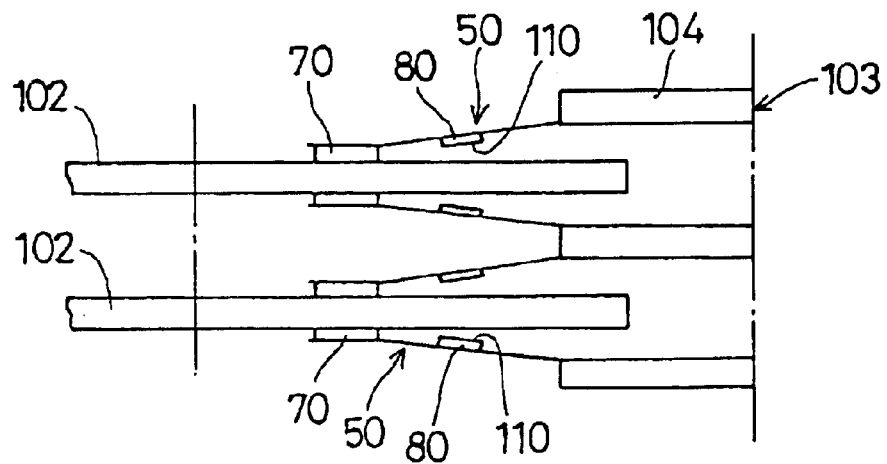
FIG. 5B is a side view showing an important part of the disk unit shown in FIG. 5A.

FIG. 5A is a perspective view showing a first embodiment of a disk unit according to the present invention, and FIG. 5B is a side view showing an important part of the disk unit shown in FIG. 5A. This first embodiment of the disk unit uses the first embodiment of the head assembly shown in FIGS. 2A through 2D. In this first embodiment of the disk unit, the present invention is applied to a hard disk unit.

A disk unit 100 is generally made up of a housing 101 as shown in FIG. 5A, and rotatable hard disks 102, an actuator 103, and arms 104 which are turned by the actuator 103 are accommodated within the housing 101. For example, two disks 102 are provided as shown in FIG. 5B. The actuator 103 includes a coil and a permanent magnet, and is driven electro-magnetically. The head assembly 50 is mounted on the tip end of each arm 104. A spacer (not shown) is fixed on the base side of the suspension 51 along the direction X2 in FIG. 2A, and this spacer is fixed on the arm 104. When the disk 102 rotates and the actuator 103 is driven to turn the arm back and forth, the head assembly 50 is moved in a radial direction of the disk 103 to make access to a predetermined track, so as to write and/or read information with respect to the predetermined track.

The poly(p-xylylene) layer 110 covers the upper surface 81b of the main chip body 81 and the entirety of the side surfaces 81c. Hence, the silicon particles or powder are prevented from separating from the main chip body 81 as the foreign particles. As a result, the reliability of the disk unit 100 is greatly improved over the prior art in that the head crash is unlikely to occur.

Furthermore, the peripheral side surfaces 85a of the under-filling 85 are also covered by the poly (p-xylylene) layer 110. Thus, foreign particles are also prevented from being generated from the peripheral side surfaces 85a of the under-filling 85. Therefore, compared to a case where only the bare head IC chip 80 is covered by the poly (p-xylylene) layer 110, the disk unit 100 has a considerably improved reliability in that the head crash is unlikely to occur due to the foreign particles which are prevented from being generated.

Figure 6B:
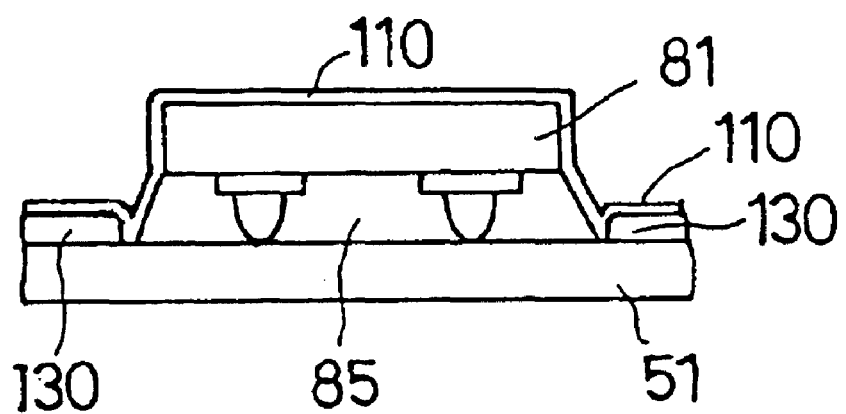
FIG. 6B is a cross sectional view showing an encircled part E shown in FIG. 6A.

Next, a description will be given of a method of forming the poly(p-xylylene) layer 110 so as to cover the main chip body 81 and the peripheral side surfaces 85a of the under-filling 85, by referring to FIGS. 6A and 6B. FIG. 6A is a diagram showing an apparatus for forming the poly(p-xylylene) layer 110, and FIG. 6B is a cross sectional view showing an encircled part E shown in FIG. 6A.

As shown in FIG. 6A, the poly(p-xylylene) layer 110 is formed by CVD. The CVD employed forms a layer which is made of a metal compound, such as metal, alloy and carbide, on an object surface by thermal decomposition or hydrogen reduction of a metal halide compound or the like at a high temperature.

A CVD equipment 120 includes an evaporation chamber 121, a thermal decomposition chamber 122 and a vacuum deposition chamber 123 which are successively arranged as shown in FIG. 6A. A vacuum pump 124 is connected to the vacuum deposition chamber 123. A poly(p-xylylene) 125 is supplied to the evaporation chamber 121 as the raw material.

A semi-completed head assembly 50X is placed on a table 123a within the vacuum deposition chamber 123. This semi-completed head assembly 50X has the head slider 70 and the head IC chip 80 mounted on the suspension 51, and in this state, portions of the semi-completed head assembly 50X excluding the portion corresponding to the head IC chip 80 are masked by a mask 130, as shown in FIG. 6B.

Poly(p-xylylene) particles 126 which are evaporated within the evaporation chamber 121 are sucked by the vacuum pump 124, and reach the thermal decomposition chamber 122 wherein a thermal decomposition of the poly (p-xylylene) particles 126 takes place to form radical monomers 127. The radical monomers 127 move to the vacuum deposition chamber 123, and are deposited on the surface of the semi-completed head assembly 50X, to thereby form the poly(p-xylylene) layer 110.

Finally, the semi-completed head assembly 50X is removed from the vacuum deposition chamber 123, and the mask 130 is removed to complete the head assembly 50 shown in FIG. 2A. This completed head assembly 50 has the poly(p-xylylene) layer 110 which covers the upper surface 81b of the main chip body 81 and the entirety of the side surfaces 81c, as well as the peripheral side surfaces 85a of the under-filling 85.

[Second Embodiment]

Figure 7A:
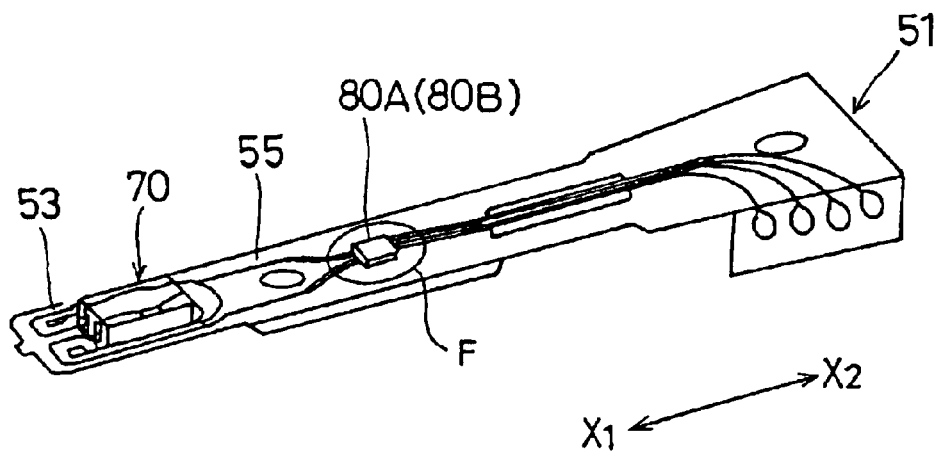
FIG. 7A is a perspective view showing a second embodiment of the head assembly according to the present invention.
Figure 7B:
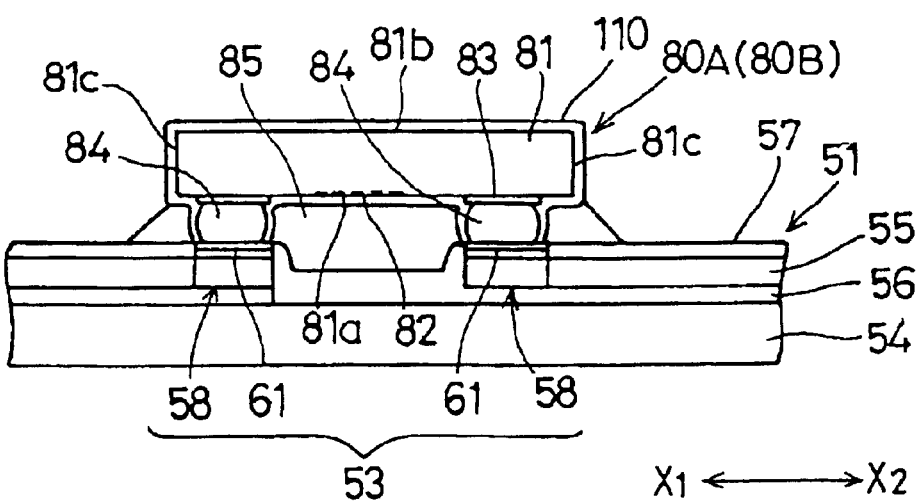
FIG. 7B is a cross sectional view showing an encircled part F of the head assembly shown in FIG. 7A.

FIG. 7A is a perspective view showing a second embodiment of the head assembly according to the present invention, and FIG. 7B is a cross sectional view showing an encircled part F of the head assembly shown in FIG. 7A.

The construction of a head assembly 50A shown in FIG. 7A is basically the same as that of the head assembly 50 shown in FIG. 2A, except for the coverage of the poly(p-xylylene) layer 110. In FIGS. 7A and 7B, those parts which are the same as those corresponding parts in FIGS. 2A and 2D are designated by the same reference numerals, and a description thereof will be omitted.

As shown on an enlarged scale in FIG. 7B, the poly(p-xylylene) layer 110 of this embodiment covers the upper surface 81b of the main chip body 81, the entirety of the side surfaces 81c, the lower surface 81a, and the peripheries of the Au bumps 84.

Particularly because the upper surface 81b and the entirety of the side surfaces 81c of the main chip body 81 are covered by the poly (p-xylylene) layer 110, the silicon particles are prevented from separating from a bare head IC chip 80A, so as to prevent generation of the foreign particles or powder.

Figure 8A:
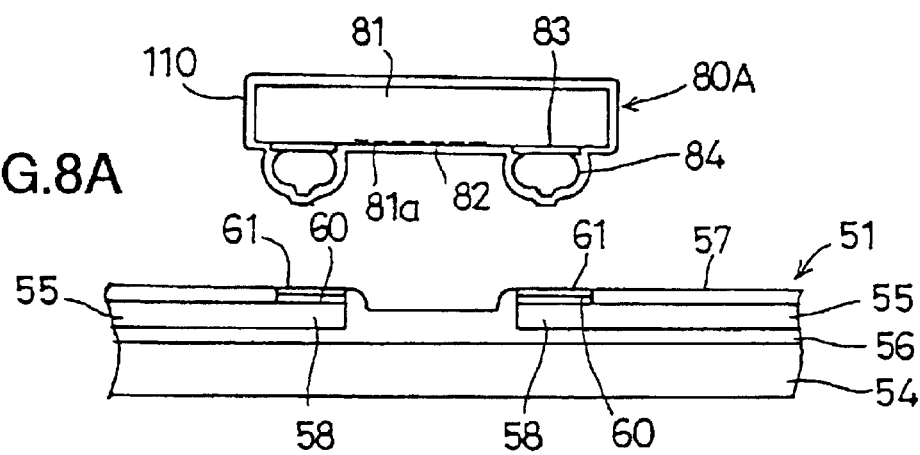
FIGS. 8A and 8B are cross sectional views for explaining the mounting of a head IC chip having a first structure in the second embodiment.
Figure 8B:
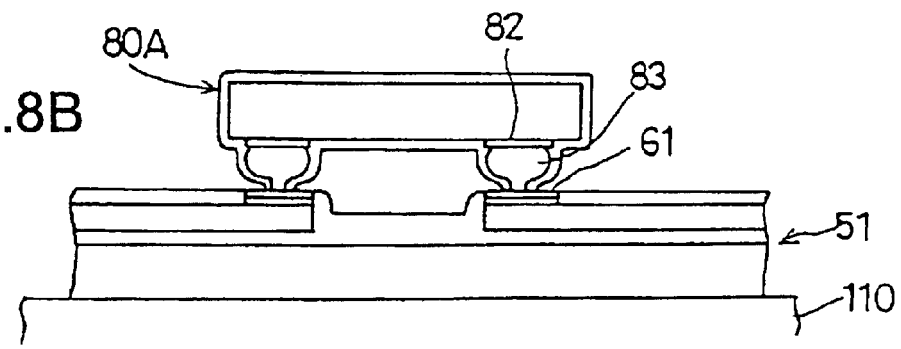

FIGS. 8A and 8B are cross sectional views for explaining the mounting of the head IC chip 80A having a first structure, in the second embodiment. In this case, the poly(p-xylylene) layer 110 is formed with respect to the head IC chip 80A prior to mounting the head IC chip 80A on the suspension 51. The poly(p-xylylene) layer 110 is formed by accommodating the head IC chip 80A in the vacuum deposition chamber 123 shown in FIG. 6A. The head IC chip 80A which is covered by the poly(p-xylylene) layer 110 is mounted on the suspension 51 and bonded thereon by ultrasonic bonding, as shown in FIG. 8B. Portions of the poly(p-xylylene) layer 110 at the tip ends of the Au bumps 84 are removed by the rubbing described above which is caused by the ultrasonic bonding, and the ultrasonic bonding of the Au bumps 84 and the Au layer 61 can be made in a normal manner.

Next, a description will be given of various methods of producing the head IC chip 80A shown in FIGS. 8A and 8B.

In the following methods described hereunder, a particle scattering preventing layer which prevents scattering of the foreign particles is formed with respect to a wafer at a stage before the wafer is diced into individual pieces or chips, rather than forming the particle scattering preventing layer with respect to each piece of chip after dicing the wafer.

FIGS. 9A through 9E are cross sectional views for explaining a first method of producing the head IC chip 80A.

In FIG. 9A, a wafer structure 160 is made up of a wafer 161 and a plurality of Au bumps 84. A large number of integrated circuits 82 are formed in an array on a lower surface 161a of the wafer 161. In addition, a large number of the bumps 84 are formed on corresponding electrodes 83 which are also formed the lower surface 161a of the wafer 161.

First, a first CVD process is carried out. As shown in FIG. 9A, the wafer structure 160 is placed on a tray 170 with the lower surface 161a with the bumps 84 facing down, and the CVD is carried out in this state. As a result, the poly(p-xylylene) layer 110 is formed on an upper surface 161b and the lower surface 161b of the wafer 161, and on the surface of each bump 84, as shown in FIG. 9B.

Next, a film 171 is bonded on the upper surface of the wafer structure 161, and the wafer structure 161 is turned upside down as shown in FIG. 9C. The wafer structure 161 is placed on a dicing table 172, and is diced into a plurality of chips 162 using a dicing saw 173 which rotates at a high speed. FIG. 9D shows the wafer structure 161 in a state after this dicing. In FIG. 9D, a dicing groove 163 indicates the groove which is formed by the dicing. The dicing is carried out so that the film 171 remains in a semi-cut or half-cut state, so that the cut chips 162 will not come to pieces. In other words, the chips 162 are maintained in the aligned state on the film 171.

Then, a second CVD is carried out, that is, a CVD is carried out again. The second CVD is mainly carried out to form the poly(p-xylylene) layer 110 on the entirety of side surfaces 162a of the chips 162. As a result of this second CVD, a poly(p-xylylene) layer 110a is efficiently formed on the entirety of the side surfaces 162a of each chip 162 as shown in FIG. 9E, so as to overlap the already formed poly(p-xylylene) layer 110.

Therefore, a head IC chip group 165 is produced. In this head IC chip group 165, a large number of the head IC chips 80A shown in FIGS. 8A and 8B are arranged in the array and bonded on the film 171. This head IC chip group 165 is supplied to a next production process, by being placed on a transport tray to be transported, for example.

The effects of this first method can be summarized as follows. That is, the process of depositing the poly(p-xylylene) layer by evaporation is carried out in a stage before the wafer is cut into the individual chips, and for this reason, the poly(p-xylylene) layer can be formed with respect to a large number of chips simultaneously. Compared to a case where the poly(p-xylylene) layer is formed with respect to each of the individual chips after the wafer is cut into the individual chips, this first method can produce the head IC chip 80A shown in FIGS. 8A and 8B with a considerably better production efficiency.

FIGS. 10A through 10G are cross sectional views for explaining a second method of producing the head IC chip 80A. The processes shown in FIGS. 10A through 10D are the same as those of FIGS. 9A through 9D described above.

After the process shown in FIG. 10D, a process shown in FIG. 10E or FIG. 10F is carried out, so as to remove split or peeled layer portions 164 which may be generated by the dicing process shown in FIG. 10D.

In FIG. 10E, a laser beam 174 is irradiated on the edge of the dicing groove 163 after the dicing, and scanned along the edge. Hence, the laser beam 174 is irradiated on the split or peeled layer portion 164. As a result, the split or peeled layer portion 164 is heated and melted by the laser beam 174, and the split or peeled layer portion 164 is removed.

On the other hand, in FIG. 10F, the wafer is soaked in hydrochloric acid, so as to chemically remove the split or peeled layer portion 164. The soaking time is controlled so that only the split or peeled layer portion 164 is removed. After removing the split or peeled layer portion 164, the wafer is cleaned to remove the hydrochloric acid remaining on the wafer.

Next, after the process shown in FIG. 10E or 10F, a second CVD is carried out as shown in FIG. 10G, similarly to the CVD described above in conjunction with FIG. 9E. As a result of this second CVD, the poly(p-xylylene) layer 110a is efficiently formed on the entirety of the side surfaces 162a of each chip 162 as shown in FIG. 10E, so as to overlap the already formed poly(p-xylylene) layer 110. Therefore, the head IC chip group 165 in which a large number of the head IC chips 80A shown in FIGS. 8A and 8B are arranged in the array and bonded on the film 171 is produced.

This second method can obtain the same effects as the first method described above. In addition, although the split or peeled layer portion 164 which is generated by the dicing would cause the generation of the foreign particles, the split or peeled layer portion 164 is effectively removed according to this second method. For this reason, the poly(p-xylylene) layers 110 and 110a are formed with a high quality, and the generation of the foreign particles from the head IC chip 80A is positively prevented.

FIGS. 11A through 11F are cross sectional views for explaining a third method of producing the head IC chip 80A. The processes shown in FIGS. 11A and 11B are the same as those of FIGS. 9A and 9B described above.

After the process shown in FIG. 11B, laser beams 180 and 181 respectively irradiate the surfaces 161a and 161b of the wafer 161 as shown in FIG. 11C, so as to scan the wafer 161 in an array along paths similar to the dicing paths of the dicing saw 173 described above. Hence, portions 166 of the poly(p-xylylene) layer 110 are removed by a width W1, by being heated and melted by the laser beams 180 and 181. The width W1 of the portions 166 where the poly(p-xylylene) layer 110 is removed, is wider by a width W3 on both sides of a width W2 of the dicing groove 163 which is later formed. Because the portions 166 are removed by heating and melting the poly(p-xylylene) layer 110, no split or peeled layer portion of the poly(p-xylylene) layer 110 is generated.

Figure 1A:
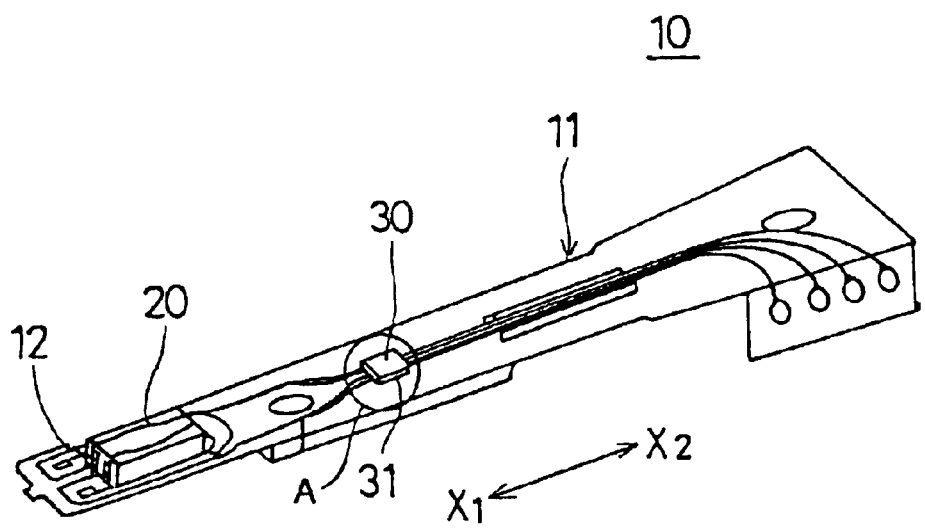
FIG. 1A is a perspective view showing a conventional head assembly.
Figure 1B:
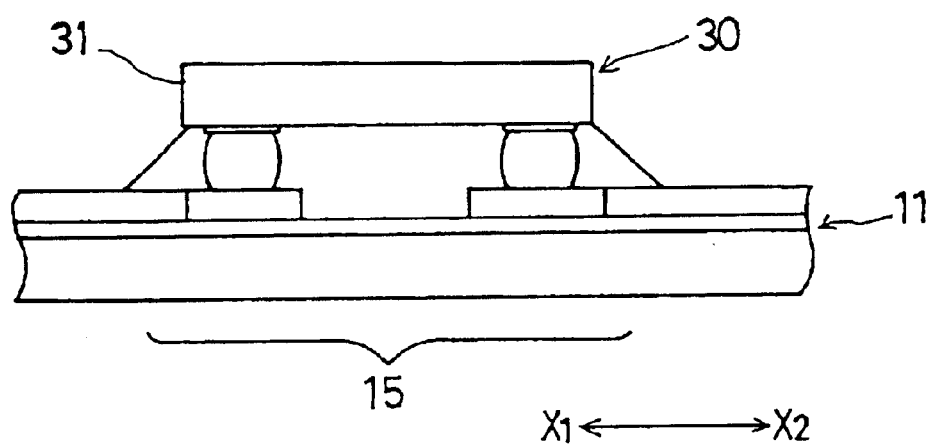
FIG. 1B is a cross sectional view showing an encircled part A of the head assembly shown in FIG. 1A.

Next, as shown in FIG. 1D, the wafer 161 is diced by the dicing saw 173 in an array, so as to form the plurality of chips 162 as shown in FIG. 1E. The dicing groove 163 is formed at the center of the portion 166 where the poly(p-xylylene) layer 110 is removed, so as not to overlap the portions where the poly(p-xylylene) layer 110 is formed. In other words, as shown in FIG. 11E, the edges of the poly(p-xylylene) layer 110 are receded by the width W3 on both sides of the dicing groove 163 which has the width W2. Accordingly, the poly(p-xylylene) layer 110 is not diced by the dicing saw 173, and no split or peeled layer portion of the poly(p-xylylene) layer 110 is generated by the dicing.

Thereafter, a second CVD is carried out as shown in FIG. 11F, similarly to the CVD described above in conjunction with FIG. 9E. As a result of this second CVD, the poly(p-xylylene) layer 110a is efficiently formed on the entirety of the side surfaces 162a of each chip 162 as shown in FIG. 11F, so as to overlap the already formed poly(p-xylylene)

layer 110. Therefore, the head IC chip group 165 in which a large number of the head IC chips 80A shown in FIGS. 8A and 8B are arranged in the array and bonded on the film 171 is produced.

According to this third method, it is possible to obtain the same effects as the first and second methods described above.

FIGS. 12A through 12F are cross sectional views for explaining a fourth method of producing the head IC chip 80A.

As shown in FIG. 12A, masks 190 and 191 having a width W1 are respectively formed on the surfaces 161a and 161b of the wafer 161 in an array. A first CVD is carried out in this state, so as to form the poly(p-xylylene) layer 110 as shown in FIG. 12B. The poly(p-xylylene) layer 110 is formed on the upper and lower surfaces 161b and 161a of the wafer 161, the masks 190 and 191, and the surface of each bump 84.

Next, the masks 190 and 191 are removed. Hence, portions of the poly(p-xylylene) layer 110 are removed by a width W1, as shown in FIG. 12C. No split or peeled portions of the poly(p-xylylene) layer 110 is generated.

Thereafter, the processes shown in FIGS. 12D, 12E and 12F are carried out similarly to the processes described above in conjunction with FIGS. 11D, 11E and 11F, so as to dice the wafer 161 and carry out the second CVD. As a result, the head IC chip group 165 in which a large number of the head IC chips 80A shown in FIGS. 8A and 8B are arranged in the array and bonded on the film 171 is produced, as shown in FIG. 12F.

According to this fourth method, it is possible to obtain the same effects as the first and second methods described above.

Next, a description will be given of another method of forming the layer which covers the bear main chip body 81 of the head assembly 50A shown in FIG. 7B.

According to this method, the layer which covers the main chip body 81 is formed by coating process. Because the thickness of the hard disk unit has been reduced considerably in recent years, the projecting height of the head IC chip 80A from the suspension 51 is restricted. For this reason, the thickness of the layer covering the main chip body 81 must be 50 μm or less, for example. Accordingly, this method of forming the layer which covers the main chip body 81 by the coating process is particularly suited for satisfying the above described height restriction of the head IC chip 80A.

In addition, by employing the method of forming the layer which covers the main chip body 81 by the coating process, the head assembly 50A can be formed by carrying out the chip mounting process, the under-filling forming process, and the coating process in this sequence.

Figure 13:
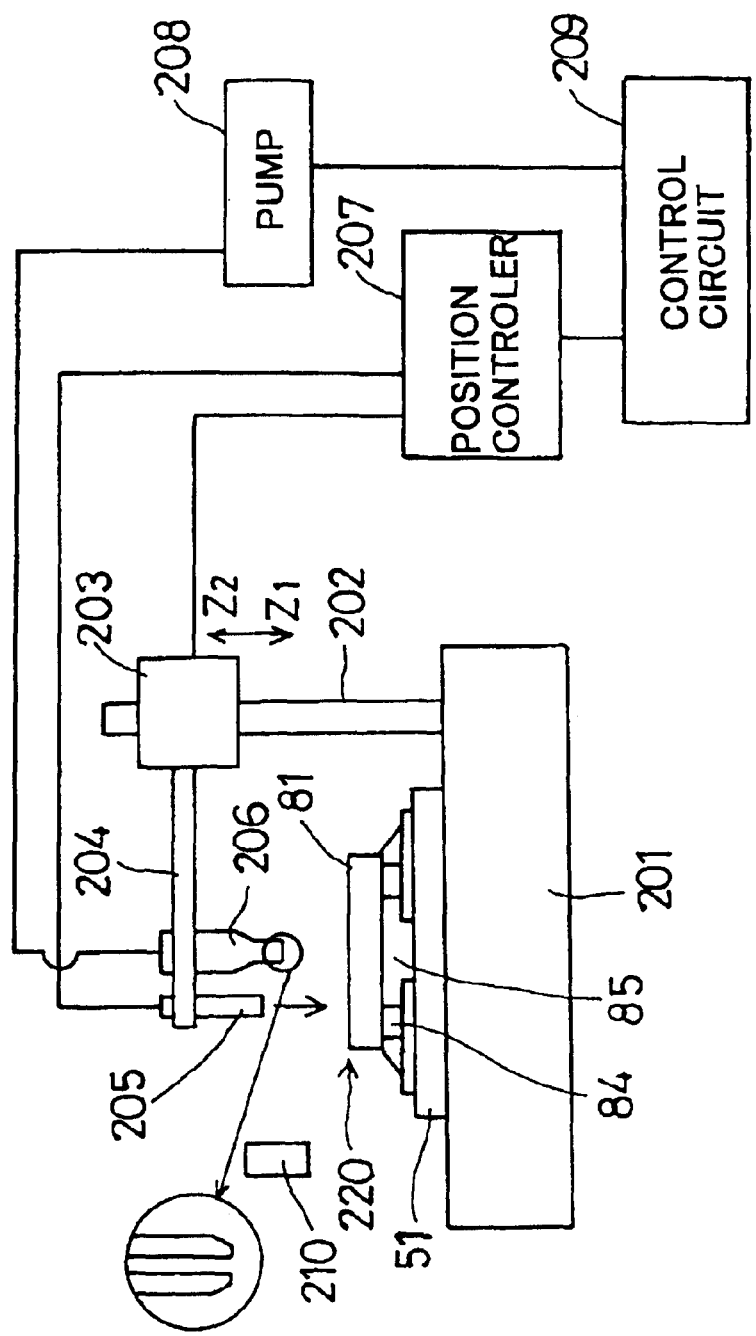
FIG. 13 is a diagram showing a layer forming apparatus.

FIG. 13 is a diagram showing a layer forming apparatus. A layer forming apparatus 200 shown in FIG. 13 includes a stage 201, an elevator mechanism 203 which is movable in directions Z1 and Z2 along a pole 202 which stands on the stage 201, an arm which extends horizontally from the elevator mechanism 203, a laser displacement measuring unit 205 and a nozzle 206 which are integrally mounted on the arm 204, an ultraviolet ray irradiation unit 210, a position controller 207 which is connected to the elevator mechanism 203 and the laser displacement measuring unit 205, a pump 208 which is connected to the nozzle 206, and a control circuit 209 which controls the operation of the layer forming apparatus 200.

The layer forming process of the layer forming apparatus 200 is carried out as shown in FIGS. 14A through 14C and FIGS. 15A and 15B.

Figure 14A:
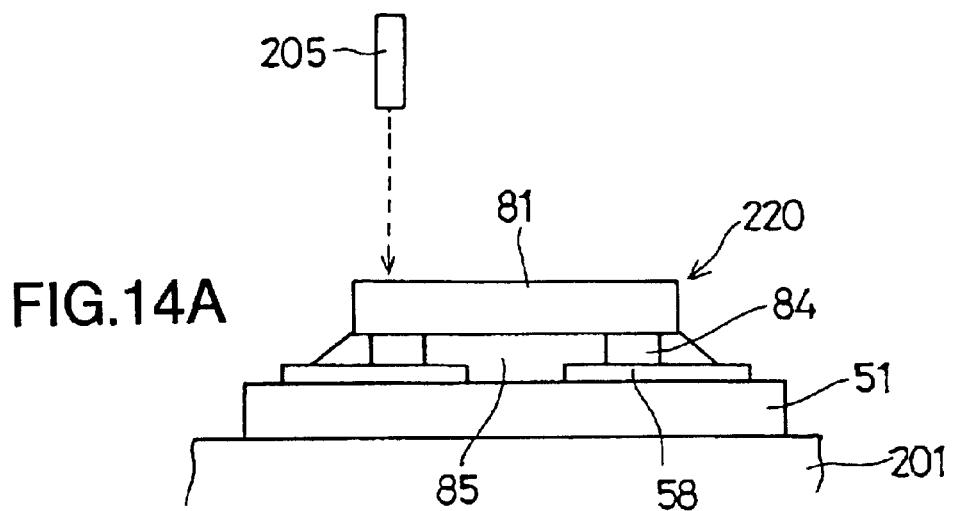
FIGS. 14A through 14C are cross sectional views for explaining a layer forming process of the layer forming apparatus shown in FIG. 13.

First, an assembly 220 shown in FIG. 14A is prepared. In this assembly 220, the main chip body 81 is mounted on the suspension 51 using the bumps 84 on the lower surface 81a, and the under-filling 85 fills the gaps on the lower surface side of the main chip body 81. The bumps 84 are not covered by a layer, and thus, the bumps 84 on the main chip body 81 and the electrodes 58 on the suspension 51 are bonded satisfactorily without interference from an interposed layer portion. In other words, the bumps 84 and the electrodes 58 are bonded with a high reliability.

The assembly 220 is set on the stage 201 of the layer forming apparatus 200 as shown in FIG. 14A, and the laser displacement measuring unit 205 is used to measure a distance between the tip end of the nozzle 206 and the top surface of the main chip body 81.

Figure 14B:
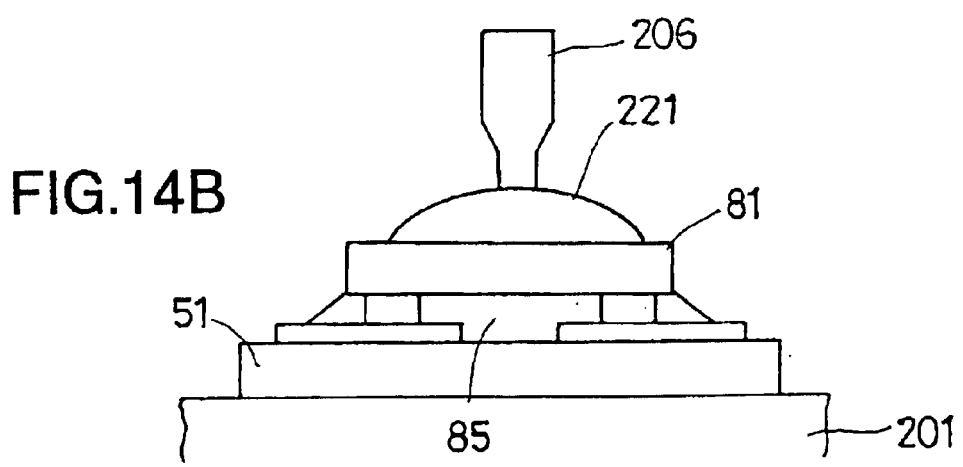

Then, as shown in FIG. 14B, a predetermined amount of acrylic ultraviolet-curing resin 221 is supplied from the nozzle 206 onto the top surface of the main chip body 81. This acrylic ultraviolet-curing resin 221 cures when irradiated with an ultraviolet ray. The predetermined amount of the resin 221 is greater than an amount of the resin 221 which is finally required to appropriately cover the main chip body 81. The resin 221 has characteristics such that the surface tension is smaller than the wetting with respect to the silicon main chip body 81.

Figure 14C:
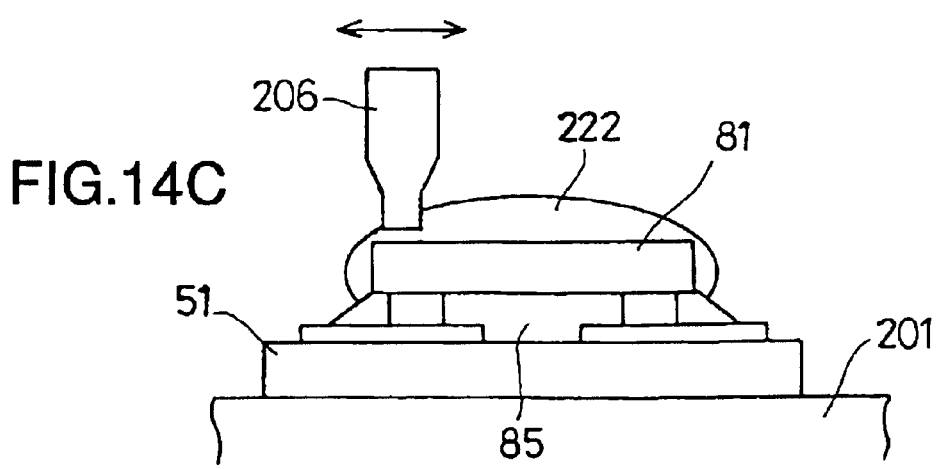

Next, as shown in FIG. 14C, the nozzle 206 is moved closer to the top surface of the main chip body 81, and the nozzle 206 is appropriately moved in the horizontal direction so as to spread the resin 221 on the top surface of the main chip body 81 and to adhere the resin 221 on the peripheral surfaces of the main chip body 81. In this state, the resin 221 on the top surface of the main chip body 81 has a bulge 222 at the central portion due to the surface tension, and the thickness of the resin 221 is not yet controlled.

Figure 15A:
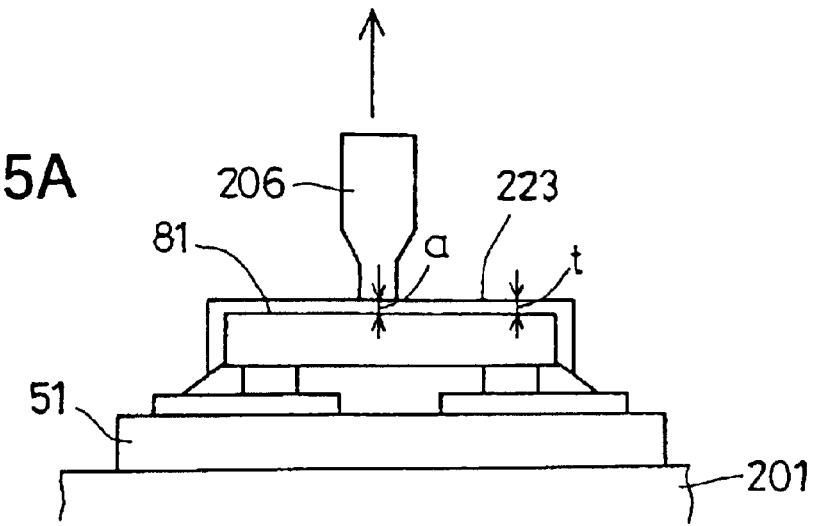
FIGS. 15A and 15B are cross sectional views for explaining the layer forming process of the layer forming apparatus shown in FIG. 13.

Then, as shown in FIG. 15A, the nozzle 206 is moved to the central portion of the top surface of the main chip body 81, and the height of the nozzle 206 is controlled so that a distance "a" between the tip end of the nozzle 206 and the top surface of the main chip body 81 becomes 50 μm. This distance "a" is set with reference to a measured value of the distance which is initially obtained using the laser displacement measuring unit 205. The pump 208 is thereafter driven to suck and remove the excess resin 221.

A suction force of the nozzle 206 is set smaller than the wetting of the resin 221 with respect to the silicon main chip body 81. By setting the relationship of the suction force and the wetting in this manner, it is possible to prevent the top surface of the main chip body 81 from becoming exposed, and it is possible to positively form a resin layer 223 having a thickness of approximately 50 μm on the top surface of the main chip body 81.

Figure 15B:
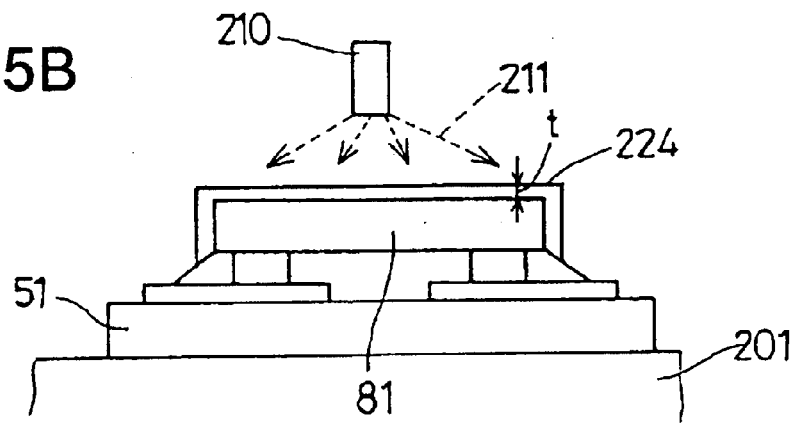

Finally, as shown in FIG. 15B, the ultraviolet ray irradiating unit 210 irradiates an ultraviolet ray on the resin layer 223 to cure the resin layer 223. As a result, the top and peripheral side surfaces of the main chip body 81 are covered by a cured resin layer 224 having a thickness of approximately 50 μm.

If the surface tension were larger than the wetting, the resin 221 would form drops like water drops, and it would be extremely difficult to spread the resin 221. In addition, if the suction force were larger than the wetting, the top surface of the main chip body 81 which is once wetted would become partially exposed, and a desired coverage would not be obtainable.

Therefore, the cured resin layer 224 can be formed on the main chip body 81 by the following steps.

1) Supplying an amount of the resin 221 greater than an amount which is required to form the cured resin layer 224 which has a thickness t of approximately 50 μm;
2) Setting the type or kind of the resin 221 so that the surface tension is smaller than the wetting with respect to the main chip body 81;
3) Setting the suction force of the pump 208 and the type or kind of the resin 221 so that the suction force of the pump 208 is smaller than the wetting with respect to the main chip body 81; and
4) Controlling the thickness t of the cured resin layer 224 by controlling the height of the nozzle 206 when sucking and removing the excess resin 221 on the main chip body 81.

Of course, it is possible to use other resins, such as a thermosetting epoxy resin, in place of the acrylic ultraviolet-curing resin 221. In this case, the thermosetting epoxy resin is cured by applying heat in FIG. 15B instead of irradiating the ultraviolet ray.

Figure 16:
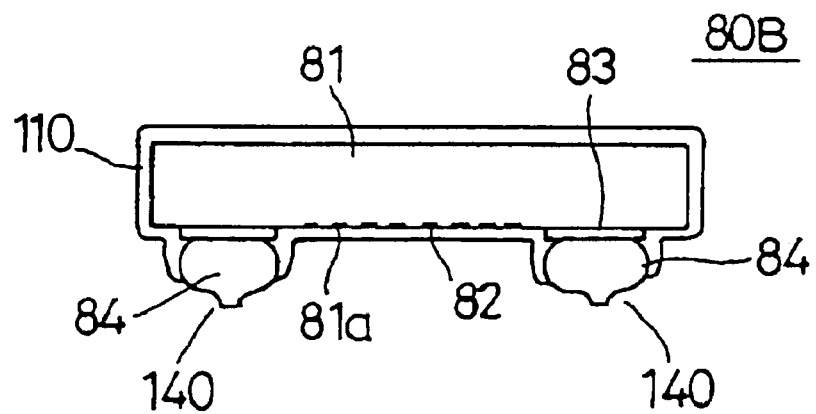
FIG. 16 is a cross sectional view showing a head IC chip having a second structure which may be used in the second embodiment.

In the second embodiment, it is possible to mount on the suspension 51 a head IC chip 80B shown in FIG. 16 having a modified first structure, in place of the head IC chip 80A shown in FIGS. 8A and 8B. The head IC chip 80B shown in FIG. 16 has no poly(p-xylylene) layer 110 formed on the tip end portions 140 of the bumps 84, so that the tip end portions 140 of the bumps 84 are exposed.

When mounting this head IC chip 80B on the suspension 51 by the ultrasonic bonding, it is unnecessary to break and remove portions of the poly(p-xylylene) layer 110 as in the case of the head IC chip 80A. Hence, the ultrasonic bonding of the head IC chip 80B on the suspension 51 is made more positively as compared to the head IC chip 80A.

Figure 21A:
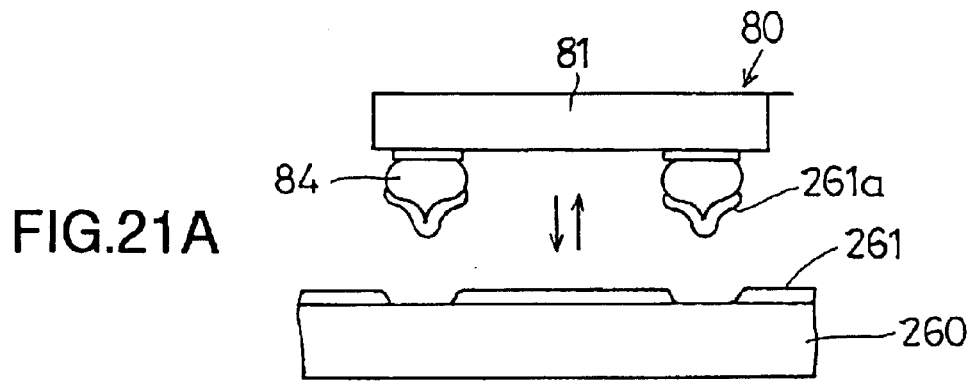
FIGS. 21A through 21D are cross sectional views for explaining a fifth method of producing the head IC chip shown in FIG. 16.
Figure 21B:
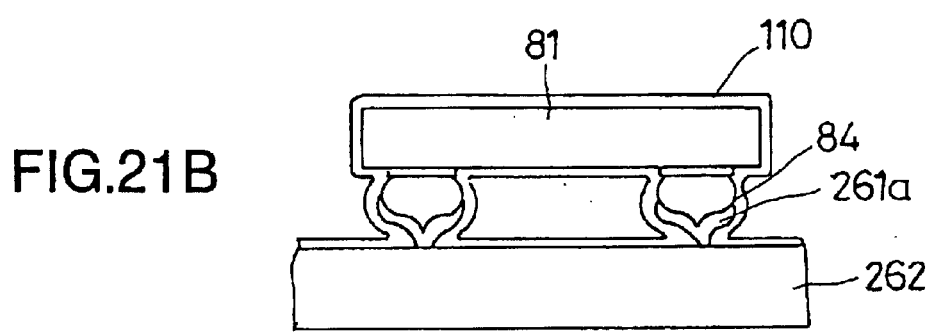
Figure 21C:
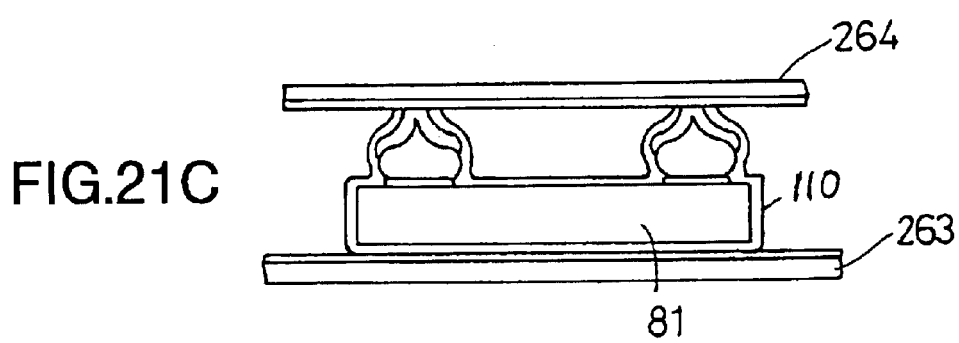
Figure 21D:
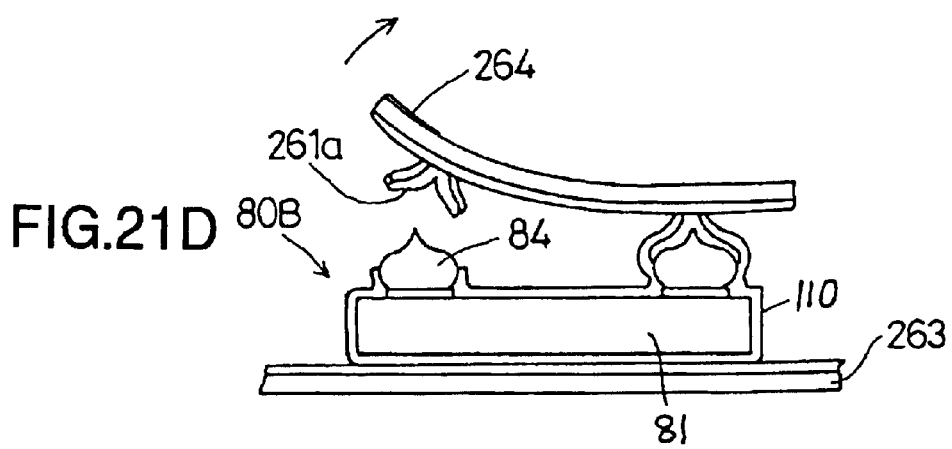
Figure 22A:
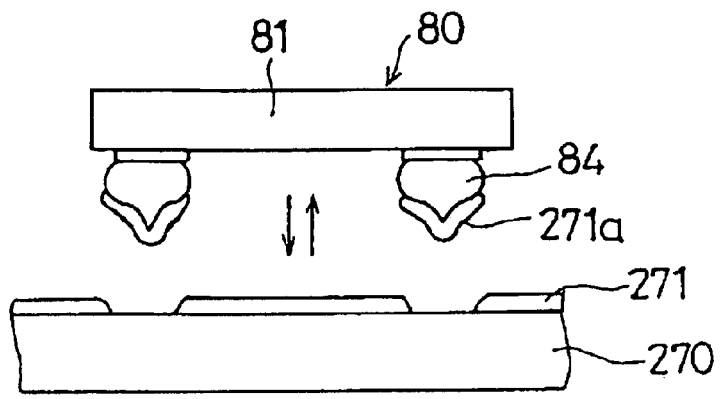
FIGS. 22A through 22D are cross sectional views for explaining a sixth method of producing the head IC chip shown in FIG. 16.
Figure 22B:
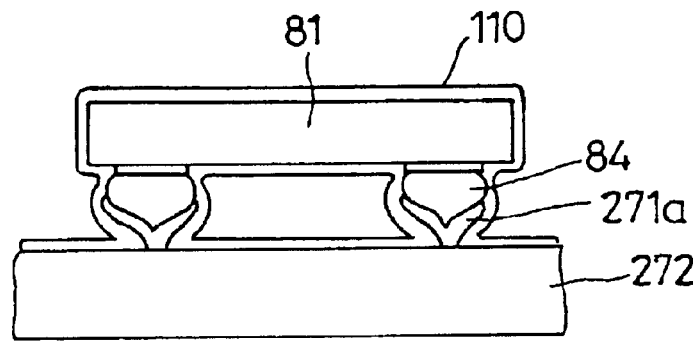
Figure 22C:
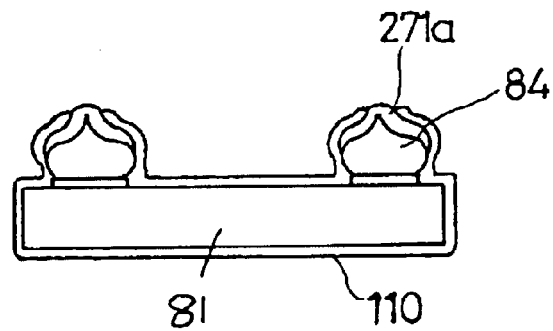
Figure 22D:
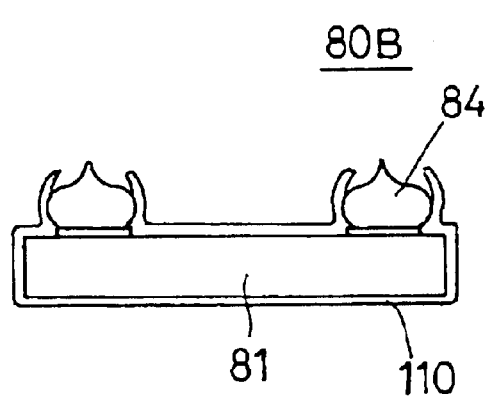
Figure 23A:
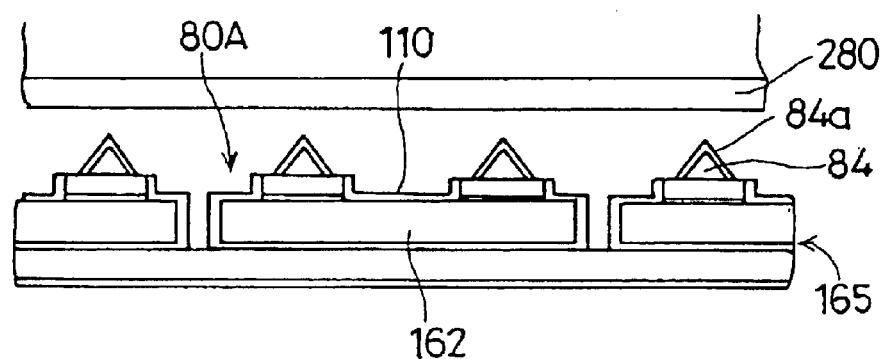
FIGS. 23A and 23B are cross sectional views for explaining a seventh method of producing the head IC chip shown in FIG. 16.
Figure 23B:
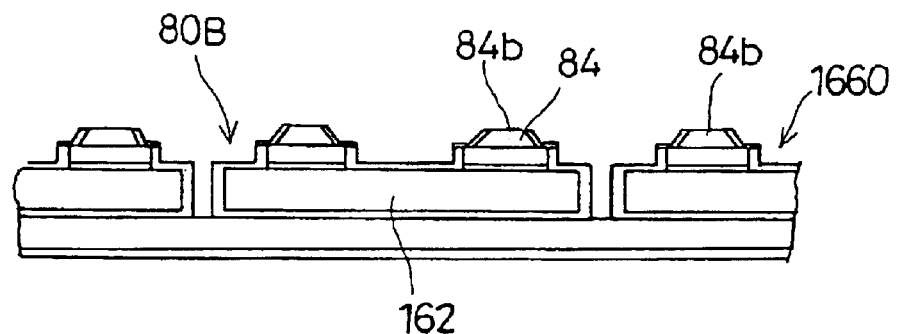

The head IC chip 80B may be produced by a first method shown in FIGS. 17A through 17D, a second method shown in FIGS. 18A through 18D, a third method shown in FIGS. 19A through 19D, a fourth method shown in FIGS. 20A through 20D, a fifth method shown in FIGS. 21A through 21D, a sixth method shown in FIGS. 22A through 22D, or a seventh method shown in FIGS. 23A and 23B.

Figure 17A:
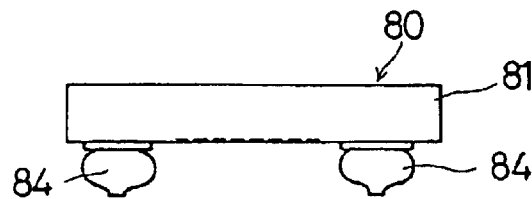
FIGS. 17A through 17D are cross sectional views for explaining a first method of producing the head IC chip shown in FIG. 16.
Figure 17B:
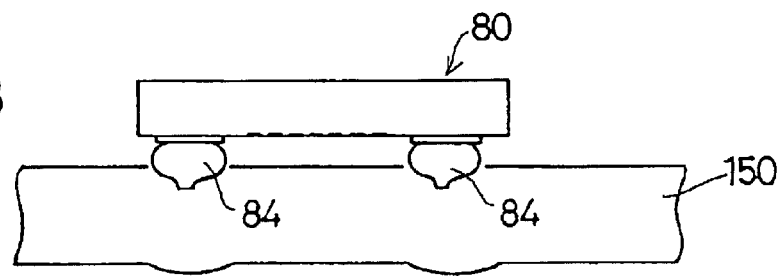
Figure 17C:
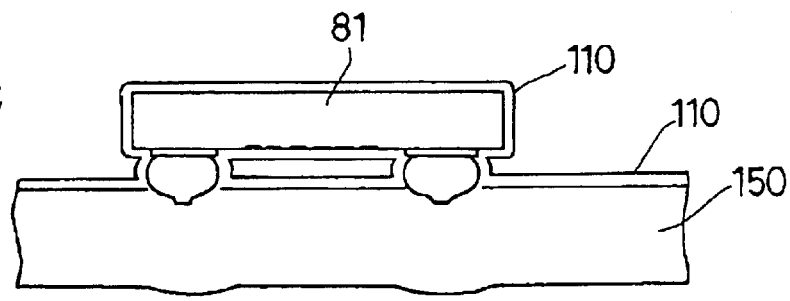
Figure 17D:
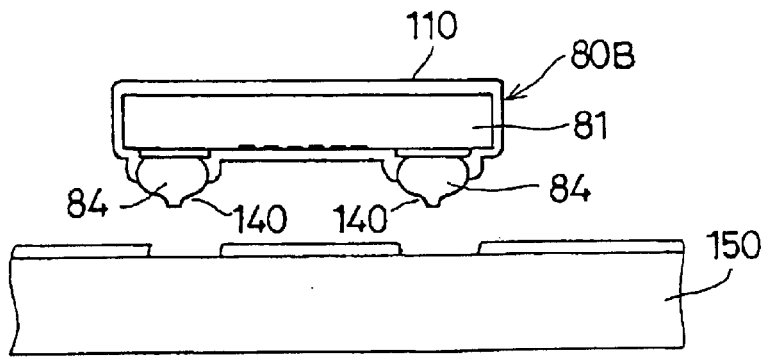

The first method shown in FIGS. 17A through 17D uses a soft sheet 150 which easily sinks. First, as shown in FIGS. 17A and 17B, the head IC chip 80 is placed on and pushed against the soft sheet 150, so as to deform the soft sheet 150 and sink the tip end portions of the bumps 84 into the soft sheet 150. As a result, the tip end portions of the bumps 84 become masked by the soft sheet 150. In this state, the structure shown in FIG. 17B is accommodated within the vacuum deposition chamber 123 shown in FIG. 6A so as to form the poly(p-xylylene) layer 110 by evaporation, as shown in FIG. 17C. When the head IC chip 80 is removed from the soft sheet 150 as shown in FIG. 17D, the head IC chip 80B is obtained.

Figure 18A:
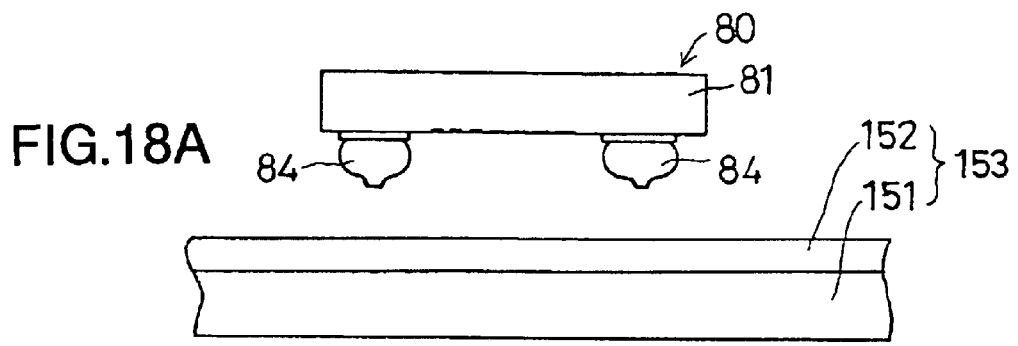
FIGS. 18A through 18D are cross sectional views for explaining a second method of producing the head IC chip shown in FIG. 16.
Figure 18B:
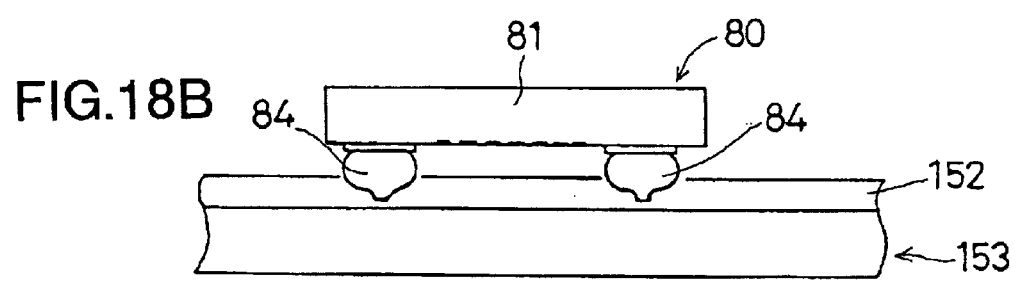
Figure 18C:
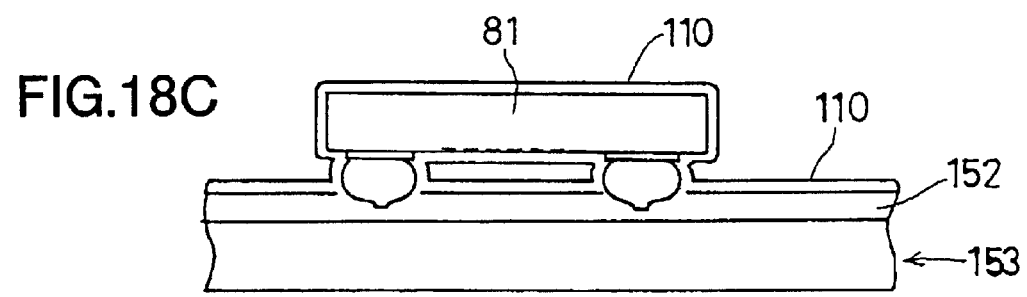
Figure 18D:
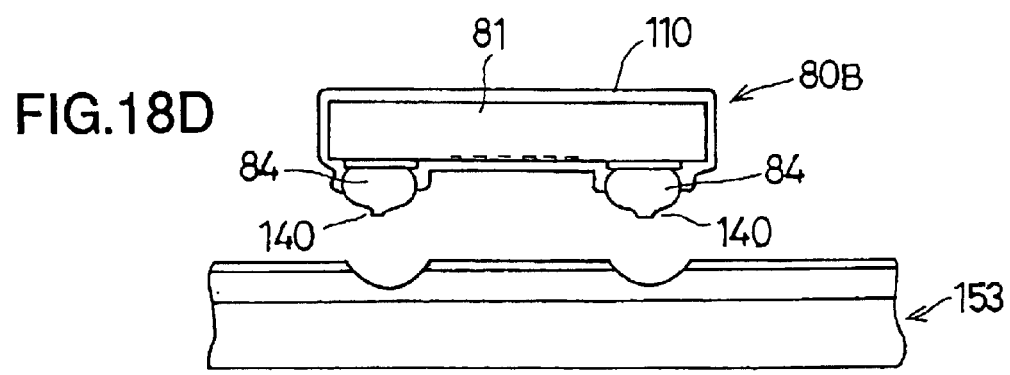

The second method shown in FIGS. 18A through 18D uses a sheet 153 having an adhesive layer 152 made of an adhesive agent coated on a main sheet body 151. First, as shown in FIGS. 18A and 18B, the head IC chip 80 is placed on and pushed against the sheet 153, so that the tip end portions of the bumps 84 sink into the sheet 153. As a result, the tip end portions of the umps 84 become masked by the sheet 153. In this state, the structure shown in FIG. 18B is accommodated within the vacuum deposition chamber 123 shown in FIG. 6A so as to form the poly(p-xylylene) layer 110 by evaporation, as shown in FIG. 18C. When the head IC chip 80 is removed from the soft sheet 153 as shown in FIG. 18D, the head IC chip 80B is obtained.

The third method shown in FIGS. 19A through 19D uses a pallet 240 having a recess 241. The size of the recess 241 is greater than the size of the head IC chip 80 by 10 to 50 μm, so that approximately half of the head IC chip 80 can be accommodated within the recess 241.

Figure 19A:
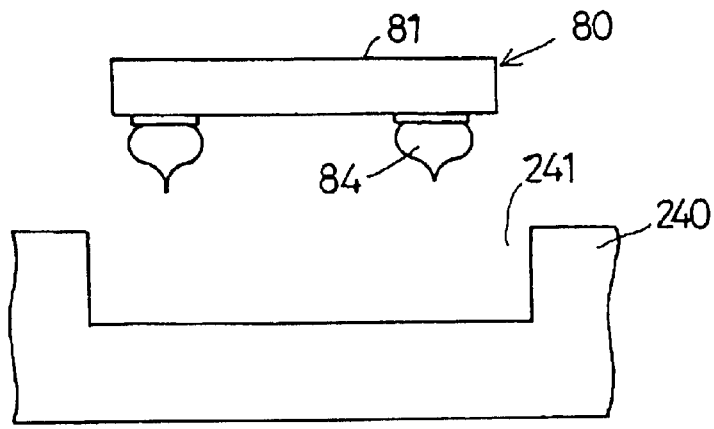
FIGS. 19A through 19D are cross sectional views for explaining a third method of producing the head IC chip shown in FIG. 16.
Figure 19B:
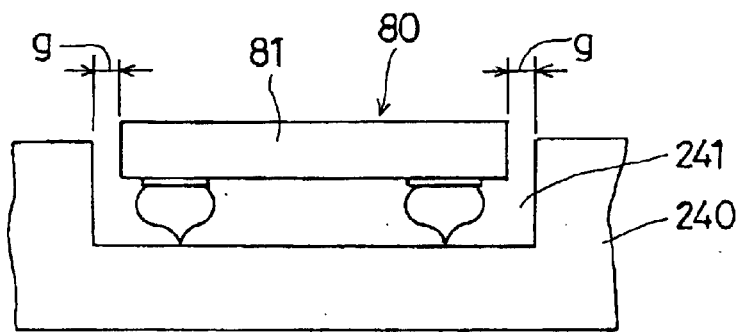

First, as shown in FIGS. 19A and 19B, the head IC chip 80 is accommodated face-down within the recess 241 of the pallet 240. In a direction along the height of the head IC chip 80, approximately half of the head IC chip 80 is accommodated within the recess 241. In addition, a gap g between the inner walls of the recess 241 and the peripheral side surfaces of the head IC chip 80 is approximately 10 to 50 μm.

Figure 19C:
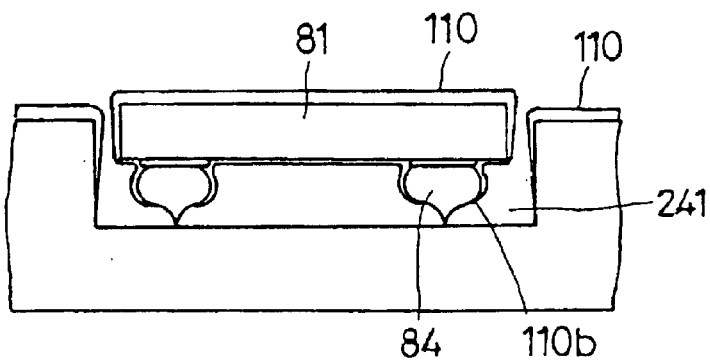
Figure 19D:
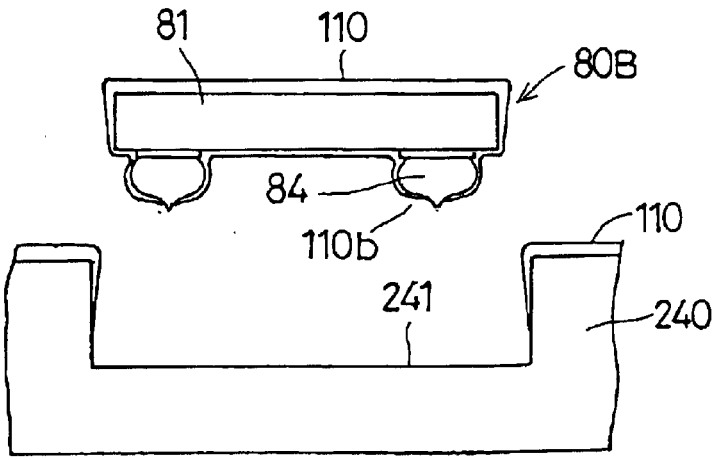

Next, a CVD is carried out as shown in FIG. 19C to form the poly(p-xylylene) layer 110. Since the gap g between the peripheral side surface of the head IC chip 80 and the inner walls of the recess 241 is 10 to 50 μm and extremely small, the radical monomers 127 shown in FIG. 6A cannot easily enter within the recess 241. For this reason, the poly(p-xylylene) layer 110 is formed to a desired thickness of 2 μm on the exposed top and peripheral side surfaces of the main chip body 81, and a thickness of a poly(p-xylylene) layer 110b which is formed on the surfaces of the bumps 84 located inside the recess 241 is suppressed to 1.4 μm which is approximately 30% thinner than the 2 μm poly(p-xylylene) layer 110. As shown in FIG. 19D, the head IC chip 80B is obtained by removing the head IC chip 80 from the recess 241 of the pallet 240.

A shear strength per bump was 25 g for a case where the head IC chip mounted on the suspension 51 of the head assembly 50A has the bumps 84 having a 2 μm poly(p-xylylene) layer formed on the surfaces of the bumps 84. On the other hand, when the 1.4 μm poly(p-xylylene) layer 110b is formed on the surfaces of the bumps 84 and the head IC chip 80B is mounted on the suspension 51 of the head assembly 50A as in this embodiment, the shear strength per bump became 40 g which is improved by over 60% compared to the above case.

Figure 20A:
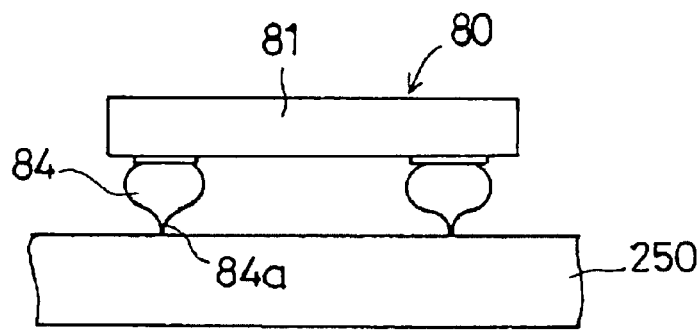
FIGS. 20A through 20D are cross sectional views for explaining a fourth method of producing the head IC chip shown in FIG. 16.
Figure 20B:
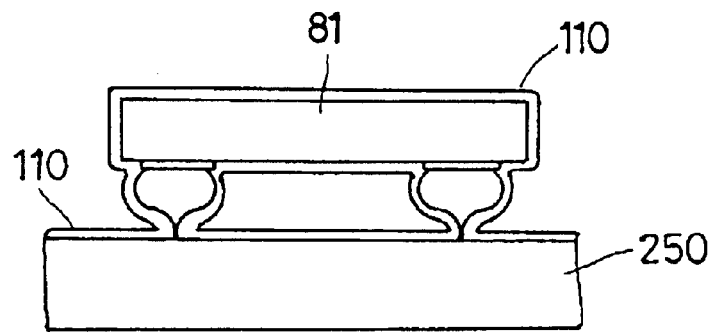
Figure 20C:
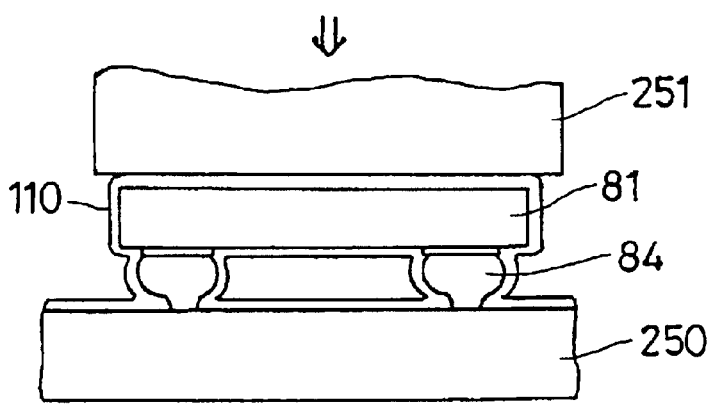

In the fourth method shown in FIGS. 20A through 20D, the head IC chip 80 having the bumps 84 with the pointed portions 84a which are not squashed, is prepared as shown in FIG. 20A. This head IC chip 80 is placed face-down on a glass plate 250. A CVD is carried out in this state, so as to form the poly(p-xylylene) layer 110 as shown in FIG. 20B. Then, the head IC chip 80 is pushed against the glass plate 250 by a ram 251 of a pressing machine, as shown in FIG. 20C. By pushing the head IC chip 80 against the glass plate 250, the pointed portions 84a of the bumps 84 are crushed and leveled, thereby breaking the portions of the poly(p-xylylene) layer 110 formed on the pointed portions 84a of the bumps 84.

Figure 20D:
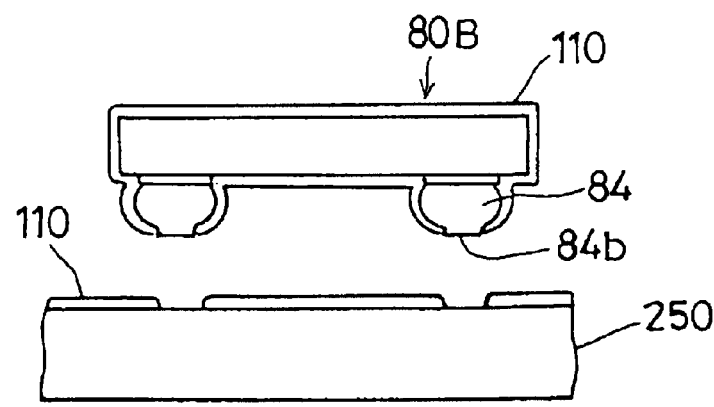

When the head IC chip 80 is removed from the glass plate 250, the head IC chip 80B is obtained as shown in FIG. 20D. In this head IC chip 80B, the main chip body 81 and the bumps 84 are covered by the poly(p-xylylene) layer 110, and planarized tip ends 84b of the bumps 84 are not covered by the poly(p-xylylene) layer 110 and the bump material is exposed at the tip ends 84b.

Of course, the first CVD may be carried out to form the poly(p-xylylene) layer 110 to a thickness smaller than the desired thickness which is finally to be obtained, and a second CVD may be carried out to make the poly(p-xylylene) layer 110 have the desired thickness after planarizing the pointed portions 84a of the bumps 84.

In the fifth method shown in FIGS. 21A through 21D, a stage 260 shown in FIG. 21A which is coated with a mold release agent 261 is prepared. In this embodiment, perfluoropolyether oil is used as the separation agent 261. The perfluoropolyether oil is a kind of polymer fluoric oil which is usable within the vacuum deposition chamber 123 shown in FIG. 6A. The head IC chip 80 is placed face-down on the stage 260, and is then separated from the stage 260, so that a mold release agent layer 261a is transferred onto the surfaces of the tip end portions of the bumps 84.

Next, as shown in FIG. 21B, the head IC chip 80 is placed face-down on a stage 262, and a CVD is carried out to form the poly(p-xylylene) layer 110. At the tip end portions of the bumps 84, the poly(p-xylylene) layer 110 is formed over the mold release agent layer 261a, and the adhesive strength of the poly(p-xylylene) layer 110 on the mold release agent layer 261a is weak such that the poly(p-xylylene) layer 110 on the mold release agent layer 261a can easily be removed by use of an adhesive tape.

As shown in FIG. 21C, the head IC chip 80 is held by adhering the main chip body 81 on an adhesive tape 263, and adhering the tip end portions of the bumps 84 on another adhesive tape 264.

Finally, the adhesive tape 264 is peeled off and removed as shown in FIG. 21D. As a result, the poly(p-xylylene) layer 110 on the tip end portions of the bumps 84 is removed together with the mold release agent layer 261a, thereby exposing the tip end portions of the bumps 84. Hence, the head IC chip 80B is obtained.

In the sixth method shown in FIGS. 22A through 22D, a solid resin such as a rosin oil is dissolved by a solvent such as isopropyl alcohol, and is coated on a stage 270 as a rosin oil coating 271 as shown in FIG. 22A. As will be described later, the rosin oil layer 271 can be removed by cleaning. The head IC chip 80 is placed face-down on the stage 270, and is then separated from the stage 270, so that a rosin oil layer 271a is transferred onto the tip end portions of the bumps 84.

Then, the head IC chip 80 is placed face-down on a stage 272 as shown in FIG. 22B, and a CVD is carried out to form the poly(p-xylylene) layer 110.

When the head IC chip 80 is removed from the stage 272 as shown in FIG. 22C, the poly(p-xylylene) layer 110 covers the rosin oil layer 271a at the bumps 84. In addition, the rosin oil layer 271a is exposed at the tip end portion of the bumps 84.

Finally, the head IC chip 80 is positioned face-up and cleaned by alcohol. As a result of this cleaning, the rosin oil layer 271a is dissolved and removed as shown in FIG. 22D, thereby exposing the tip end portions of the bumps 84. Therefore, the head IC chip 80B is obtained.

In the seventh method shown in FIGS. 23A and 23B, the process shown in FIG. 23A follows the process shown in FIG. 9E described above. As shown in FIG. 23A, a leveling glass plate 280 is pushed against the bumps 84 of the head IC chip group 165. Hence, the pointed portions 84a of the bumps 84 are crushed and leveled, thereby breaking the portions of the poly(p-xylylene) layer 110 formed on the pointed portions 84a of the bumps 84.

When the leveling glass plate 280 is lifted, a head IC chip group 1660 shown in FIG. 23B is obtained. In each of the head IC chips 80B arranged on the head IC chip group 1660, the tip ends 84b of the bumps 84 are not covered by the poly(p-xylylene) layer 110, and the bump material exposed at the tip ends 84b.

FIGS. 24A through 24D are cross sectional views for explaining another method of producing the head assembly.

As shown in FIGS. 24A and 24B, a head IC chip B0C has a second structure, including integrated circuits 82 and Al electrodes 83 which are formed on a lower surface 81a of a silicon main chip body 81. In addition, the entire main chip body 81 is covered by the poly(p-xylylene) layer 110.

According to this method, Au bumps 84A are formed on the suspension 51 instead of on the main chip body 81. As shown in FIG. 24C, the bumps 84A are formed on the corresponding electrodes 58 of the suspension 51. Each bump 84A has a pointed portion 84Aa.

As shown in FIG. 24D, ultrasonic waves are applied on the head IC chip 80C, so that the pointed portions 84Aa of the bumps 84A are squashed, and the electrodes 83 are bonded to the corresponding bumps 84A. During this ultrasonic bonding process, portions of the poly(p-xylylene) layer 110 covering the electrodes 83 are removed. Since the pointed portions 84Aa are formed at the tip ends of the bumps 84A, the portions of the poly(p-xylylene) layer 110 covering the electrodes 83 are more effectively removed.

Figure 25:
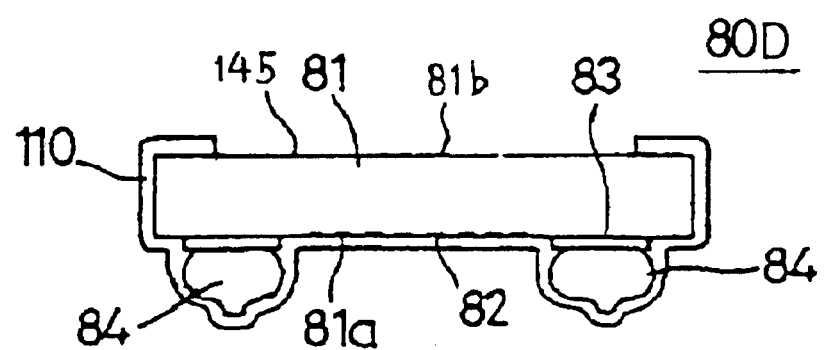
FIG. 25 is a cross sectional view showing a head IC chip having a third structure which may be used in the second embodiment.

In the second embodiment, it is also possible to use a head IC chip 80D shown in FIG. 25 having a third structure, in place of the head IC chip 80A shown in FIG. 7B.

In the head IC chip 80D shown in FIG. 25, a portion of the poly(p-xylylene) layer 110 is removed at the upper surface 81b of the main chip body 81, on the opposite side of the lower surface 81a. In other words, the upper surface 81b of the main chip body 81 is partially exposed.

An exposed portion 145 of the upper surface 81b may be formed by carrying out a plasma process, for example, on the portion of the upper surface 81b which is to be exposed, after forming the poly(p-xylylene) layer 110 on the entire surface of the main chip body 81.

When the head IC chip BOD operates and generates heat, the heat can be released directly to the surrounding air via the exposed portion 145 of the main chip body 81 where the upper surface 81b is exposed. Hence, compared to the case where the poly(p-xylylene) layer 110 is formed on the entire surface of the main chip body 81 as in the case of the head IC chip 80A shown in FIG. 8A, it is possible to achieve an improved heat release characteristic, particularly since the poly(p-xylylene) layer 110 is made of a resin material which in general does not have a good thermal conductivity.

As described above, the foreign particles are generated mainly due to the cracking or chipping of the main chip body 81 at corner portions thereof. For this reason, the problem of the foreign particles will not occur even if the poly(p-xylylene) layer 110 is not provided at the central portion on the upper surface 81b of the main chip body 81. In addition, it is possible to further provide an extremely thin heat sink on the exposed portion 145 of the main chip body 81.

FIGS. 26A through 26E are cross sectional views for explaining a method of producing the head IC chip 80D shown in FIG. 25.

Figure 26A:
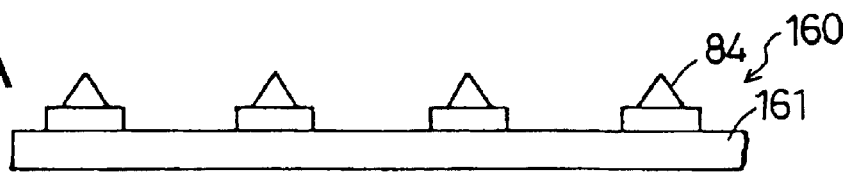
FIGS. 26A through 26E are cross sectional views for explaining a method of producing the head IC chip shown in FIG. 25.
Figure 26B:
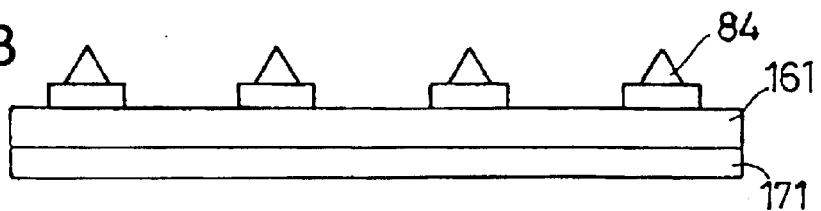
Figure 26C:
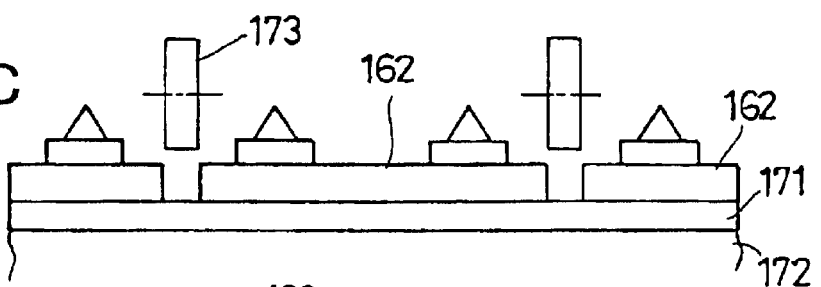

As shown in FIGS. 26A and 26B, a film 171 is adhered on a surface of a wafer structure 160 opposite to the surface provided with the bumps 84. Then, as shown in FIG. 26C, the wafer structure 160 is placed on a dicing table 172 so that the bumps 84 face upwards. A dicing saw 173 which rotates at a high speed is used to dice the wafer 161 into a plurality of chips 162 in an array. Each of the diced chips 162 remain bonded on the film 171 in the array.

Figure 26D:
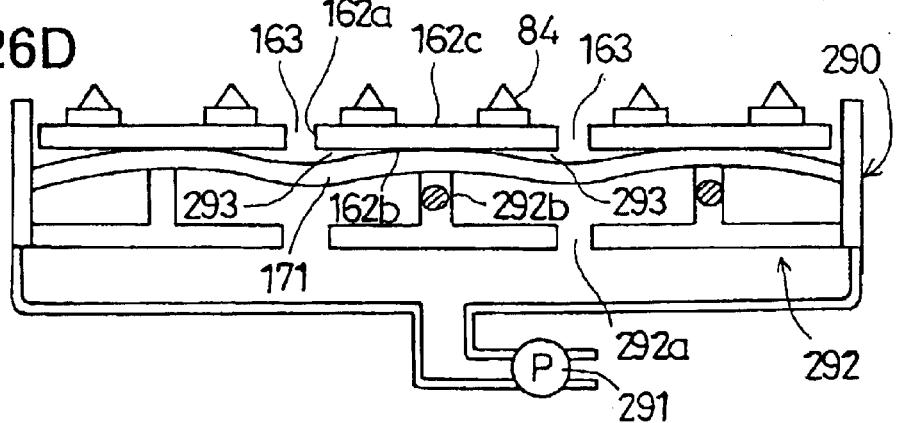

Next, the diced wafer 161 is fixed on a film suction unit 290 which is provided in a CVD apparatus, and the film 171 is sucked by the operation of a pump 291, as shown in FIG. 26D. The film suction unit 290 has a support plate member 292. This support plate member 292 includes a plurality of suction holes 292a, and cylindrical supports 292b. Each cylindrical support 292b supports the central portion of a corresponding one of the plurality of chips 162 which are arranged in the array.

When the pump 291 operates, each portion of the film 171 between the portions supported by the cylindrical supports 292b separates from the chip 162, as shown in FIG. 26D. In other words, when viewed from the top, the film 171 remains bonded on the central portion of a rectangular surface 162*b* of the chip 162, but the film 171 separates from peripheral portions of the rectangular surface 162*b*. As a result, spaces 293 are formed at the peripheral portions of the rectangular surface 162*b*, and the spaces 293 communicate to dicing grooves 163.

Figure 26E:
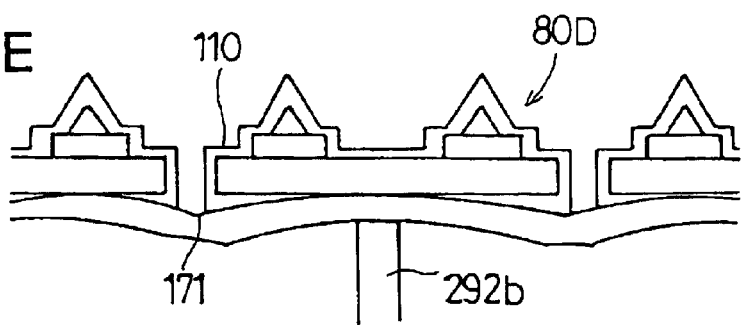

A CVD is carried out in the state shown in FIG. 26D. A gas passes through the dicing grooves 163 and reaches the spaces 293, so that the poly(p-xylylene) layer 110 is formed as shown in FIG. 26E. With respect to the rectangular surface 162*b* of the chip 162, the poly(p-xylylene) layer 110 is formed at the peripheral portions corresponding to the spaces 193, but are not formed at the central portion which is bonded to the film 171. Therefore, the head IC chip 80D shown in FIG. 25 is produced.

Figure 27:
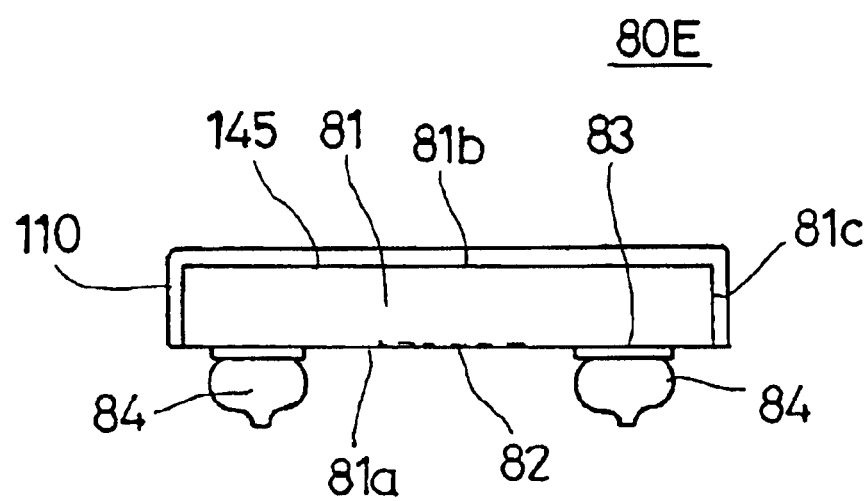
FIG. 27 is a cross sectional view showing a head IC chip having a fourth structure which may be used in the second embodiment.

In the second embodiment, it is also possible to use a head IC chip 80E shown in FIG. 27 having a fourth structure. In place of the head IC chip 80A shown in FIG. 7B.

In the head IC chip 80E shown in FIG. 27, the poly(p-xylylene) layer 110 is formed on the upper surface 81*b* and the peripheral side surfaces 81*c* of the main chip body 81, but is not formed on the lower surface 81*a* and the surfaces of the bumps 84.

FIGS. 28A through 28E are diagrams for explaining a method of producing the head IC chip 80E shown in FIG. 27.

Figure 28A:
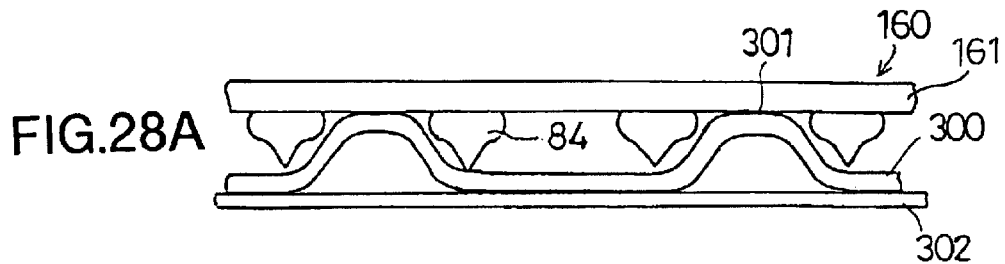
FIGS. 28A through 28E are diagrams for explaining a method of producing the head IC chip shown in FIG. 27.
Figure 28B:
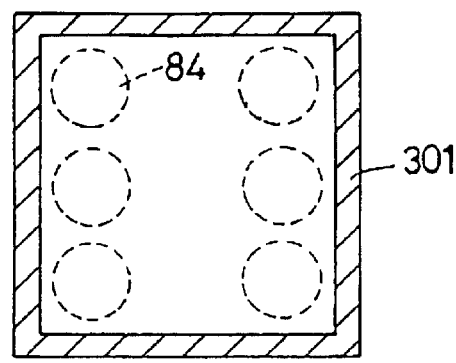

As shown in FIGS. 28A and 28B, a film 300 is adhered on the surface of the wafer structure 160 provided with the bumps 84. The film 300 has a waved shape so as to cover the bumps 84 but to also adhere to the portions 301 of the wafer structure 160 where the wafer 161 will be cut by a dicing saw. In other words, the film 300 covers each part of the wafer which will become the chip after the dicing process, in its entirety, so that the film 300 is adhered to the entire peripheral portion 301 of each such part of the wafer structure 160. As shown in FIG. 28B which shows a bottom view, each part of the wafer structure 160 which will become one chip 162 after the dicing process, has the film 300 adhered on the entire peripheral portion 301 thereof. In addition, the film 300 is adhered on another flat film 302 as shown in FIG. 28A.

Figure 28C:
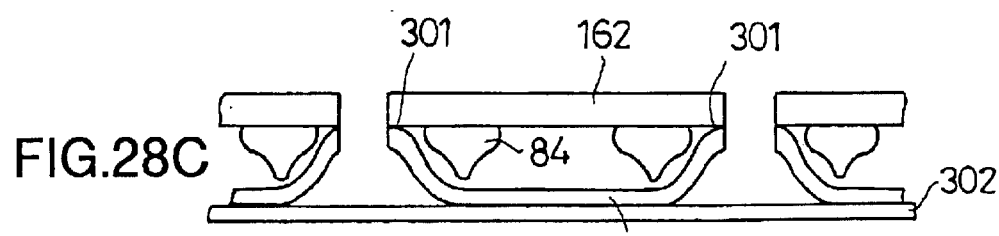

Next, a dicing saw is used to dice the wafer 161 and the film 300 in the array, so as to obtain a plurality of chips 162, as shown in FIG. 28C. The diced chips 162 remain bonded on the film 302. In addition, the lower surface 81*a* of each chip 162 is covered by the film 300.

Figure 28D:
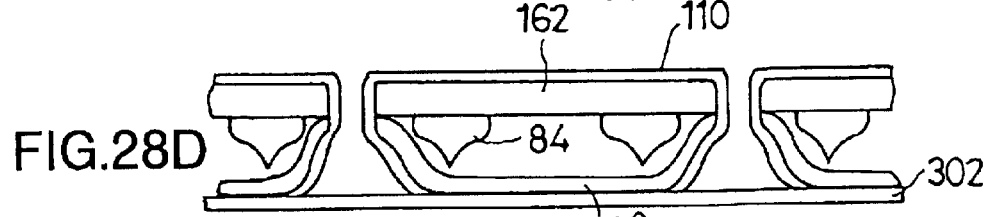

A CVD is carried out in the state shown in FIG. 28C, and as a result, the poly(p-xylylene) layer 110 is formed as shown in FIG. 28D. The poly(p-xylylene) layer 110 covers the upper surface 81*b* and the peripheral side surfaces 81*c* of each main chip body 81, but does not cover the lower surface 81*a*, as may be seen from FIG. 27.

Figure 28E:
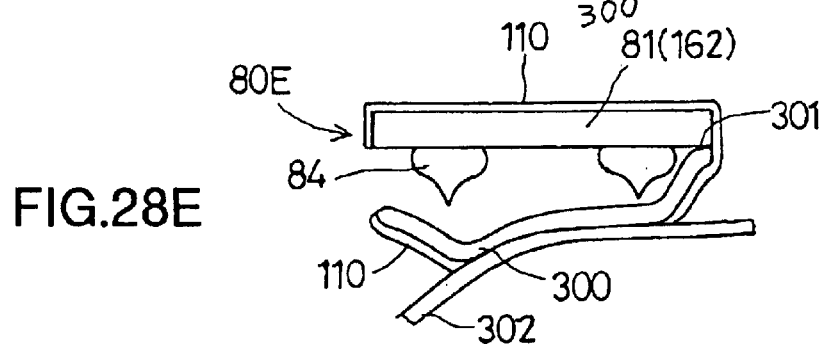

Finally, the film 302 is removed as shown in FIG. 28E. By removing the film 302, the film 300 is also removed from the lower surface 81*a* of each chip 162. Accordingly, the head IC chip 80E is obtained.

Figure 29:
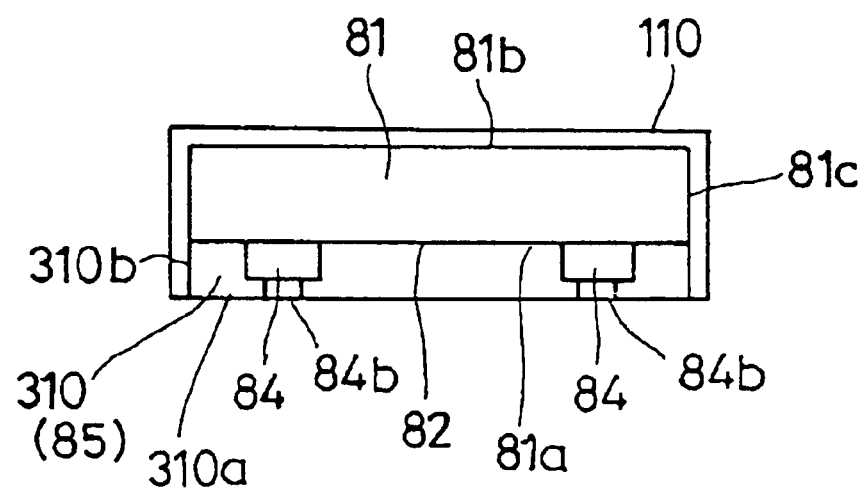
FIG. 29 is a cross sectional view showing a head IC chip having a fifth structure which may be used in the second embodiment.

In the second embodiment, it is also possible to use a head IC chip 80F shown in FIG. 29 having a fifth structure, in place of the head IC chip 80A shown in FIG. 7B.

In the head IC chip 80F shown in FIG. 29, an under-filling layer 301 is formed on the lower surface 81*a* of the main chip body 81. The planarized tip ends 84*b* of the bumps 84 are exposed at a flat lower surface 310*a* of the under-filling layer 310. Furthermore, the poly(p-xylylene) layer 110 is formed on the upper surface 81*b* and the peripheral side surfaces 81*c* of the main chip body 81, and on peripheral side surfaces 310*a* of the under-filing layer 310.

According to this head IC chip 80F, the integrated circuits 82 are protected by the under-filling layer 310. In addition, when this head IC chip 80F is mounted on the suspension 51, it becomes unnecessary to carry out the process of injecting the under-filling, thereby improving the production efficiency of the head assembly.

FIGS. 30A through 30F are cross sectional views for explaining a method of producing the head IC chip 80F shown in FIG. 29.

Figure 30A:
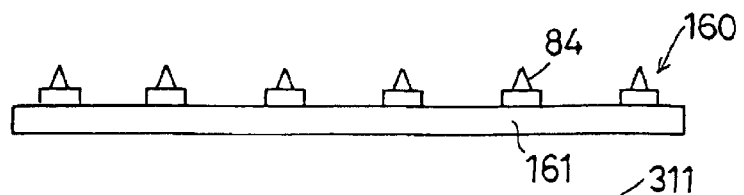
FIGS. 30A through 30F are cross sectional views for explaining a method of producing the head IC chip shown in FIG. 29.
Figure 30B:
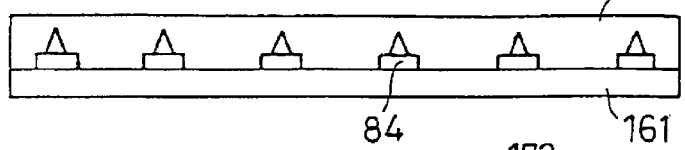

As shown in FIGS. 30A and 30B, an under-filling material made of a B-stage resin is spin-coated on the surface of the wafer structure 160 provided with the bumps 84, and the under-filling material is cured to form an under-filling layer 311 which completely covers the bumps 84. The B-staging is made to facilitate a latter process. The B-staging is made by applying predetermined heat if the under-filling material is made of a thermosetting resin, and is made by irradiating predetermined light if the under-filling material is made of a photo-curing resin. Further, if the under-filling material is made of a thermoplastic resin which is dissolved in a solution, the B-staging is made by volatilizing the solution.

Figure 30C:
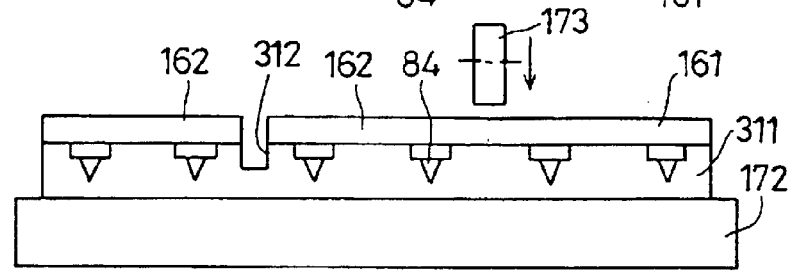

Next, as shown in FIG. 30C, the wafer structure 160 is turned over and is placed on a dicing table 172 with the under-filling layer 311 which has been subjected to the B-staging facing downwards. A dicing saw 173 which rotates at a high speed is used to dice the wafer 161 into a plurality of chips 162. The dicing is made to an intermediate thickness of the under-filling layer 311 which has been subjected to the B-staging. Hence, it is possible to prevent the dicing saw 173 from hitting the dicing table 172 and chipping, and to also prevent the individual diced chips 162 from coming apart. By this dicing process, a groove 312 is formed in the under-filling layer 311.

Figure 30D:
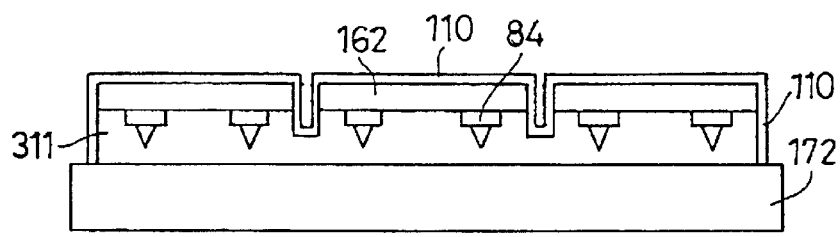

Thereafter, as shown in FIG. 30D, both the diced wafer 161 and the dicing table 172 are supplied to an evaporation chamber of a CVD apparatus, wherein a CVD is carried out to form the poly(p-xylylene) layer 110. The poly(p-xylylene) layer 110 is formed on the top and peripheral side surfaces of each chip 162, within the groove 312 of the under-filling layer 311 which has been subjected to the B-staging, and on the peripheral side surfaces of the under-filling layer 311 which has been subjected to the B-staging.

Figure 30E:
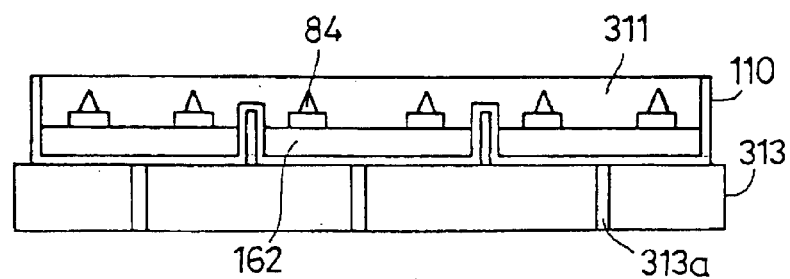

Then, the entire wafer structure 160 is turned over and is placed on a polishing table 313 of a polishing apparatus, as shown in FIG. 30E. Since each of the chips 162 is connected by the under-filling layer 311 which has been subjected to the B-staging, all of the chips 162 are turned over at the same time when the wafer structure 160 is turned over. In addition, the wafer structure 160 is sucked by vacuum via suction holes 313*a* in the polishing table 313, and held on the polishing table 313.

Figure 30F:
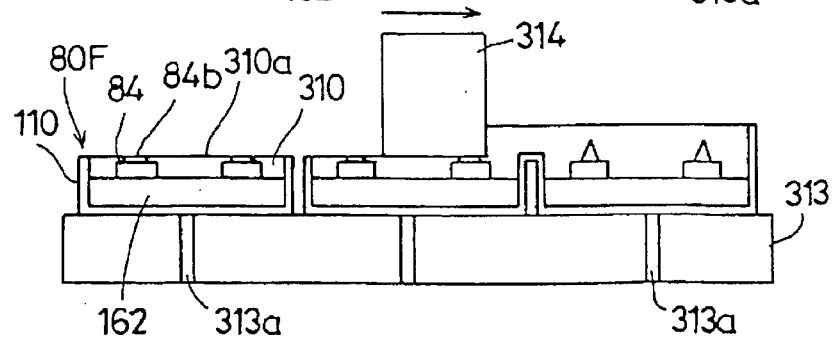

Finally, a polishing member 314 shown in FIG. 30F is used, while cleaning using pure water if necessary, so as to polish the under-filling layer 311 which has been subjected to the B-staging. The polishing is made to a depth so as to reach the bottom of the groove 312 and to expose the bumps 84. As a result, the head IC chip 80F shown in FIG. 29 is obtained.

The suction holes 313*a* in the polishing table 313 are provided in correspondence with each of the chips 162. Hence, each chip 162 is =positively held on the polishing table 313 by the vacuum suction, and the individual chips 162 are prevented from unwanted moving.

Figure 31:
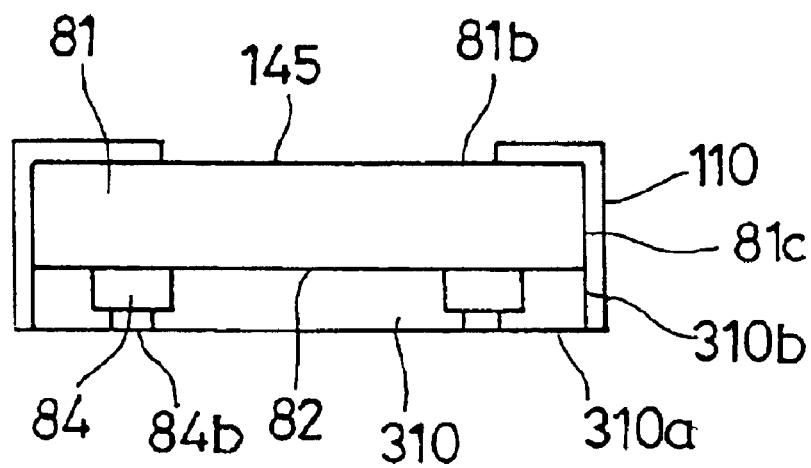
FIG. 31 is a cross sectional view showing a head IC chip having a sixth structure which may be used in the second embodiment.

In the second embodiment, it is also possible to use a head IC chip 80G shown in FIG. 31 having a sixth structure, in place of the head IC chip 80A shown in FIG. 7B.

The head IC chip 80G shown in FIG. 31 employs the sixth structure which is a combination of the third structure employed by the head IC chip 80D shown in FIG. 25 and the fifth structure employed by the head IC chip 80F shown in FIG. 29. The head IC chip 80G has an under-filling layer 310 on the lower surface 81a of the main chip body 81, and the planarized tip ends 84b of the bumps 84 are exposed at the flat lower surface 310a of the under-filling layer 310. In addition, the poly(p-xylylene) layer 110 is formed on the peripheral portions of the upper surface 81b of the main chip body 81, the peripheral side surfaces 81c of the main chip body 81, and the peripheral side surfaces 310b of the under-filling layer 310. An exposed portion 145 is provided at the central portion where the upper surface 81b of the main chip body 81 is exposed.

When the head IC chip 80G operates and generates heat, the heat can be released directly to the surrounding air via the exposed portion 145 of the main chip body 81 where the upper surface 81b is exposed. Hence, compared to the case where the poly(p-xylylene) layer 110 is formed on the entire surface of the main chip body 81 except on the side where the bumps 84 are formed, as in the case of the head IC chip 80F shown in FIG. 29, it is possible to achieve an improved heat release characteristic, particularly since the poly(p-xylylene) layer 110 is made of a resin material which in general does not have a good thermal conductivity.

As described above, the foreign particles are generated mainly due to the cracking or chipping of the main chip body 81 at corner portions thereof. For this reason, the problem of the foreign particles will not occur even if the poly(p-xylylene) layer 110 is not provided at the central portion on the upper surface 81b of the main chip body 81.

Figure 32:
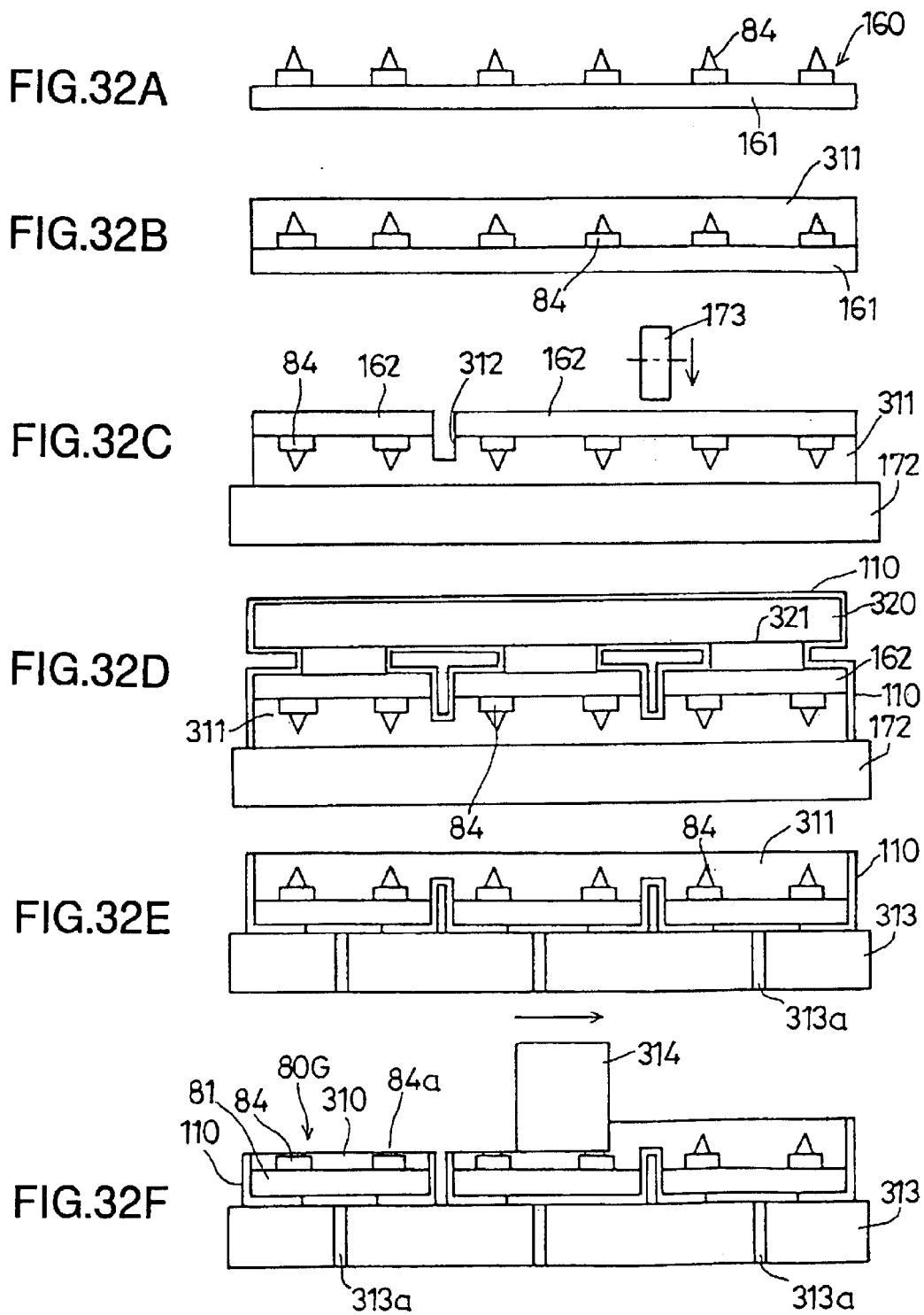
FIGS. 32A through 32F are cross sectional views for explaining a method of producing the head IC chip shown in FIG. 31.

FIGS. 32A through 32F are cross sectional views for explaining a method of producing the head IC chip 80G shown in FIG. 31. The processes shown in FIGS. 32A through 32F are basically the same as the process shown in FIGS. 30A through 30F, except for the CVD process. As shown in FIG. 32D, the CVD process is carried out in a state where a holding jig 320 holds the diced wafer 161 by pushing down against the wafer structure 160. Each projection 321 of the holding jig 320 contacts the central portion of the top surface of a corresponding chip 162, so that the poly(p-xylylene) layer 110 is not formed on the top surface at the central portion of the chip 162. The holding jig 320 is removed after carrying out the CVD process.

The bumps 84 will not be damaged even when the holding jig 320 pushes down against the wafer structure 160, because the under-filling layer 311 is provided.

Figure 33:
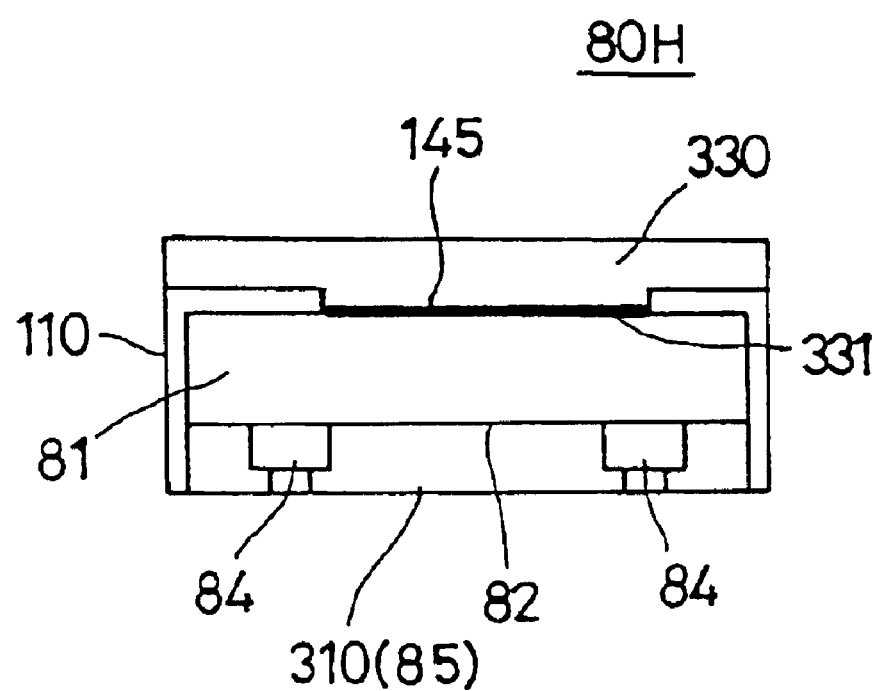
FIG. 33 is a cross sectional view showing a head IC chip having a seventh structure which may be used in the second embodiment.

In the second embodiment, it is also possible to use a head IC chip 80H shown in FIG. 33 having a seventh structure, in place of the head IC chip 80A shown in FIG. 7B.

The head IC chip 80H shown in FIG. 33 is similar to the head IC chip 80g having the sixth structure shown in FIG. 31, except that a radiator member 330 which is made of a metal having a good thermal conductivity is bonded on the exposed portion 145 of the upper surface 81b at the central portion of the main body 81 using an adhesive agent 331. The adhesive agent 331 includes an inorganic filler or a metal filler scattered within a resin, so as to have a good thermal conductivity.

The head IC chip 80H has a further improved heat release characteristic as compared to the head IC chip 80G shown in FIG. 31.

Figure 34A:
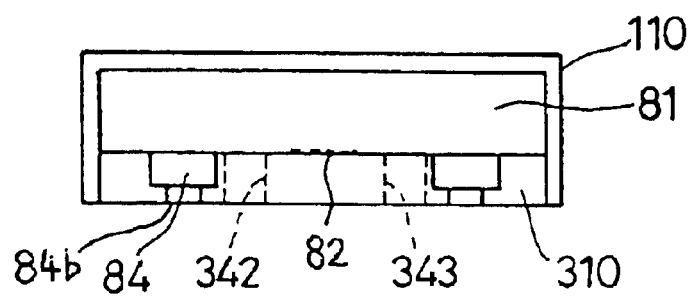
FIGS. 34A and 34B respectively are a cross sectional view and a bottom view showing a head IC chip having an eighth structure which may be used in the second embodiment.
Figure 34B:
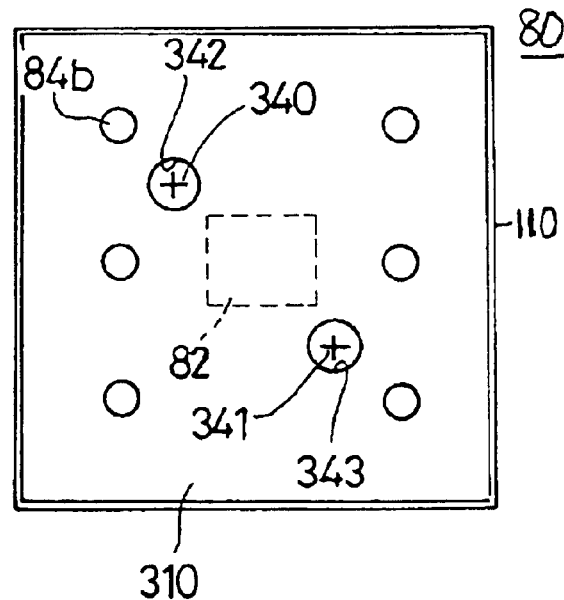

In the second embodiment, it is also possible to use a head IC chip 80I shown in FIGS. 34A and 34B having an eighth structure, in place of the head IC chip 80A shown in FIG. 7B.

FIG. 34A is a cross sectional view of the head IC chip 80I, and FIG. 34B is a bottom view of the head IC chip 80I.

Basically, the head IC chip 80I is a modification of the head IC chip 80F shown in FIG. 29. In the head IC chip 80I, alignment marks 340 and 341 are formed on the lower surface 81a of the main chip body 81. The alignment marks 340 and 341 are located on the outer side of the integrated circuit 82 at diagonal positions relative to the integrated circuit 82. Holes 342 and 343 are formed in the under-filling layer 310 which is provided on the lower surface 81a of the main chip body, at positions corresponding to the alignment marks 340 and 341. For example, the holes 342 and 343 may be formed by masking when forming the under-filling layer 310.

When the head IC chip 80I is viewed from the lower surface 81a of the main chip body 81, the alignment mark 340 is visible via the hole 342, and the alignment mark 341 is visible via the hole 343. Hence, the head IC chip 80I may be aligned with reference to the alignment marks 340 and 341 and positioned on the suspension 51 with a high accuracy.

Of course, it is possible to provide alignment marks directly on the under-filling layer 310. In addition, the alignment of the head IC chip 80I may be made by utilizing an X-ray imaging.

Figure 35A:
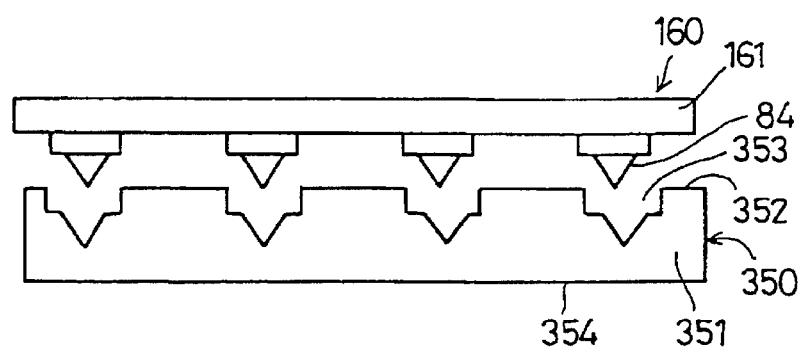
FIGS. 35A and 35B are cross sectional views for explaining a method which prevents unwanted moving of the head IC chips when a wafer structure is diced into head IC chips.
Figure 35B:
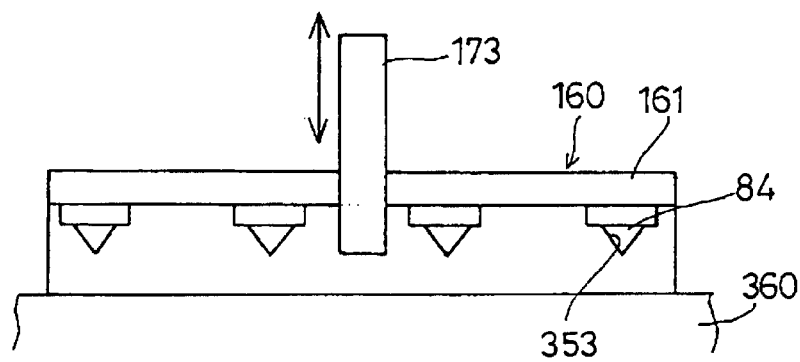

FIGS. 35A and 35B are cross sectional views for explaining a method which prevents unwanted moving of the head IC chips 81 when the wafer structure 160 having the bumps 84 is diced into the head IC chips 81.

In FIG. 35A, an adhesive film 350 is made up of a main film body 351, an adhesive layer 352 formed on a top surface of the main film body 351, and an adhesive layer 354 formed on a bottom surface of the main film body 351. The main film body 351 has recesses 353 formed at positions corresponding to the bumps 84. The size of each recess 353 is slightly larger than the size of the corresponding bump 84, and no adhesive layer 352 is formed on the inner walls of the recess 353.

As shown in FIG. 35B, each bump 84 is accommodated within the corresponding recess 353, and the lower surface of the wafer 161 is adhered on the adhesive film 350. Since each bump 84 is accommodated within the corresponding recess 353, the bumps 84 do not interfere with bonding of the lower surface of the wafer 161 on the adhesive film 350. The adhesive film 350 is adhered on a stage 360.

In the state shown in FIG. 35B, a dicing saw 173 is used to dice the wafer 161 into a plurality of head IC chips 81 which are arranged in an array. A force which urges the individual head IC chips 81 to move acts due to stress when the wafer 161 is diced. However, since the individual head IC chips 81 are securely adhered on the adhesive film 350 and maintained in this adhered state, the individual head IC chips 81 will not move in this embodiment.

After the dicing process ends, the head IC chips 81 are removed from the adhesive film 350, one by one, so as to be mounted on the suspension 51. But since the bumps 84 are not adhered on the adhesive film 350, the head IC chip 81 is easily separated from the adhesive film 350, and the bumps 84 will not accidentally be removed from the head IC chip 81 upon separation from the adhesive film 350.

Of course, a dicing apparatus may be provided with a holding part for holding the wafer structure 160 in position by pushing against the wafer structure 160. In this case, it is possible to prevent the diced head IC chips 81 from moving during the dicing process with respect to the wafer 161.

[Third Embodiment]

Figure 36A:
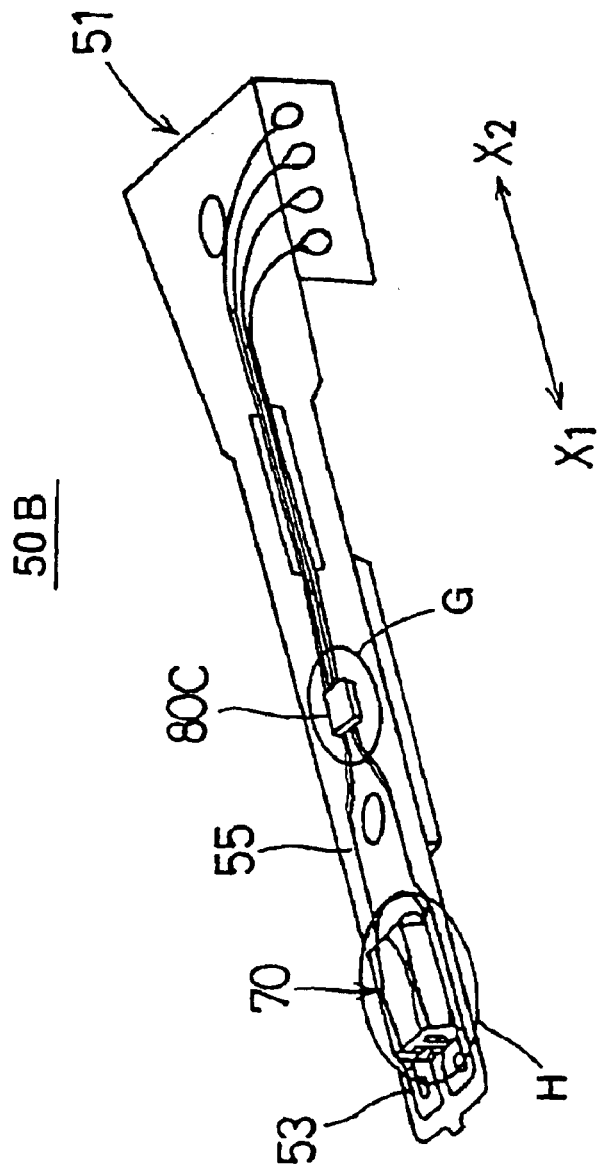
FIG. 36A is a perspective view showing a third embodiment of the head assembly according to the present invention.

FIG. 36A is a perspective view showing a third embodiment of the head assembly according to the present invention. In addition, FIG. 36B is a cross sectional view showing an encircled part G of the head assembly shown in FIG. 36A, and FIG. 36C is a perspective view showing an encircled part H of the head assembly shown in FIG. 36A.

Figure 36B:
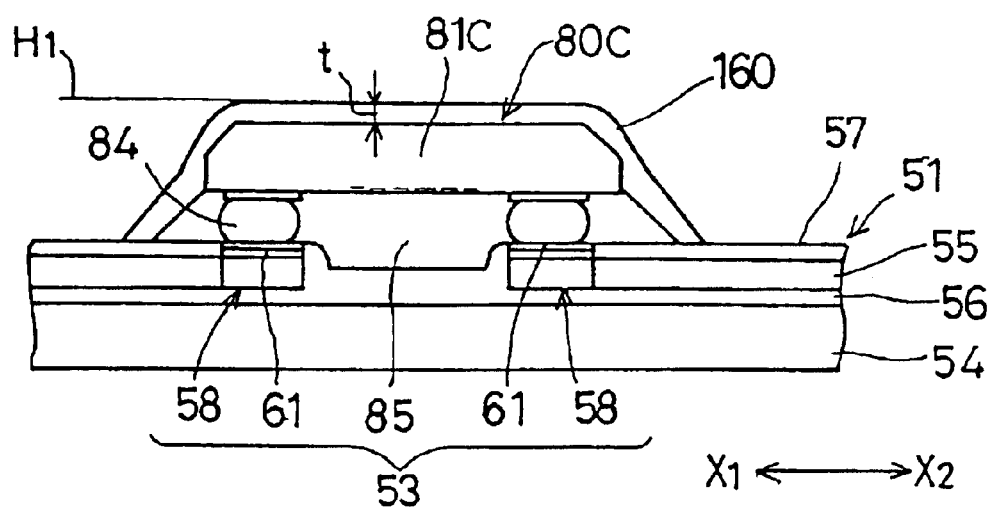
FIG. 36B is a cross sectional view showing an encircled part G of the head assembly shown in FIG. 36A.
Figure 37:
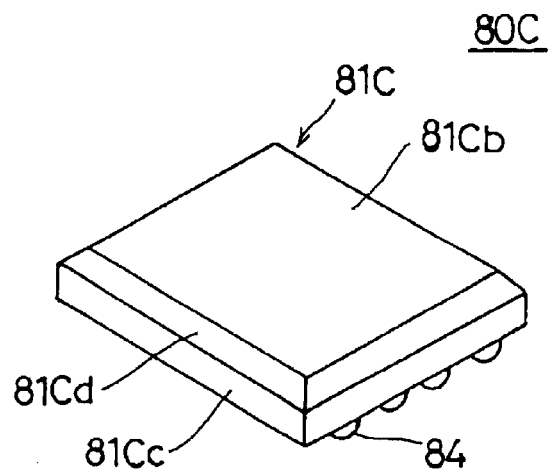
FIG. 37 is a perspective view showing a head IC chip shown in FIGS. 36A and 36B.

In a head assembly 50B shown in FIG. 36A, a head IC chip 80C has a structure shown in FIG. 37. FIG. 37 is a perspective view showing the head IC chip 80C shown in FIGS. 36A and 36B. As shown in FIG. 36B, the head IC chip 80C of the head assembly 50B includes a main chip body 81C. As may be seen from FIG. 37, the periphery of a rectangular upper surface 81Cb of the main chip body 81C is chamfered, such that a sloping surface 81Cd is formed between the upper surface 81Cb and each side surface 81Cc of the main chip body 81C.

Figure 36C:
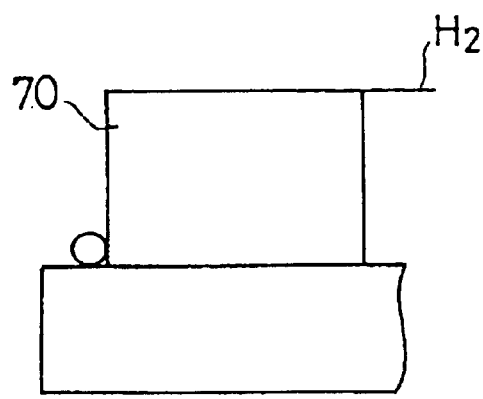
FIG. 36C is a perspective view showing an encircled part H of the head assembly shown in FIG. 36A.

Instead of using the poly(p-xylylene) layer 110 shown in FIG. 2D, this embodiment uses a low-viscosity ultraviolet-curing resin layer 160 shown in FIG. 36B. Otherwise, the head assembly 50B is basically the same as the head assembly 50 shown in FIG. 2A. In FIGS. 36A through 36C, those parts which are the same as those corresponding parts in FIGS. 2A through 2D are designated by the same reference numerals, and a description thereof will be omitted.

As will be described later, the low-viscosity ultraviolet-curing resin layer 160 is formed by dispensing a low-viscosity ultraviolet-curing resin from a dispenser, so that as shown on an enlarged scale in FIG. 36B, the low-viscosity ultraviolet-curing resin layer 160 covers the upper surface 81Cb, all of the sloping surfaces 81Cd and all of the side surfaces 81Cc of the main chip body 81C, and the peripheral side surfaces of the under-filling 85. A thickness t of the low-viscosity ultraviolet-curing resin layer 160 on the upper surface 81Cb of the main chip body 81C is less than 50 μm, and a height H1 of the surface of low-viscosity ultraviolet-curing resin layer 160 is lower than a height H2 of the top surface of the head slider 70. Accordingly, the head assembly 50B may be suitably applied to a hard disk unit, without the possibility of the head IC chip 80C hitting the hard disk.

Since the low-viscosity ultraviolet-curing resin layer 160 covers the upper surface 81Cb, all of the sloping surfaces 81Cd and all of the side surfaces 81Cc of the main chip body 81C, silicon powder or particles are prevented from separating from the main chip body 81C, thereby positively preventing the generation of the foreign particles.

The low-viscosity ultraviolet-curing resin used for the low-viscosity ultraviolet-curing resin layer 160 in this embodiment has the following characteristics. That is, the viscosity of the low-viscosity ultraviolet-curing resin is 700 cps and low. Further, the wetting of the low-viscosity ultraviolet-curing resin is good with respect to silicon, and the low-viscosity ultraviolet-curing resin layer 160 has a sufficient strength that can withstand cleaning. On the other hand, the wetting of the low-viscosity ultraviolet-curing resin is poor with respect to stainless steel. Furthermore, the low-viscosity ultraviolet-curing resin has a high purity, and the impurity content is low, such that the gas generated thereby is small.

More particularly, acrylic resins such as urethane acrylate and methacrylate may be used for the low-viscosity ultraviolet-curing resin.

Figure 38:
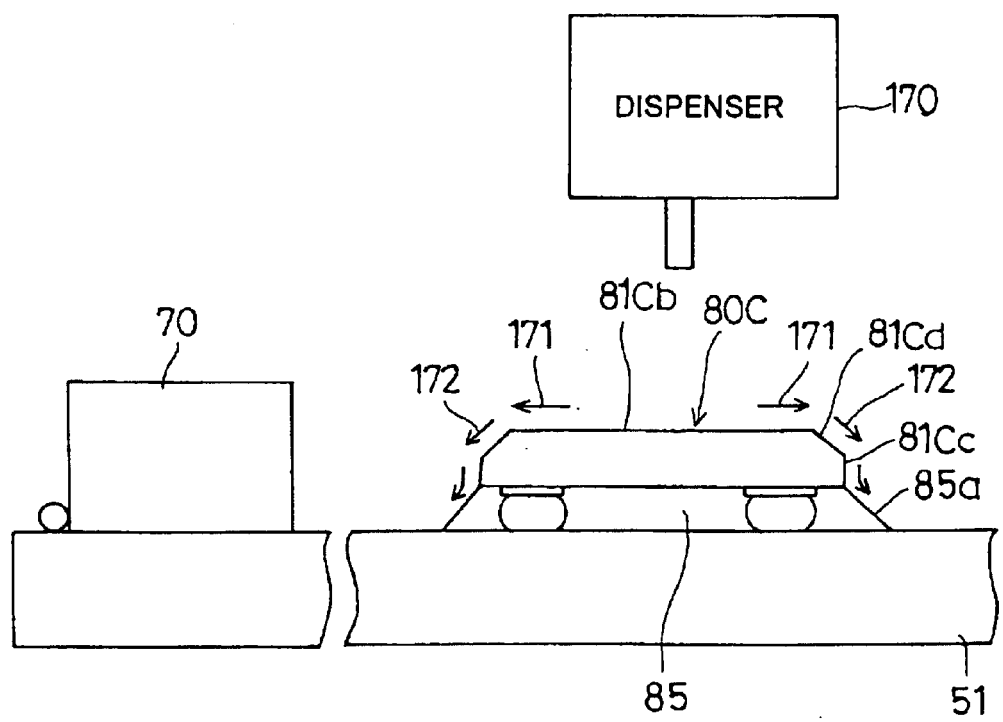
FIG. 38 is a diagram for explaining a method of forming an ultraviolet-curing resin layer shown in FIG. 36B.

FIG. 38 is a diagram for explaining a method of forming the ultraviolet-curing resin layer 160 shown in FIG. 36B. First, a high-precision dispenser 170 shown in FIG. 38 is used to dispense the low-viscosity ultraviolet-curing resin onto the central portion of the head IC chip 80C which is mounted on the suspension 51. For example, the low-viscosity ultraviolet-curing resin has a low viscosity of 700 cps, and the dispensing quantity of the dispenser 170 is controlled with a high precision. Since the viscosity of the low-viscosity ultraviolet-curing resin is 700 cps and low, the low-viscosity ultraviolet-curing resin spreads on the upper surface 81Cb of the main chip body 81 as indicated by arrows 171 in FIG. 38, flows down the sloping surfaces 81Cd as indicated by arrows 172, and spreads to the side surfaces 81Cc. As a result, the low-viscosity ultraviolet-curing resin covers the upper surface 81Cb, the sloping surfaces 81Cd and the side surfaces 81Cc of the main chip body 81C, and the flowing low-viscosity ultraviolet-curing resin finally covers the peripheral side surfaces 85a of the under-filling 85. The flow of the low-viscosity ultraviolet-curing resin is facilitated by the provision of the sloping surfaces 81Cd of the main chip body 81C. Thereafter, an ultraviolet ray is irradiated on the low-viscosity ultraviolet-curing resin to cure the low-viscosity ultraviolet-curing resin, to form the low-viscosity ultraviolet-curing resin layer 160. Therefore, it is possible to form, by a simple process, the low-viscosity ultraviolet-curing resin layer 160 which prevents generation of the foreign particles from the head IC chip 80C.

The head assembly 50A shown in FIG. 7A and the head assembly 50B shown in FIG. 36A may be assembled in the disk unit shown in FIGS. 5A and 5B, similarly to the head assembly 50 shown in FIG. 2A.

In each of the embodiments described above, it is possible to use a thermosetting resin in place of the photo-curing or ultraviolet-curing resin. For example, an epoxy resin may be used as the thermosetting resin.

In addition, the main chip bodies 81, 81A, 81B and 81C of the head IC chips 80, 80A, 80B and 80C may be made of a material other than silicon, such as GaAs.

Next, a description will be given of further important aspects of the present invention.

(1) When producing the head IC chip 80A shown in FIG. 7B according to the processes shown in FIGS. 10A through 10G, a method of producing a head IC chip which processes information read from and/or written to a recording medium and forms a part of a head assembly by being mounted thereon, desirably comprises the steps of:

forming a first layer on upper and lower surfaces of a wafer which has bumps formed on one of the upper and lower surfaces thereof;

dicing the wafer into a plurality of chips;

removing, by a chemical process, split or peeled portions of the first layer generated by the dicing; and forming a second layer on peripheral side surfaces of each of the chips which are arranged after the dicing.

According to this method of producing the head IC chip, it is possible to form the second layer having a high quality on the peripheral side surfaces of each of the chips, since this second layer is formed after removing the split or peeled portions of the first layer.

(2) When producing the head IC chip 80A shown in FIG. 7B according to the processes shown in FIGS. 11A through 11F, a method of producing a head IC chip which processes information read from and/or written to a recording medium and forms a part of a head assembly by being mounted thereon, desirably comprises the steps of:

forming a first layer on upper and lower surfaces of a wafer which has bumps formed on one of the upper and lower surfaces thereof;

removing the first layer on the wafer by a first width using a laser beam;

dicing the wafer into a plurality of chips by dicing with a second width which is smaller than the first width at portions which have the first width and no first layer formed thereon; and forming a second layer on peripheral side surfaces of each of the chips which are arranged after the dicing.

According to this method of producing the head IC chip, it is possible to form the second layer having a high quality on the peripheral side surfaces of each of the chips, since the split or peeled portions of the first layer will not be generated.

(3) When producing the head IC chip B0A shown in FIG. 7B according to the processes shown in FIGS. 11A through 11F, a method of producing a head IC chip which processes information read from and/or written to a recording medium and forms a part of a head assembly by being mounted thereon, desirably comprises the steps of:

forming a mask having a first width on upper and lower surfaces of a wafer which has bumps formed on one of the upper and lower surfaces thereof;

forming a first layer on the masked upper and lower surfaces of the wafer;

removing the mask to remove the first layer by the first width;

dicing the wafer into a plurality of chips by dicing with a second width which is smaller than the first width at portions which have the first width and no first layer formed thereon; and forming a second layer on peripheral side surfaces of each of the chips which are arranged after the dicing.

According to this method of producing the head IC chip, it is possible to form the second layer having a high quality on the peripheral side surfaces of each of the chips, since the split or peeled portions of the first layer will not be generated.

(4) When dicing the wafer 161 according to the processes shown in FIGS. 35A and 35B, a dicing apparatus which is used desirably comprises:

a holding member which holds a wafer by pushing down on the wafer, when dicing the wafer into a plurality of chips.

According to this dicing apparatus, it is possible to prevent the diced chips from moving during the dicing process.

(5) When dicing the wafer 161 according to the processes shown in FIGS. 35A and 35B, a method of dicing a wafer having bumps formed thereon desirably comprises the steps of:

preparing an adhesive film having recesses with size and position corresponding to those of the bumps, and having no adhesive layer formed on inner walls of the recesses; and dicing the wafer in a state where the bump is adhered on the adhesive film with the bumps accommodated within corresponding recesses of the adhesive film.

According to this method of dicing the wafer, the individual chips are maintained securely adhered on the adhesive film during and after the dicing, so as to prevent unwanted moving of the chips.

(6) A semiconductor part (head IC chip) shown in FIG. 31, having integrated circuits and bumps formed on a lower surface of a main chip body, desirably comprises;

an under-filling layer formed on the lower surface of the main chip body, so that tip ends of the bumps are exposed via a lower surface of the under-filling layer; and a layer covering a peripheral portion of an upper surface and peripheral side surfaces of the main chip body and peripheral side surfaces of the under-filling layer, so that a central portion of the upper surface of the main chip body is exposed.

According to this semiconductor part (head IC chip), it is possible to achieve an improved heat release characteristic as compared to a case where the entire surface of the main chip body is covered by a layer.

(7) A semiconductor part (head IC chip) shown in FIG. 33, having integrated circuits and bumps formed on a lower surface of a main chip body, desirably comprises:

an under-filling layer formed on the lower surface of the main chip body, so that tip ends of the bumps are exposed via a lower surface of the under-filling layer;

a layer covering a peripheral portion of an upper surface and peripheral side surfaces of the main chip body and peripheral side surfaces of the under-filling layer, so that a central portion of the upper surface of the main chip body is exposed; and a radiator member provided at the central portion of the upper surface of the main chip body.

According to this semiconductor part (head IC chip), it is possible to achieve a further improved heat release characteristic even when compared to a case where a portion on the upper surface of the main chip body is exposed.

(8) When producing the head IC chip 80 shown in FIG. 2D according to the processes shown in FIGS. 19A through 19D, a method of producing a head IC chip which processes information read from and/or written to a recording medium and forms a part of a head assembly by being mounted thereon, desirably comprises the steps of:

preparing a pallet having a recess with a size corresponding to that of a head IC chip;

accommodating the head IC chip in a face-down position in the recess so that bumps of the head IC chip are accommodated within the recess; and forming a layer on the head IC chip by evaporation in a state where the head IC chip is accommodated in the recess.

According to this method of producing the head IC chip, radical monomers cannot easily enter within the recess, thereby making it possible to form a thin layer on the surfaces of the bumps.

(8) When producing the head IC chip 80 shown in FIG. 2D according to the processes shown in FIGS. 221A through 22D, a method of producing a head IC chip which processes information read from and/or written to a recording medium and forms a part of a head assembly by being mounted thereon, desirably comprises the steps of:

adhering a soluble agent on tip ends of bumps of a head IC chip;

forming a layer on the entire head IC chip by evaporation; and dissolving and removing the soluble agent on the tip ends of the bumps and to expose the tip ends of the bumps.

According to this method of producing the head IC chip, it is possible to produce a head IC chip in which a main chip body is covered by a layer which does not cover the tip ends of the bumps, by a simple process.

(9) When producing the head assembly 80C according to the processes shown in FIGS. 24A through 24D, a method of producing a head assembly which is mounted with a head IC chip which processes information read from and/or written to a recording medium, desirably comprises the steps of:

providing bumps on a suspension; and placing a main chip body on the suspension, where the main chip body has a lower surface formed with integrated circuits and electrodes and a layer which covers the entire main chip body; and bonding the electrodes on the bumps by ultrasonic bonding.

According to this method of producing the head assembly, it is possible to mount the head IC chip on the suspension in a state where the layer is removed at portions corresponding to the bonding portions.

Next, a description will be given of bonding methods and apparatuses which are suited for producing the semiconductor parts, such as the head IC chips, described above. In other words, a description will be given of the bonding methods and apparatuses which are suited for bonding a semiconductor chip on a wiring board or substrate by ultrasonic bonding, particularly when a surface part of the semiconductor chip which is held is covered by a layer.

A brief background of the bonding techniques will be described first so as to facilitate understanding of embodiments of the bonding methods and apparatuses which will be described later.

As a kind of wireless bonding, the so-called flip-chip bonding is popularly employed when bonding a semiconductor chip on a wiring board or substrate. For example, bumps are formed on electrodes of the semiconductor chip, and the semiconductor chip is bonded face-down by matching the positions of the bumps with corresponding electrodes (or pad) on the wiring substrate which is made of ceramics, for example.

When employing the flip-chip bonding, the bumps formed on the electrodes of the semiconductor chip are normally made of a SnPb-based solder. After aligning the bumps with the corresponding electrodes on the wiring substrate, the bumps are heated and melted so as to bond the corresponding bumps and electrodes. The flip-chip bonding is an effective method of bonding the semiconductor chip when realizing a small semiconductor package.

For example, in the case of semiconductor chips which are used in a disk unit, to be mounted on a read/write printed circuit or on a suspension for supporting a head slider, it is necessary to reduce the inductance and electrostatic capacitance of a signal transmission path to increase the frequency of signals which are exchanged. Hence, it is desirable to provide a head IC chip and the head slider adjacent to each other in a compact arrangement, and the flip-chip bonding is a suitable method of achieving the necessary bonding.

Generally, a flip-chip bonding apparatus is provided with a transporting mechanism for sucking and transporting the semiconductor chip to a bonding position, and a bonding mechanism for bonding the bumps to the electrodes by heating and melting the bumps. Usually, the transporting mechanism and the bonding mechanism are independent mechanisms. In addition, the bonding mechanism normally carries out the heating by transferring heat from a heat source to the bumps.

However, when the bonding mechanism uses the heat source, stress fracture may be generated in the solder due to the thermal stress introduced by the heat from the heat source. The stress fracture of the solder causes deterioration in the reliability of the bonding, and in addition, materials usable for the solder becomes limited.

Hence, in order to eliminate such inconveniences, a face-down bonding was proposed in a Japanese Laid-Open Patent Application No.59-208844. According to this proposed face-down bonding, a face-down bonding apparatus (or bonder) uses ultrasonic vibration in place of using the heat from the heat source. By applying ultrasonic vibration to the semiconductor chip which is placed on a substrate to which the semiconductor chip is to be bonded. For example, the ultrasonic vibration may be applied via a vacuum suction nozzle which is mounted on a tip end of a horn provided with an ultrasonic radiator.

But when the proposed face-down bonding is applied to the bonding of a semiconductor chip which is entirely covered by a layer, as in the case of the head IC chip described above, a portion of the layer in contact with the vacuum suction nozzle may separate from the semiconductor chip during the ultrasonic bonding. Although the semiconductor chip makes the ultrasonic vibration substantially unitarily with the vacuum suction nozzle, the exposed edge portion of the vacuum section nozzle and the surface portion of the layer of the semiconductor chip in contact with the vacuum suction nozzle will undergo slightly different vibrations to be accurate. As a result, the surface portion of the layer of the semiconductor chip in contact with the vacuum suction nozzle may be scratched and damaged by the exposed edge portion of the vacuum suction nozzle, thereby causing the layer portion to become separated from the semiconductor chip during the ultrasonic bonding.

Accordingly, in the following embodiments of the bonding methods and apparatuses, measures are taken so as to prevent a portion of the layer covering the semiconductor chip from separating from the semiconductor chip.

A description will be given of a first embodiment of the bonding apparatus according to the present invention, by referring to FIGS. 39A through 44. This first embodiment of the bonding apparatus employs a first embodiment of the bonding method according to the present invention.

Figure 41:
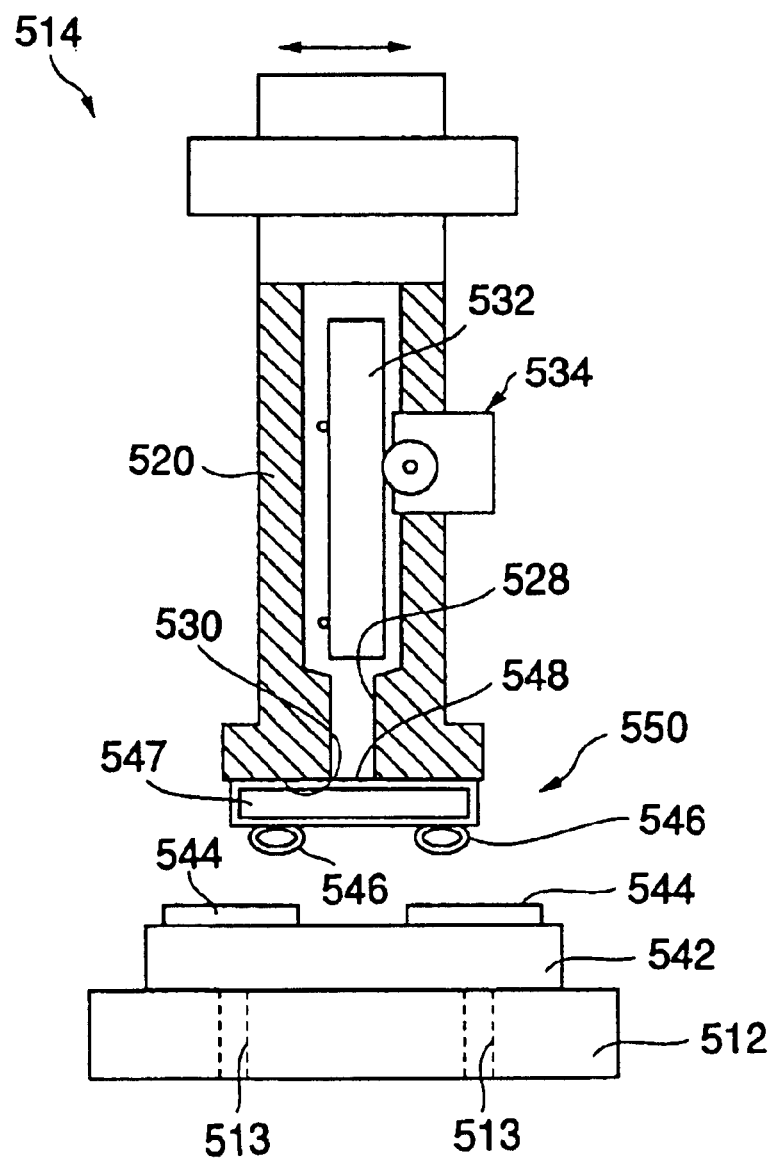
FIG. 41 is a diagram for explaining the transport of a semiconductor chip in the first embodiment of the bonding apparatus.
Figure 42:
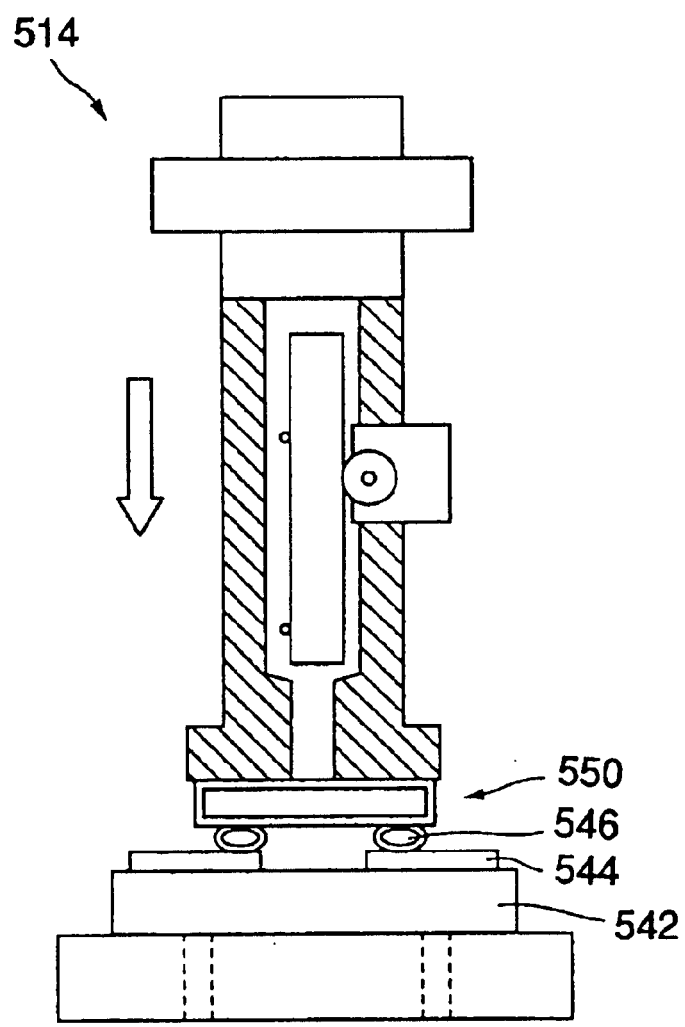
FIG. 42 is a diagram for explaining the positioning of the semiconductor chip in the first embodiment of the bonding apparatus.
Figure 43:
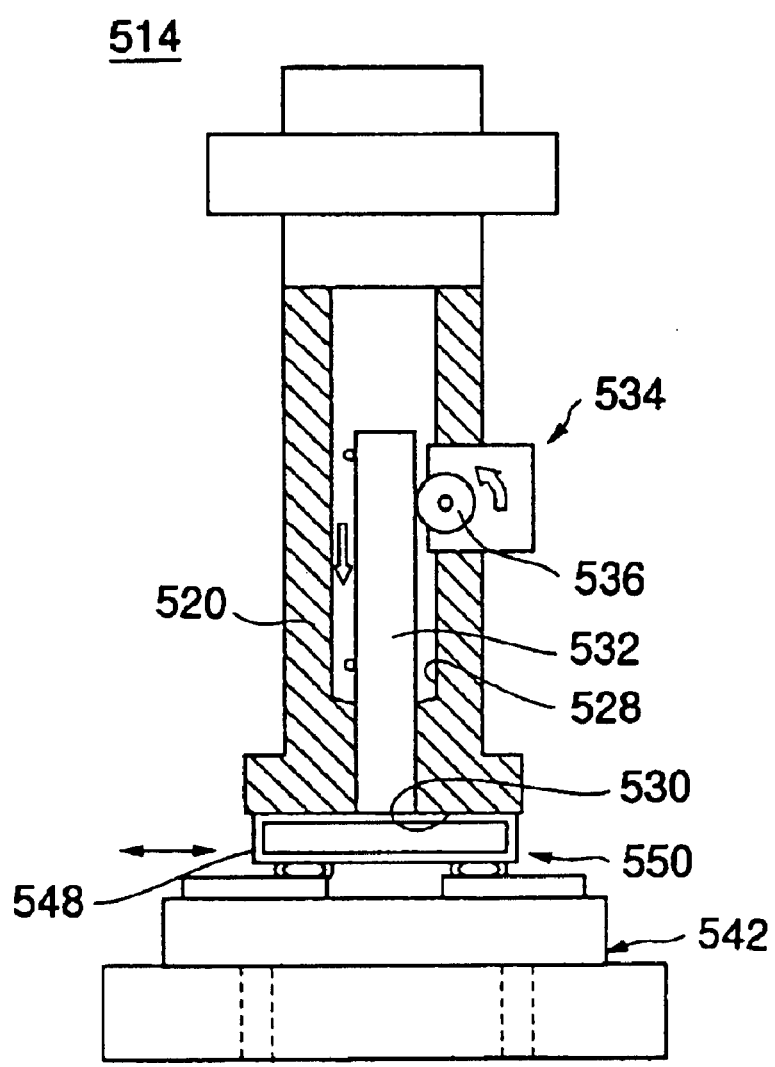
FIG. 43 is a diagram for explaining the ultrasonic bonding of the first embodiment of the bonding apparatus.
Figure 44:
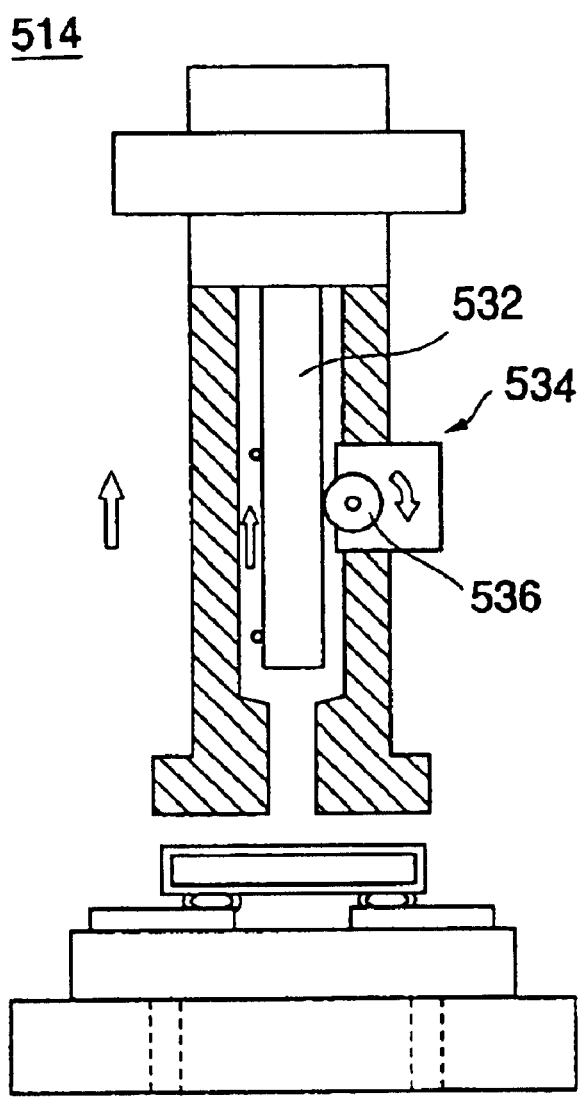
FIG. 44 is a diagram for explaining the operation of the closing member of the first embodiment of the bonding apparatus.
Figure 45:
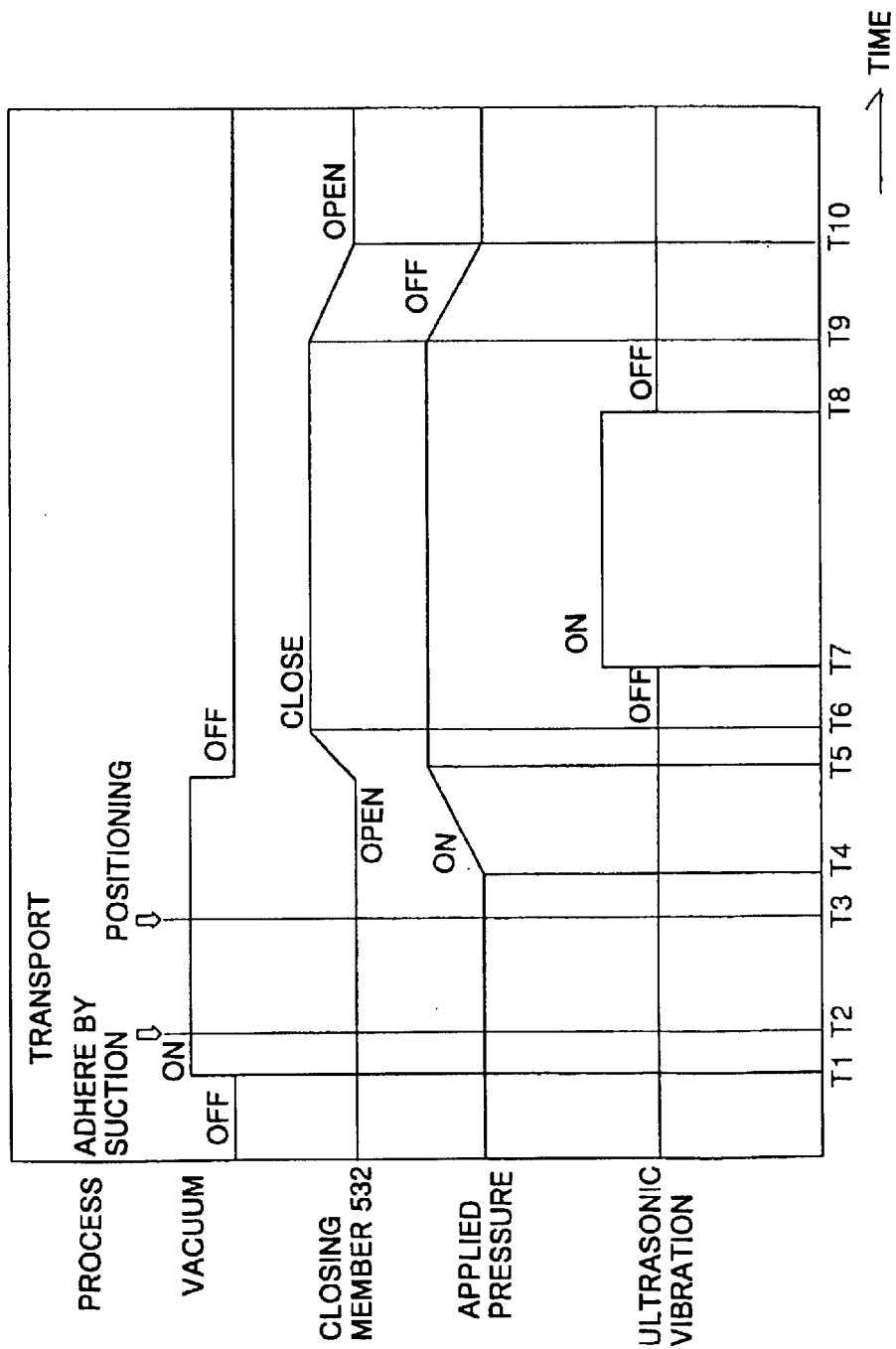
FIG. 45 is a time chart for explaining the operation of the first embodiment of the bonding apparatus.

FIGS. 39A and 39B respectively are a front view and a side view showing the first embodiment of the bonding apparatus. FIGS. 40A, 40B and 40C respectively are diagrams for explaining the operation of a closing member of the first embodiment of the bonding apparatus. FIG. 41 is a diagram for explaining the transport of a semiconductor chip in the first embodiment of the bonding apparatus. FIG. 42 is a diagram for explaining the positioning of the semiconductor chip in the first embodiment of the bonding apparatus. FIG. 43 is a diagram for explaining the ultrasonic bonding of the first embodiment of the bonding apparatus. FIG. 44 is a diagram for explaining the operation of the closing member of the first embodiment of the bonding apparatus. Further, FIG. 45 is a time chart for explaining the operation of the first embodiment of the bonding apparatus. In FIGS. 40A through 44, only parts of the bonding apparatus necessary to explain the respective operations are shown for the sake of convenience.

As shown in FIGS. 39A and 39B, a bonding apparatus (flip-chip bonder) 510 generally includes a stage 512, a bonding unit 514, and a control unit 516.

As shown in FIG. 41, the stage 512 includes suction holes 513. A substrate 542 which is placed on the stage 512 is held under section via the suction holes 513.

The bonding unit 514 includes a bonding head 518, a bonding tool 520 which hangs from the bonding head 518, and an ultrasonic radiator 522 which is provided integrally on the bonding tool 520. The bonding unit 514 movably engages a frame 523 of the bonding apparatus 510.

The bonding head 518 includes a loading and pressing mechanism 524 which is coupled to a power supply (not shown), and a vacuum valve 526 which is coupled to a vacuum source or pump (not shown). The loading and pressing mechanism 524 has a function of moving the bonding tool 520 up and down, and a function of measuring a pressing force applied on a semiconductor chip 550 when the bonding tool 520 is lowered and makes contact with the semiconductor chip 550.

As shown in FIG. 41, a suction hole 528 which communicates to the vacuum valve 526 is formed in the bonding tool 520 which has a generally box shape. An end surface 530 is provided at the lower end of the bonding tool 520, and the suction hole 528 opens at this end surface 530. As will be described later, the semiconductor chip 550 is adhered on this end surface 530 by suction.

As shown in FIG. 41, the semiconductor chip 550 includes a base substrate 547, bumps 546 formed on a surface of the substrate 547, and a layer 548 which covers the entire substrate 547 including the surface of the substrate 547 having the bumps 546. The substrate 547 is made of a material such as silicon and GaAs, but such a material easily cracks and chips. Hence, the layer 548 covers the substrate 547 to prevent foreign particles from being generated due to cracking and chipping of the substrate 547.

Of course, the layer 548 does not need to cover the entire substrate 547. For example, the layer 548 may only cover the surface of the substrate 547 which is held by the bonding tool 520. As described above, the layer 548 may be made of poly(p-xylylene), for example, and the layer 548 may be formed by evaporation. In addition, the bumps 546 formed on the semiconductor chip 550, and pads 544 which are formed on a wiring substrate 542 shown in FIG. 41, are both made of Au in this embodiment.

In addition, any one of the head IC chips described above may be used as the semiconductor chip 550.

As shown in FIGS. 40A and 40B, a closing member 532 is inserted into the suction hole 528. This closing member 532 is movable up and down by being driven by a closing member driving unit 534 which is provided on a side of the bonding tool 520. The operations of the closing member 532 and the closing member driving unit 534 will be described later.

The ultrasonic radiator 522 is fixed on the bonding tool 520. By making the ultrasonic radiator 522 oscillate, the bonding tool 520 generates and undergoes ultrasonic vibration.

The control unit 516 includes a central controller 516a, a controller 522a which controls the ultrasonic radiator 522, a controller 524a which controls the loading and pressing mechanism 524, a controller 526a which controls the vacuum valve 526, and a controller 534a which controls the closing member driving unit 534. The central controller 516a centrally controls the controllers 522a, 524a, 526a and 534a to control the general operation of the bonding apparatus 510.

Next, a description will be given of the operations of the closing member 532 and the closing member driving unit 534, by referring to FIGS. 40A through 40C.

As described above, the suction hole 528 which communicates to the vacuum source via the vacuum valve 526 shown in FIGS. 39A and 39B, is formed in the bonding tool 520. This suction hole 528 opens at the end surface 530 at the lower end of the bonding tool 520. The closing member 532 which is inserted into the suction hole 528, is movable up and down as a cam 536 is rotated by a motor (not shown) of the closing member driving unit 534. The opening at the end surface 530 is open when the closing member 532 is in a raised position shown in FIG. 40A, and is closed when the closing member 532 is in a lowered position shown in FIG. 40B.

The end surface of the closing member 532 has a flat shape, so that a single flat surface which does not include undulations is formed by the end surface 30 and the end surface of the closing member 532 which is in the lowered position. A pair of curved guides 538 are provided to guide the sliding movement of the closing member 532 without play. In addition, the motor and the cam 536 are accommodated within a case, and the side of the bonding tool 520 is closed. The end surface 530 has a sufficiently large size such that the bottom surface of the semiconductor chip 530 can be completely covered by the end surface 530, as shown in FIG. 40C.

Next, a description will be given of the bonding operation of this embodiment.

First, the substrate 542 is placed on the stage 512 with the side of the pads 544 facing up, as shown in FIG. 42. Then, the vacuum source is activated, and the vacuum vale 526 is opened to communicate the vacuum source and the suction hole 528. Hence vacuum is generated at a time T1 in FIG. 45. The semiconductor chip 550 which is entirely covered by the layer 548 is adhered under suction on the bonding tool 520 at a time T2 shown in FIG. 45. More particularly, the surface of the semiconductor chip 550 not provided with the bumps 546 contacts the end surface 530 of the bonding tool 520 under suction via the suction hole 528. In this state, the bonding unit 524 is moved horizontally by a moving mechanism (not shown), and the semiconductor chip 550 is transported to a predetermined bonding position where the semiconductor chip 550 is bonded on the substrate 542 which is placed on the stage 512, as shown in FIG. 41.

When the semiconductor chip 550 is transported to the predetermined bonding position, the loading and pressing mechanism 524 is activated at a time T3 shown in FIG. 45 to lower the bonding tool 520 and load the semiconductor chip 550. Hence, the bumps 546 of the semiconductor chip 550 contact the corresponding pads 544 on the substrate 542, and the semiconductor chip 550 is positioned. In this state, the substrate 542 is adhered on the stage 512 by suction via the suction holes 513.

Thereafter, the loading and pressing mechanism 524 starts to apply pressure on the semiconductor chip 550 as shown in FIG. 42, at a time T4 shown in FIG. 45. When the loading and pressing mechanism 524 detects that the applied pressure on the semiconductor chip 550 has reached a predetermined pressure, the loading and pressing mechanism 524 supplies a pressure detection signal to the central controller 516a of the control unit 516. In FIG. 45, the predetermined pressure is reached at a time T5. Responsive to the pressure detection signal, the central controller 526a supplies a drive start signal to the controller 534a which controls the closing member driving unit 534, so that the cam 536 of the closing member driving unit 534 rotates counter-clockwise in FIG. 43. As a result, the closing member 532 slides down, and the opening at the end surface 530 of the bonding tool 520 is closed by the closing member 532 at a time T6 shown in FIG. 45. Prior to closing the opening at the end surface 530, the vacuum source is stopped at the time T5, for example, so as to release the vacuum.

When the closing of the opening at the end surface 530 is detected in the state where the pressure is applied on the semiconductor chip 550, a close detection signal is supplied to the central controller 516a. Responsive to this close detection signal, the central controller 526a supplies an oscillation start signal to the controller 522a which controls the ultrasonic radiator 522, and the ultrasonic radiator 522 starts to oscillate at a time T7 shown in FIG. 45. As a result, the bonding tool 520 and the semiconductor chip 550 undergo ultrasonic vibration in the horizontal direction in FIG. 43, thereby melting and bonding the bumps 546 to the corresponding pads 544. The oscillation of the ultrasonic radiator 522 continues for a predetermined time, from the time T7 to a time T8 shown in FIG. 45. At the time T8, a stop signal is supplied to the controller 522*a* from the central controller 516*a*, to stop the oscillation of the ultrasonic radiator 522.

When the bonding of the corresponding bumps 546 and pads 544 is completed, the loading and pressing mechanism 524 is deactivated at a time T9 shown in FIG. 45, and the bonding tool 520 is raised. At the same time, the cam 536 of the closing member driving unit 534 rotates clockwise in FIG. 44, so as to raise the closing member 532 as shown. As a result, the opening at the end surface 530 of the bonding tool 520 is closed at a time T10 shown in FIG. 45, and the bonding unit 514 is moved back to the predetermined initial position shown in FIG. 41 by the moving mechanism, so as to wait for the next bonding operation.

According to the bonding apparatus 510, the opening in the end surface 530 of the bonding tool 520 is closed by the end of the closing member 532 so as to form a single flat surface when the bonding tool 520 presses against the surface of the semiconductor chip 550. Hence, even if the contacting surfaces of the bonding tool 520 and the semiconductor chip 550 slightly slide relative to each other when the two undergo the ultrasonic vibration, the layer 548 of the semiconductor chip 550 in contact with the end surface 530 of the bonding tool 520 will not be scratched or damaged by the edge defining the opening in the end surface 530. Therefore, the layer 548 is positively prevented from separating from the semiconductor chip 550.

Next, a description will be given of a second embodiment of the bonding apparatus according to the present invention, by referring to FIGS. 46 through 51. This second embodiment of the bonding apparatus employs a second embodiment of the bonding method according to the present invention. A description of those parts and functions of this second embodiment of the bonding apparatus, which are the same as the corresponding parts and functions of the first embodiment of the bonding apparatus described above, will be omitted.

Figure 46:
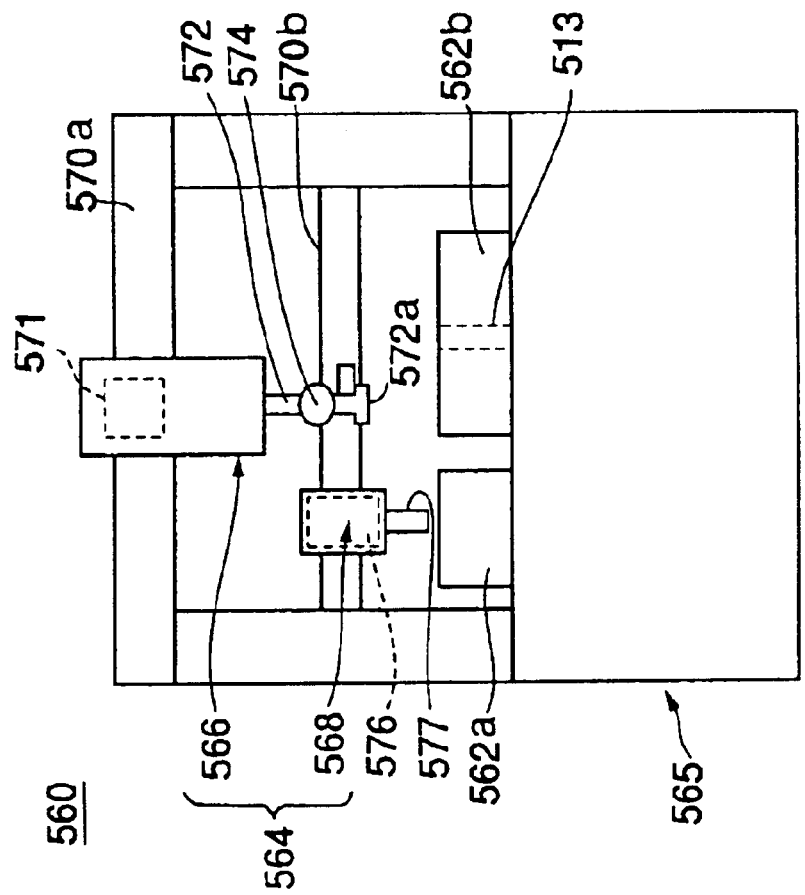
FIG. 46 is a front view showing a second embodiment of the bonding apparatus according to the present invention.
Figure 47:
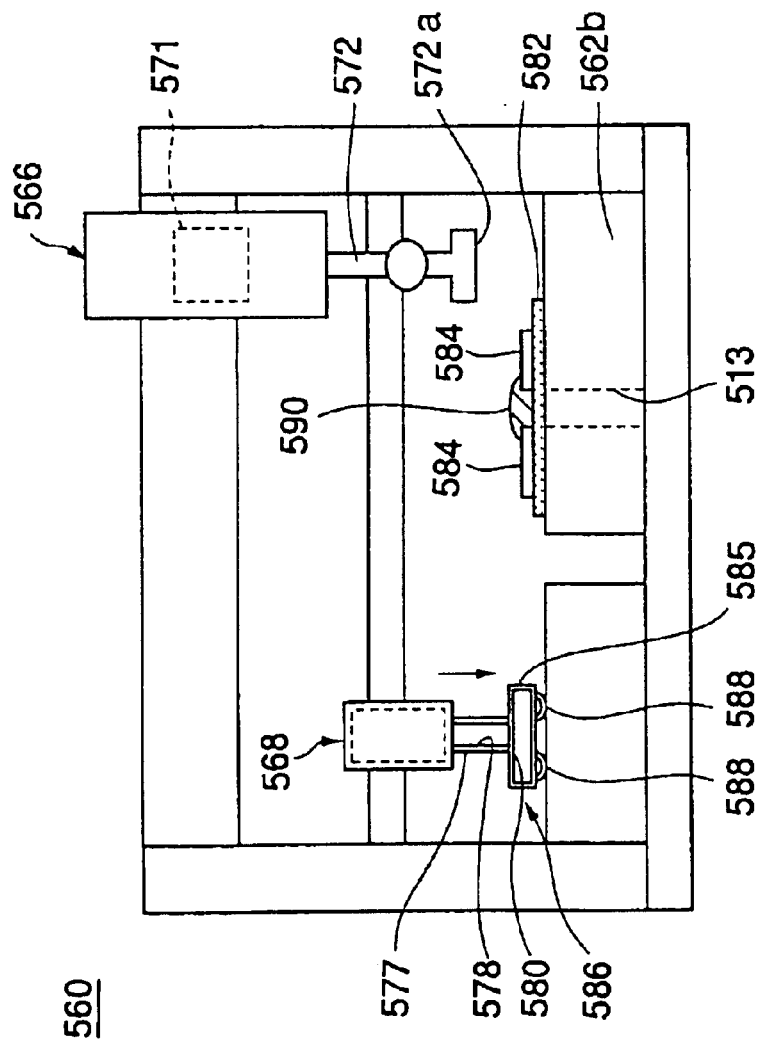
FIG. 47 is a front view for explaining the catching of the semiconductor chip in the second embodiment of the bonding apparatus.
Figure 48:
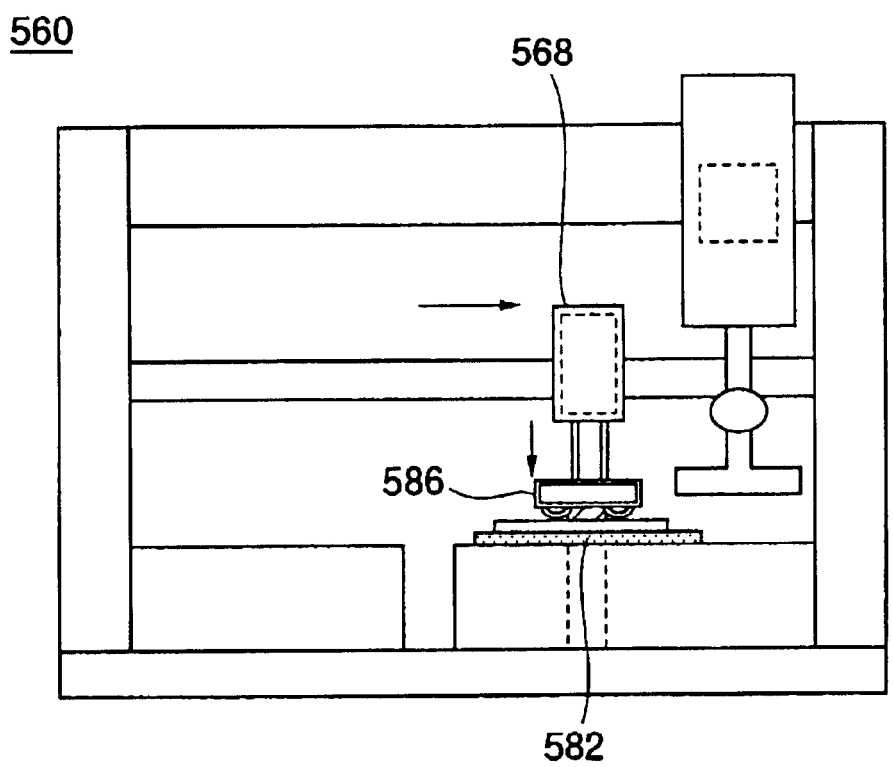
FIG. 48 is a front view for explaining the transport of the semiconductor chip in the second embodiment of the bonding apparatus.
Figure 49:
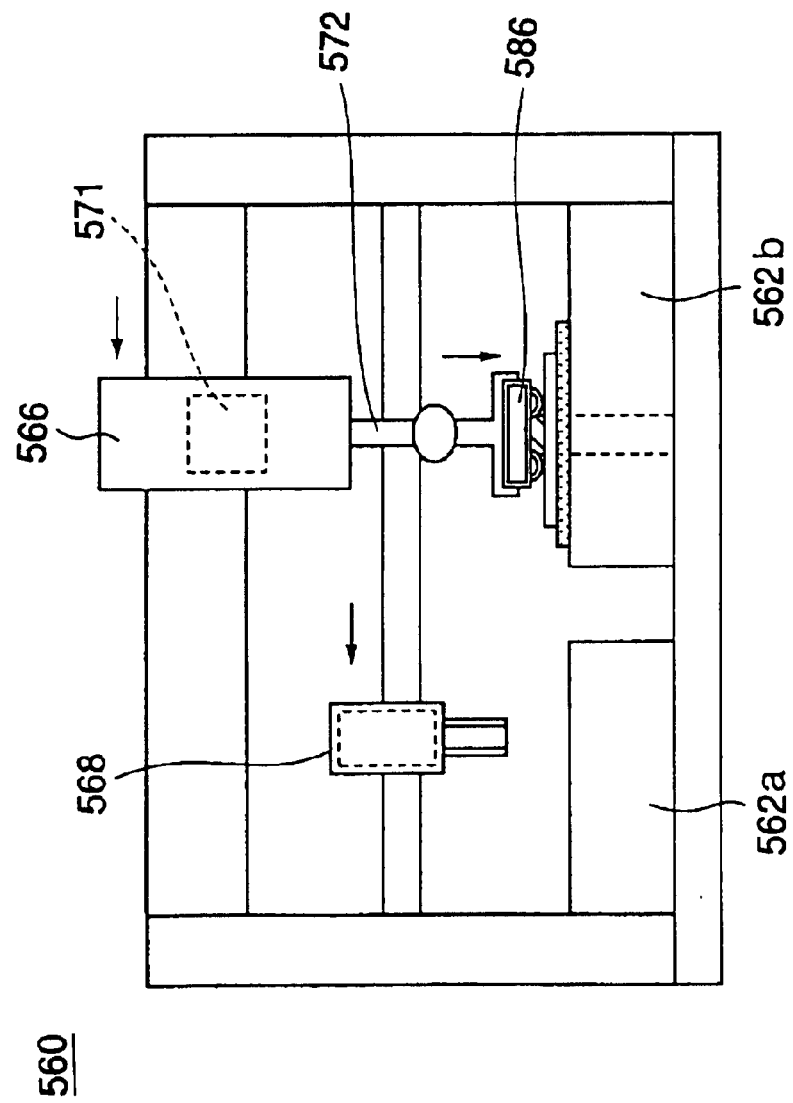
FIG. 49 is a front view for explaining the pressing of the semiconductor chip in the second embodiment of the bonding apparatus.
Figure 50:
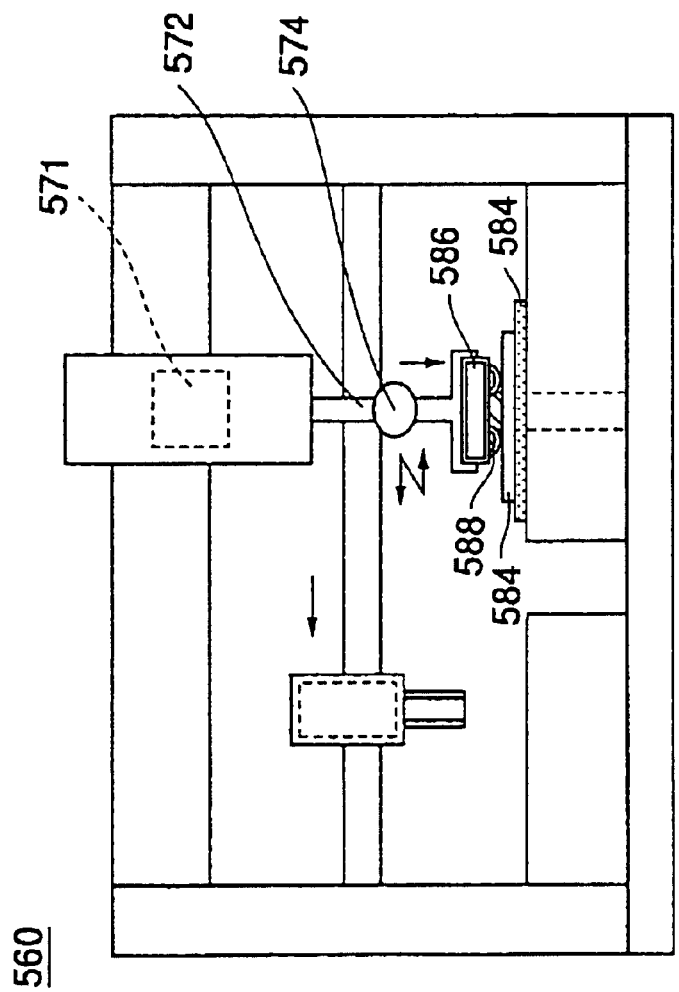
FIG. 50 is a front view for explaining the ultrasonic bonding in the second embodiment of the bonding apparatus.
Figure 51:
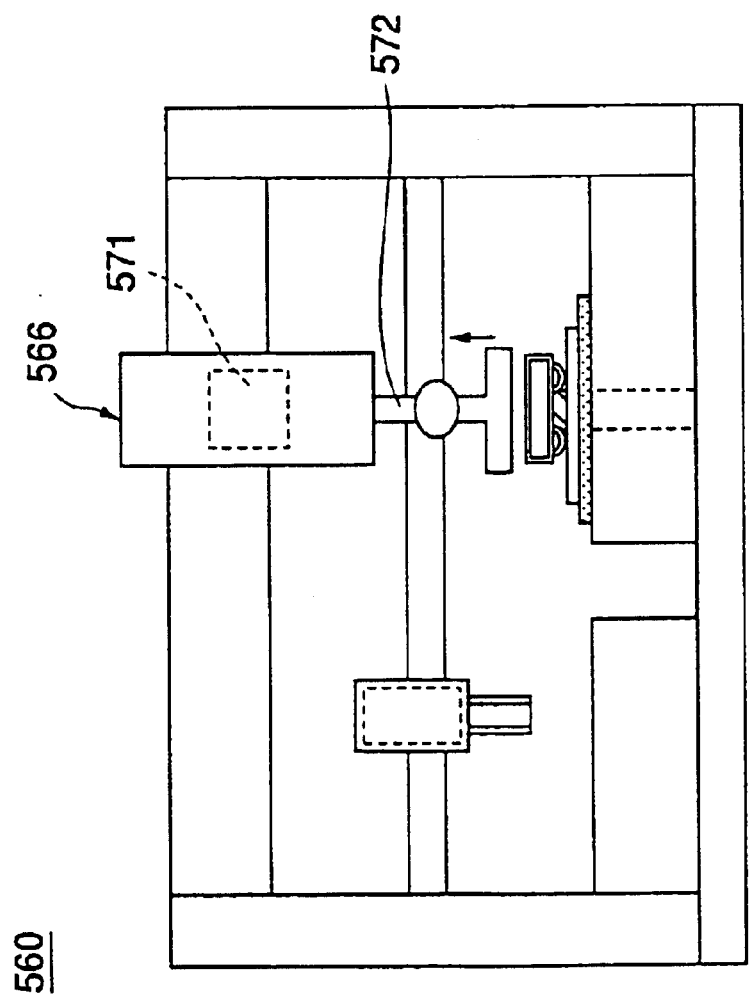
FIG. 51 is a front view for explaining the operation of a bonding tool after bonding in the second embodiment of the bonding apparatus.

FIG. 46 is a front view showing the second embodiment of the bonding apparatus. FIG. 47 is a front view for explaining the catching of the semiconductor chip in the second embodiment of the bonding apparatus. FIG. 48 is a front view for explaining the transport of the semiconductor chip in the second embodiment of the bonding apparatus. FIG. 49 is a front view for explaining the pressing of the semiconductor chip in the second embodiment of the bonding apparatus. FIG. 50 is a front view for explaining the ultrasonic bonding in the second embodiment of the bonding apparatus. Further, FIG. 51 is a front view for explaining the operation of a bonding tool after bonding in the second embodiment of the bonding apparatus.

As shown in FIG. 46, a bonding apparatus 560 includes a pair of stages 562*a* and 562*b*, a bonding unit 564, and a control unit 565.

A semiconductor chip 586 which is to be adhered on a bonding tool 572 and transported, is placed in advance on the stage 562*a*. On the other hand, the stage 562*b* corresponds to the stage 512 of the first embodiment of the bonding apparatus, and has suction holes 513. A substrate 582 is placed on the stage 562*b*.

Unlike the first embodiment of the bonding apparatus, the bonding unit 564 includes a bonding head 566 and a chip adhering and transport tool 568 which are independently provided. The bonding head 566 movably engages a frame 70*a* of the bonding apparatus 560, and the chip adhering and transport tool 568 movably engages a frame 70*b* of the bonding apparatus 560.

The bonding head 566 includes a loading a pressing mechanism 571, and is coupled to a power supply (not shown). In addition, an approximately box shaped bonding tool 572 hangs from the bonding head 566. The bonding tool 572 has a flat end surface 572*a* on the lower end thereof. An ultrasonic radiator 574 is provided on the bonding tool 572.

The chip adhering and transport tool 568 includes a vacuum valve 576 which communicates to a vacuum source or pump (not shown). A suction part 577 is provided on the lower end of the chip adhering and transport tool 568, and a suction hole 578 is provided in the suction part 577. One end of the suction hole 578 communicates to the vacuum valve 576, and the other end of the suction hole 578 opens at an end surface 580 of the suction part 577 as shown in FIG. 47. Hence, this embodiment does not use a closing member and a closing member driving unit.

The control unit 565 has a construction similar to that of the first embodiment of the bonding apparatus, and includes controllers provided in correspondence with each of the elements of the bonding apparatus 560.

Next, a description will be given of the bonding operation of this embodiment.

First, the substrate 582 is placed on the stage 562*b* with the side having the pads 584 facing up. The semiconductor chip 586 has bumps 588, and a layer 585 which covers the entire semiconductor chip 586. This semiconductor chip 586 is placed on the stage 562*a* with the side having the bumps 588 facing down, as shown in FIG. 47. In this state, the bonding head 566 is receded from a loading position of the substrate 582 and waits at a predetermined position, while the chip adhering and transport tool 568 is generally positioned immediately above a loading position of the semiconductor chip 586.

A tucking material 590 made of an epoxy resin or the like is provided on the substrate 582 as shown in FIG. 47. The tucking material 590 is used to hold the semiconductor chip 586 and the substrate 582 by adhering thereto, so that the semiconductor chip 586 and the substrate 582 will not move from a time when the semiconductor chip 586 is provisionally placed on the substrate 582 until a time when the chip adhering and transport tool 568 separates from the semiconductor chip 586 and the bonding tool 572 makes contact with the semiconductor chip 586 to position the semiconductor chip 586 on the substrate 582. The tucking material 590 may be thermally cured after the bonding process is completed, so that the cured tucking material 590 may be used as an under-filling. When providing the tucking material 590 on the substrate 582, the tucking material 590 is formed at positions avoiding the pads 584 so as not to interfere with the bonding of the bumps 588 and the pads 584.

When the substrate 582 and the semiconductor chip 586 are prepared, the chip adhering and transport tool 568 is lowered by an elevator mechanism (not shown), and the vacuum source or pump is activated so that the semiconductor chip 586 is adhered by suction onto the end surface 580 of the suction part 577, as shown in FIG. 47.

Next, the chip adhering and transport tool 568 is raised by the elevator mechanism, and is moved horizontally by a moving mechanism (not shown). Thus, the semiconductor chip 586 is transported to a predetermined bonding position above the stage 562*b* on which the substrate 582 is placed. Furthermore, the chip adhering and transport tool 568 is lowered by the elevator mechanism, and the semiconductor chip 586 is provisionally placed on the substrate 582. In this state, the bumps 588 on the semiconductor chip 586 contact the corresponding pads 584 on the substrate 582, as shown in FIG. 48. In addition, the semiconductor chip 586 and the substrate 582 are adhered together by the tucking material 590, so as to prevent the semiconductor chip 586 and the substrate 582 from moving relative to each other.

Thereafter, the vacuum source or pump is deactivated, and the chip adhering and transport tool 568 is raised by the elevator mechanism. In addition, the chip adhering and transport tool 568 is moved horizontally by the moving mechanism, so as to recede from the position above the semiconductor chip 586 and to return to a predetermined position above the stage 562a. At the same time, the bonding head 566 is moved horizontally by a moving mechanism (not shown), to a position immediately above the semiconductor chip 586 on the stage 562b. The loading and pressing mechanism 571 is also activated so as to lower the bonding tool 572, and the flat end surface 572a of the bonding tool 572 makes contact with the surface of the semiconductor chip 586 opposite the surface provided with the bumps 588, as shown in FIG. 49. The end surface 572a has a sufficiently large size so as to completely cover the surface of the semiconductor chip 586 in contact therewith.

The loading and pressing mechanism 571 applies pressure on the semiconductor chip 586 until the applied pressure reaches a predetermined value. Then, oscillation of the ultrasonic radiator 574 is started. As a result, the bumps 588 and the corresponding pads 584 are melted and bonded together as shown in FIG. 50 by the ultrasonic vibration in the horizontal direction caused by the oscillation of the ultrasonic radiator 574.

When the bonding is completed, the loading and pressing mechanism 571 is deactivated, and the bonding tool 572 is raised as shown in FIG. 51. Further, the bonding head 566 returns to the predetermined initial position, and waits for the next bonding operation.

According to the bonding apparatus 560, the flat end surface 572a of the bonding tool 572 presses against the surface of the semiconductor chip 586. Hence, even if the contacting surfaces of the bonding tool 572 and the semiconductor chip 586 slightly slide relative to each other when the two undergo the ultrasonic vibration, the layer 585 of the semiconductor chip 586 in contact with the end surface 572a of the bonding tool 572 will not be scratched or damaged by the end surface 572a. Therefore, the layer 585 is positively prevented from separating from the semiconductor chip 586.

Next, a description will be given of a third embodiment of the bonding apparatus according to the present invention, by referring to FIGS. 52 through 56. This third embodiment of the bonding apparatus employs a third embodiment of the bonding method according to the present invention. A description of those parts and functions of this third embodiment of the bonding apparatus, which are the same as the corresponding parts and functions of the first and second embodiments of the bonding apparatus described above, will be omitted.

Figure 52:
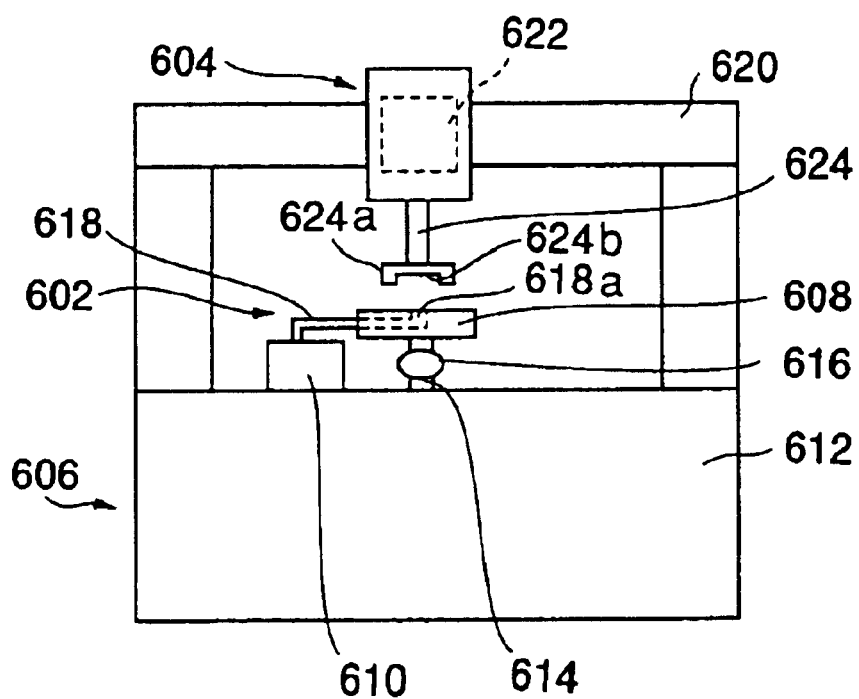
FIG. 52 is a front view showing a third embodiment of the bonding apparatus according to the present invention.
Figure 53:
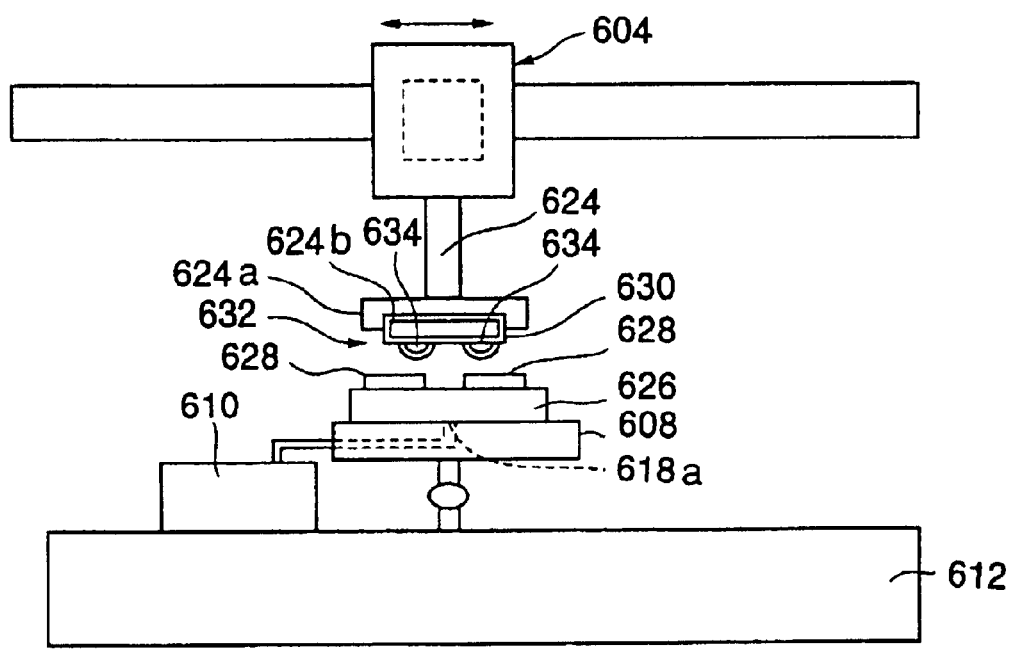
FIG. 53 is a front view for explaining the operation of a bonding head in the third embodiment of the bonding apparatus.
Figure 54:
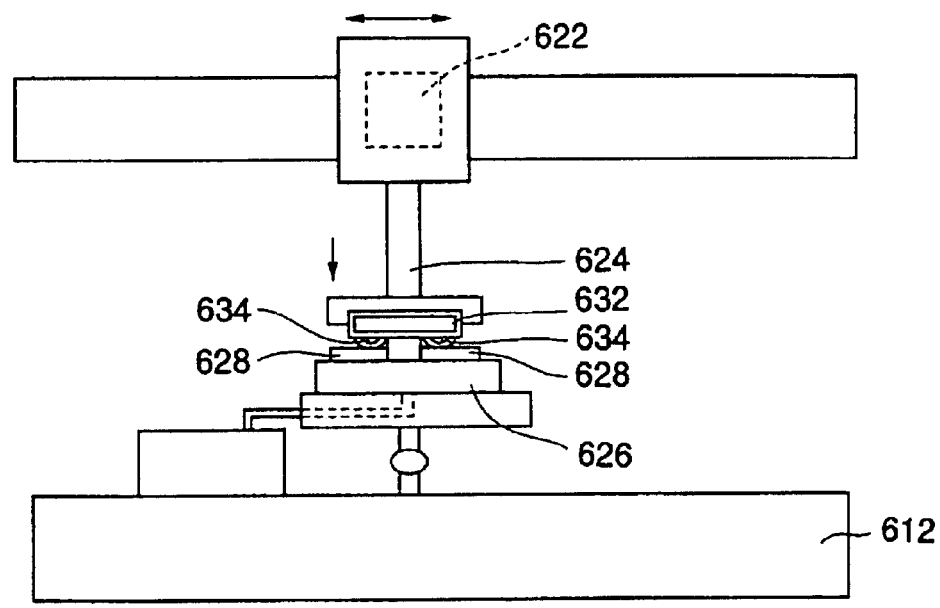
FIG. 54 is a front view for explaining the pressing of the semiconductor chip in the third embodiment of the bonding apparatus.
Figure 55:
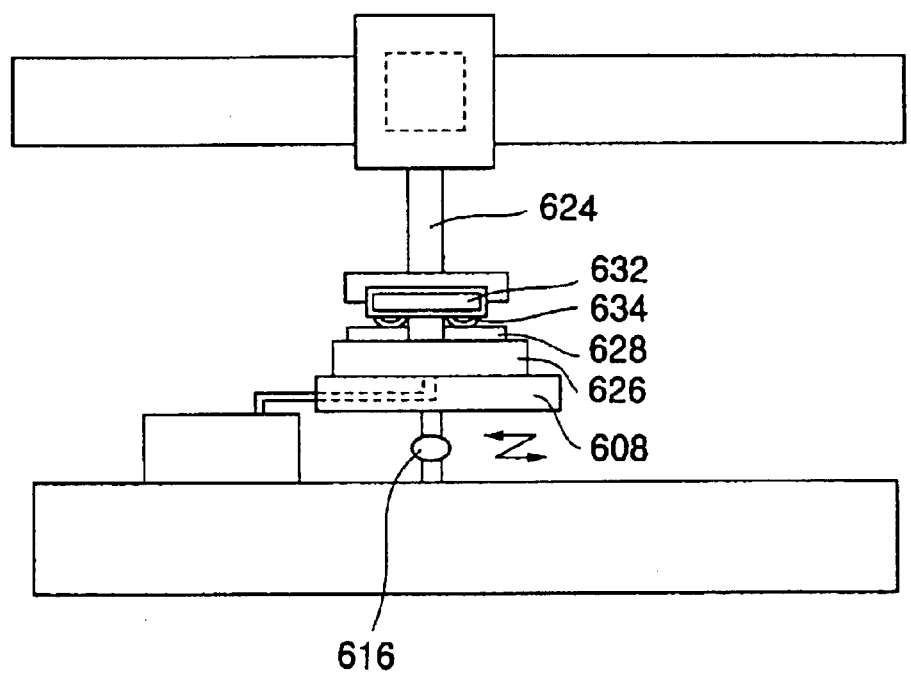
FIG. 55 is a front view for explaining the ultrasonic bonding in the third embodiment of the bonding apparatus.
Figure 56:
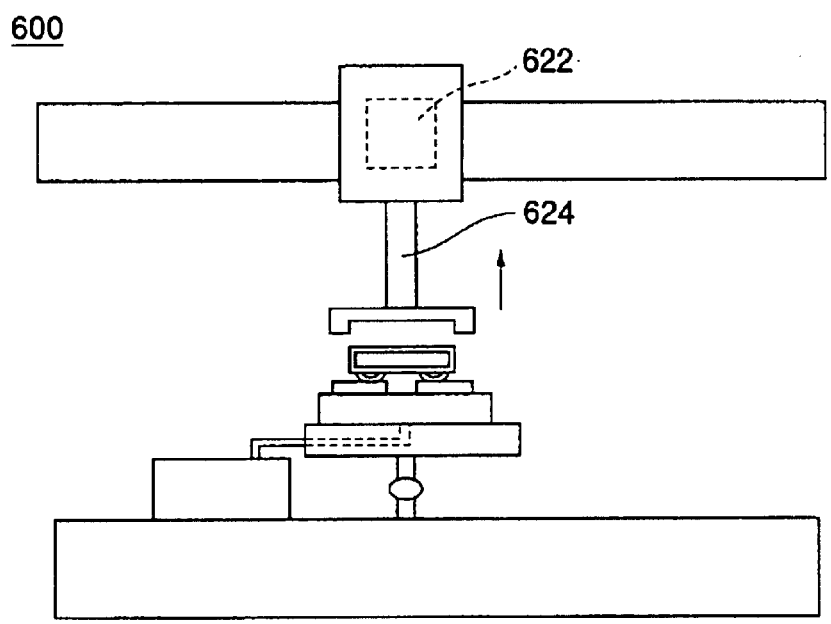
FIG. 56 is a front view for explaining the operation of the bonding tool after bonding in the third embodiment of the bonding apparatus.

FIG. 52 is a front view showing a third embodiment of the bonding apparatus. FIG. 53 is a front view for explaining the operation of a bonding head in the third embodiment of the bonding apparatus. FIG. 54 is a front view for explaining the pressing of the semiconductor chip in the third embodiment of the bonding apparatus. FIG. 55 is a front view for explaining the ultrasonic bonding in the third embodiment of the bonding apparatus. Further, FIG. 56 is a front view for explaining the operation of the bonding tool after bonding in the third embodiment of the bonding apparatus.

As shown in FIG. 52, a bonding apparatus 600 includes a base 612, a placing unit 602, a bonding head 604, and a control unit 606.

The placing unit 602 includes a stage 608 on which a substrate 626 is placed, a vacuum valve 610, a support member 614 which supports the stage 608 on the base 612 of the bonding apparatus 600, and an ultrasonic radiator 616 which is fixed on the support member 614. An inlet of the vacuum valve 610 is connected to a vacuum source or pump (not shown), and an outlet of the vacuum valve 610 is connected to one end of a pipe 618. The other end of this pipe 619 is embedded in the stage 608, and opens to a central upper surface of the stage 108 at an opening 618a.

The bonding head 604 movably engages a frame 620 of the bonding apparatus 600, and is moved by a moving mechanism (not shown). The bonding head 604 includes a loading and pressing mechanism 622 which is coupled to a power supply (not shown). In addition, an approximately box shaped bonding tool 624 hangs from the bonding head 604. An accommodating part 624a is provided at the lower end of the bonding tool 624, and a recess 624b is formed in the accommodating part 624a. The recess 624b has a flat bottom and a size slightly larger than a semiconductor chip 632 so that the semiconductor chip 632 can be accommodated within the recess 624b. The semiconductor chip 632 is restricted from moving in the horizontal direction in a state accommodated within the recess 624b of the accommodating part 624a.

The control unit 606 has a construction similar to that of the first embodiment of the bonding apparatus, and includes controllers provided in correspondence with each of the elements of the bonding apparatus 600.

Next, a description will be given of the bonding operation of this embodiment.

First, the substrate 626 is placed on the stage 608 with the side having pads 628 facing up. In this state, a vacuum source or pump (not shown) is activated and the vacuum valve 610 is opened. Hence the bottom surface of the substrate 626 is adhered on the stage 608 by suction via the opening 618a, so as to prevent moving of the substrate 626. The adhered state of the substrate 626 is maintained until the bonding ends.

On the other hand, the semiconductor chip 632 has bumps 634, and a layer 630 which covers the entire semiconductor chip 632. This semiconductor chip 632 is accommodated and restricted within the recess 624b of the bonding tool 624 with the side having the bumps 588 facing down, as shown in FIG. 53. In this state, the bonding head 604 is moved horizontally by a moving mechanism (not shown) to a position above the stage 608, so that the semiconductor chip 632 is transported to a loading position immediately above the substrate 626.

Next, when the loading and pressing mechanism 622 is activated, the bonding tool 624 is lowered, and the bumps 634 on the semiconductor chip 632 make contact with the corresponding pads 628 on the substrate 626. In addition, the loading and pressing mechanism 622 applies pressure on the semiconductor chip 632 in a state where the semiconductor chip 632 is positioned, as shown in FIG. 54.

When the pressure applied on the semiconductor chip 632 reaches a predetermined value, the oscillation of the ultrasonic radiator 616 is started. As a result, the bumps 634 and the corresponding pads 628 are melted and bonded together as shown in FIG. 55 by the ultrasonic vibration in the horizontal direction caused by the oscillation of the ultrasonic radiator 616. In this state, the substrate 626 is securely positioned on the stage 608 by the suction via the opening 618a. On the other hand, the semiconductor chip 632 is securely positioned and held by the bonding tool 624. Accordingly, the semiconductor chip 632 and the substrate 626 will not move relative to each other during the bonding.

When the bonding is completed, the loading and pressing mechanism 622 is deactivated, and the bonding tool 624 is raised as shown in FIG. 56. Hence, the bonding apparatus 600 returns to the predetermined initial state shown in FIG. 52, and waits for the next bonding operation.

According to the bonding apparatus 600, the semiconductor chip 632 is accommodated and securely held within the recess 624b of the bonding tool 624, and the semiconductor chip 632 is not directly subjected to the ultrasonic vibration. For this reason, when the substrate 626 is subjected to the ultrasonic vibration, the layer 630 of the semiconductor chip 632 will not be scratched or damaged thereby. Therefore, the layer 630 is positively prevented from separating from the semiconductor chip 632.

In each of the embodiments of the bonding apparatus, the various moving mechanisms and elevator mechanisms are not shown because well known mechanisms may be used therefor. Similarly, the vacuum source or pump is not shown, because well known vacuum sources or pumps may be used therefor.

Further, the present invention is not limited to these embodiments, but various variations and modifications may be made without departing from the scope of the present invention.

What is claimed is:

1. A head assembly comprising:
    a mounting surface;
    an integrated circuit chip which is mounted on the mounting surface and which processes signals; and
    a head slider which is provided with a head and which is mounted on the mounting surface,
    said integrated circuit chip being covered by a layer 2 $\mu$m or thinner,
    a height of the integrated circuit chip, including the layer, being lower than a height of the head slider from the mounting surface,
    wherein said layer covers at least peripheral side portions of the integrated circuit chip.

2. The head assembly as claimed in claim 1, wherein said layer covering the integrated circuit chip is formed by evaporation.

3. The head assembly as claimed in claim 1, wherein said layer covers at least an entire upper surface of the integrated circuit chip.

4. The head assembly as claimed in claim 1, wherein said layer covers upper and side surfaces of the integrated circuit chip.

5. The head assembly as claimed in claim 1, further comprising:
    an under-filling filling a gap between a lower surface of the integrated circuit chip and the mounting surface,
    said layer covering upper and side surfaces of the integrated circuit chip and peripheral side surfaces of the under-filling.

6. The head assembly according to claim 1, wherein the mounting surface is substantially flat.

7. A head assembly comprising:
    a mounting surface;
    an integrated circuit chin which is mounted on the mounting surface and which processes signals; and
    a head slider which is provided with a head and which is mounted on the mounting surface,
    said integrated circuit chip being covered by a layer 2 $\mu$m or thinner,
    a height of the integrated circuit chip, including the layer, being lower than a height of the head slider from the mounting surface,
    wherein said layer is made of poly(p-xylylene).

8. A disk unit for reading information from and writing information to a disk, comprising:
    a head assembly having a mounting surface, a head slider provided with a head and mounted on the mounting surface, and an integrated circuit chip which is mounted on the mounting surface and processes information read from and/or written to the disk via the head,
    said integrated circuit chip being covered by a layer 2$\mu$m or thinner,
    a height of the integrated circuit chip, including the layer, being lower than a height of the head slider from the mounting surface,
    wherein said layer covers at least peripheral side portions of the integrated circuit chip.

9. The head assembly according to claim 8, wherein the mounting surface is substantially flat.

10. A unit for reading information from and writing information to a recording medium, comprising:
    a head assembly having a mounting surface, a head slider provided with a head and mounted on the mounting surface, and an integrated circuit chip which is mounted on the mounting surface and processes information read from and/or written to the recording medium via the head,
    said integrated circuit chip being covered by a layer 2$\mu$m or thinner,
    a height of the integrated circuit chip, including the layer, being lower than a height of the head slider from the mounting surface,
    wherein said layer covers at least peripheral side portions of the integrated circuit chip.

11. A head assembly comprising:
    a mounting surface;
    an integrated circuit chip which is mounted so as to be raised above the mounting surface and processes signals; and
    a head slider provided with a head,
    said integrated circuit chip being covered at least on corner portions and bumps mounting the integrated circuit chip raised above the mounting surface by a layer of poly(p-xylylene) 2 $\mu$m or thinner,
    wherein a height of the integrated circuit chip, including the layer, being lower than a height of the head slider from the mounting surface and the layer of poly(p-xylylene) prevents foreign particles from separating from the integrated circuit chip and interfering with the head assembly.

12. A disk unit for reading information from and writing information to a disk, comprising:
    a head assembly having a mounting surface, a head slider provided with a head, and an integrated circuit chip which is mounted so as to be raised above the mounting surface and processes information read from and/or written to the disk via the head,
    said integrated circuit chip being covered at least on corner portions and bumps mounting the integrated circuit chip raised above the mounting surface by a layer of poly(p-xylylene)2 $\mu$m or thinner,
    wherein a height of the integrated circuit chip, including the layer, being lower than a height of the head slider from the mounting surface and the layer of poly(p-xylylene) prevents foreign particles from separating from the integrated circuit chip and interfering with the head assembly thereby preventing a crash of the disk unit.

* * * * *